(12) United States Patent
Chiang et al.

(10) Patent No.: US 11,538,927 B2
(45) Date of Patent: Dec. 27, 2022

(54) NANOSTRUCTURES AND METHOD FOR MANUFACTURING THE SAME

(71) Applicant: Taiwan Semiconductor Manufacturing Company, Ltd., Hsin-Chu (TW)

(72) Inventors: Kuo-Cheng Chiang, Hsinchu County (TW); Yen-Ming Chen, Hsin-Chu County (TW); Jung-Chien Cheng, Tainan (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/336,673

(22) Filed: Jun. 2, 2021

(65) Prior Publication Data
US 2022/0238699 A1 Jul. 28, 2022

Related U.S. Application Data

(60) Provisional application No. 63/142,532, filed on Jan. 28, 2021.

(51) Int. Cl.
*H01L 29/66* (2006.01)
*H01L 27/088* (2006.01)
(Continued)

(52) U.S. Cl.
CPC .... *H01L 29/66795* (2013.01); *H01L 21/0259* (2013.01); *H01L 21/02532* (2013.01);
(Continued)

(58) Field of Classification Search
CPC .......... H01L 21/02532; H01L 21/0259; H01L 21/823412; H01L 21/823418;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

KR 20170009678 A 1/2017

*Primary Examiner* — Cheung Lee
(74) *Attorney, Agent, or Firm* — Haynes and Boone, LLP

(57) ABSTRACT

Semiconductor structures and the manufacturing method thereof are disclosed. An exemplary manufacturing method includes forming a stack of a first type and a second type epitaxial layers on a frontside of a semiconductor substrate, patterning the stack to form a fin-shaped structure, depositing a dielectric layer on sidewalls of the fin-shaped structure, and recessing the dielectric layer to expose a top portion of the fin-shaped structure. A top surface of the recessed dielectric layer is above a bottom surface of the stack. The exemplary manufacturing method also includes forming a gate structure over the top portion of the fin-shaped structure, etching the semiconductor substrate from a backside of the semiconductor substrate, and etching at least a bottommost first type epitaxial layer and a bottommost second type epitaxial layer through the trench.

20 Claims, 58 Drawing Sheets

(51) Int. Cl.
  *H01L 29/06* (2006.01)
  *H01L 29/423* (2006.01)
  *H01L 29/786* (2006.01)
  *H01L 21/02* (2006.01)
  *H01L 21/8234* (2006.01)

(52) U.S. Cl.
  CPC ........... *H01L 21/823412* (2013.01); *H01L 21/823418* (2013.01); *H01L 21/823468* (2013.01); *H01L 21/823481* (2013.01); *H01L 27/088* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
  CPC ..... H01L 21/823431; H01L 21/823468; H01L 21/823481; H01L 21/823807; H01L 21/823821; H01L 21/823878; H01L 27/088; H01L 27/0886; H01L 27/0924; H01L 29/0665; H01L 29/42392; H01L 29/66545; H01L 29/66553; H01L 29/66742; H01L 29/66795; H01L 29/785; H01L 29/78618; H01L 29/78696; B82Y 10/00; B82Y 40/00
  See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,998,234 B2 * | 5/2021 | Xie .................. H01L 29/66439 |
| 2020/0058800 A1 | 2/2020 | Wang |

* cited by examiner

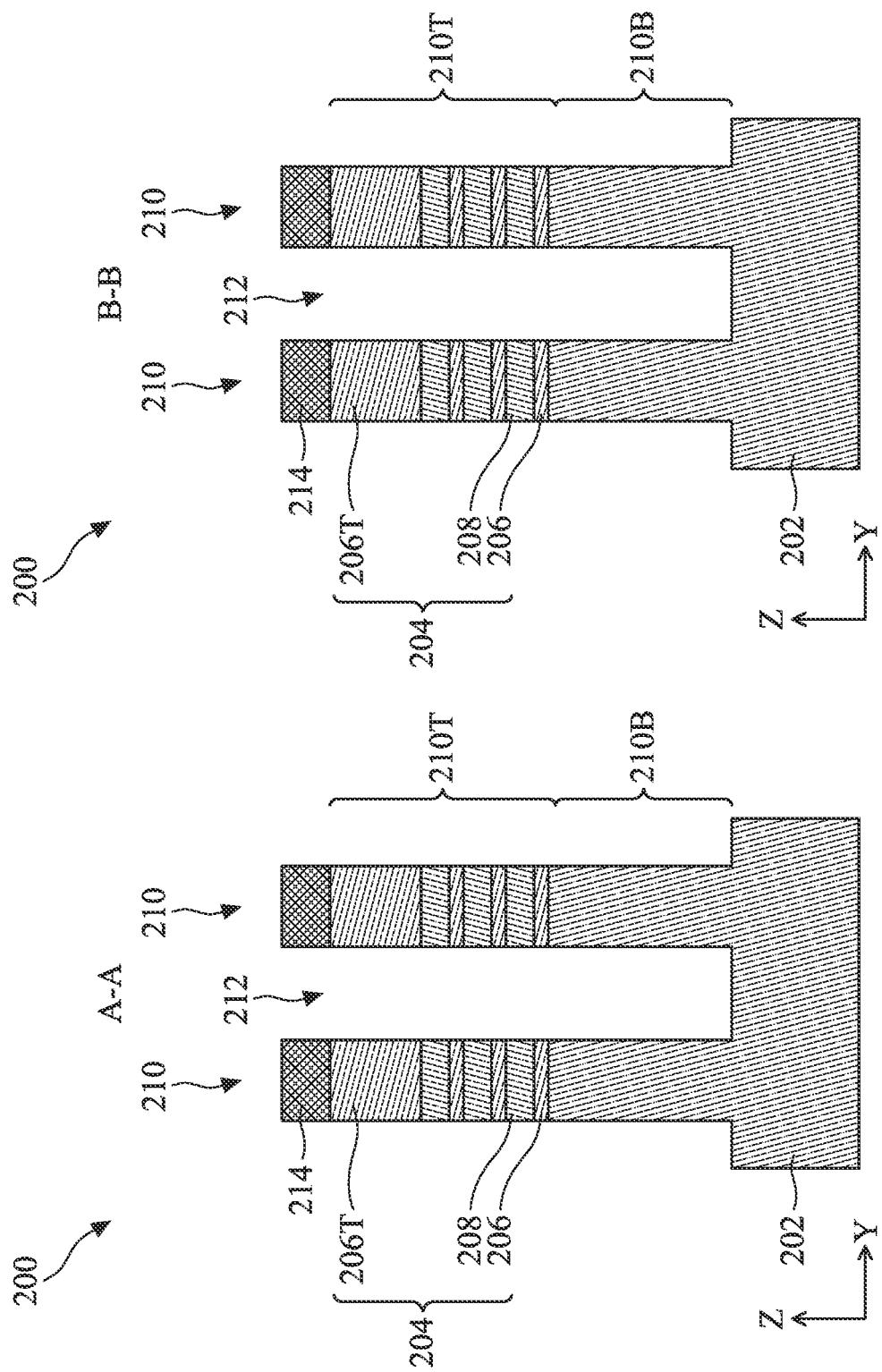

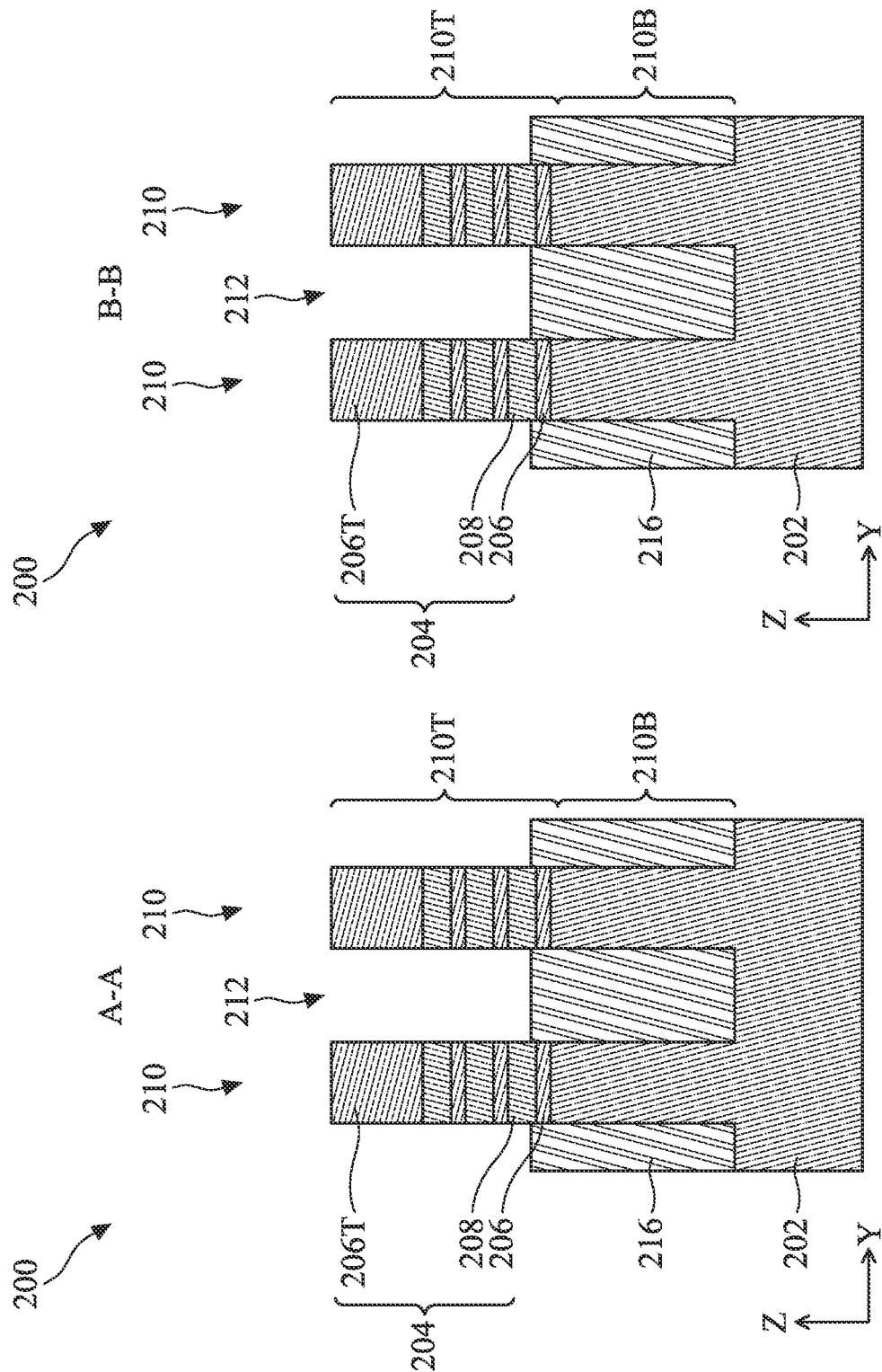

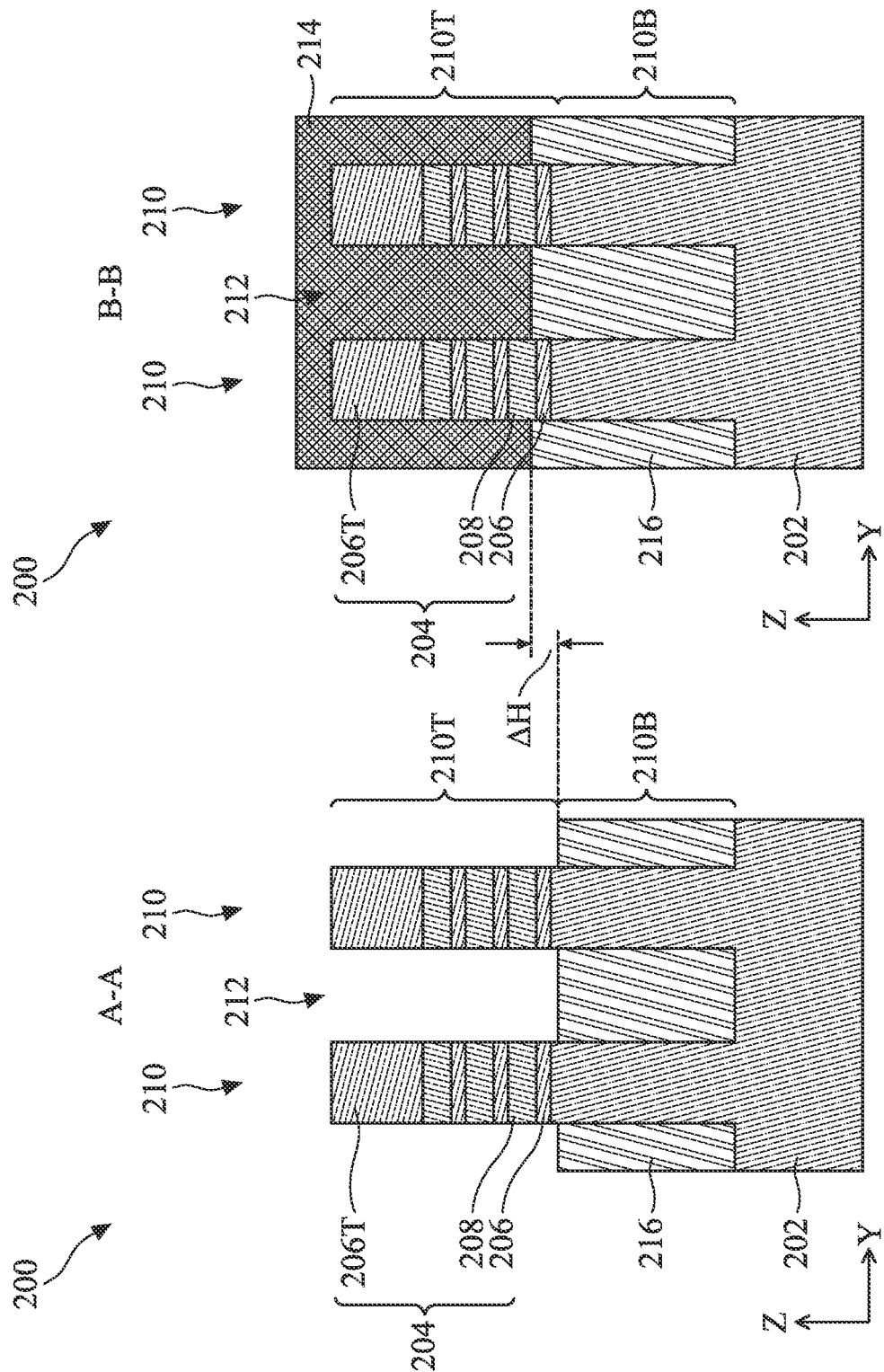

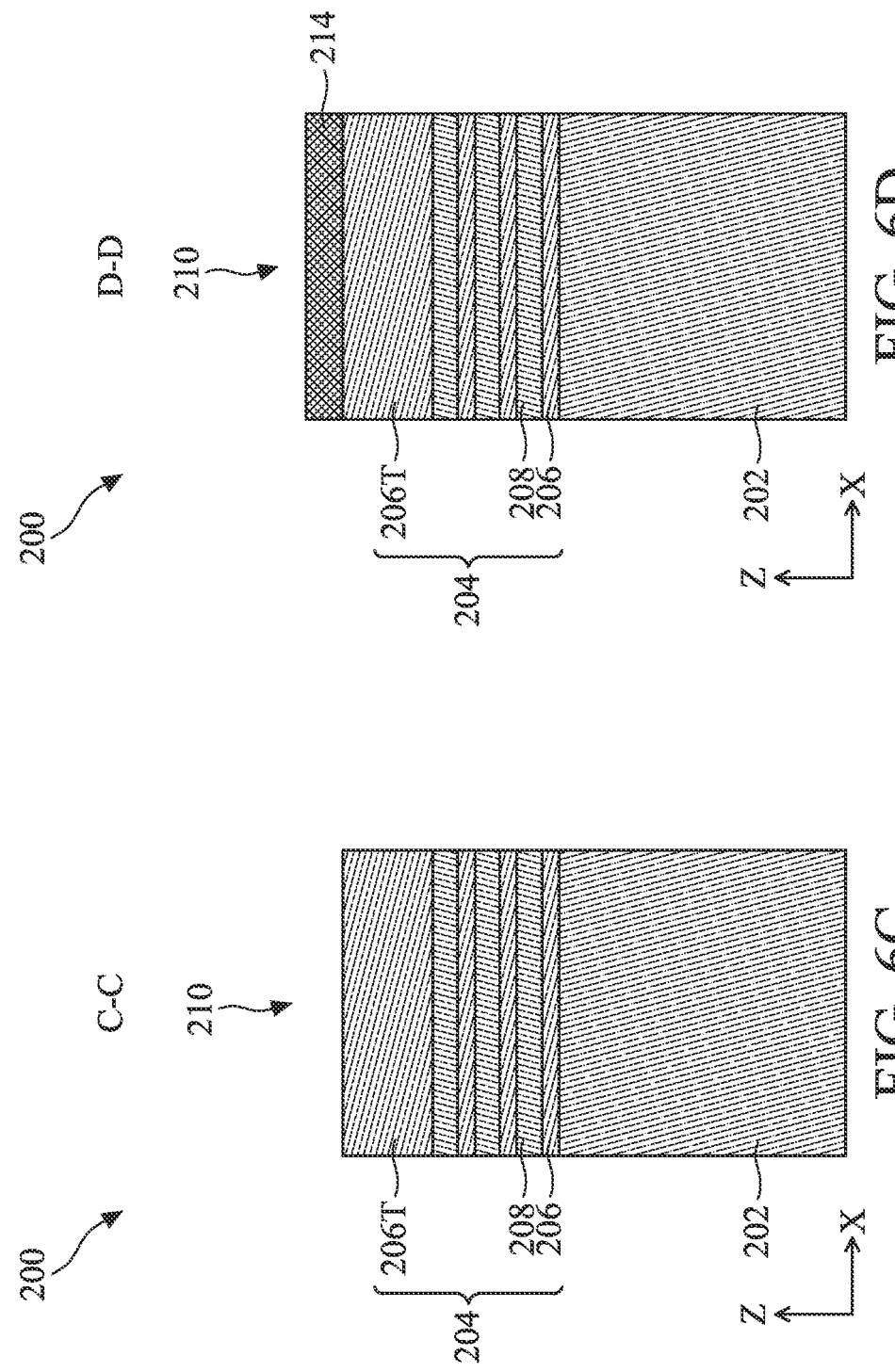

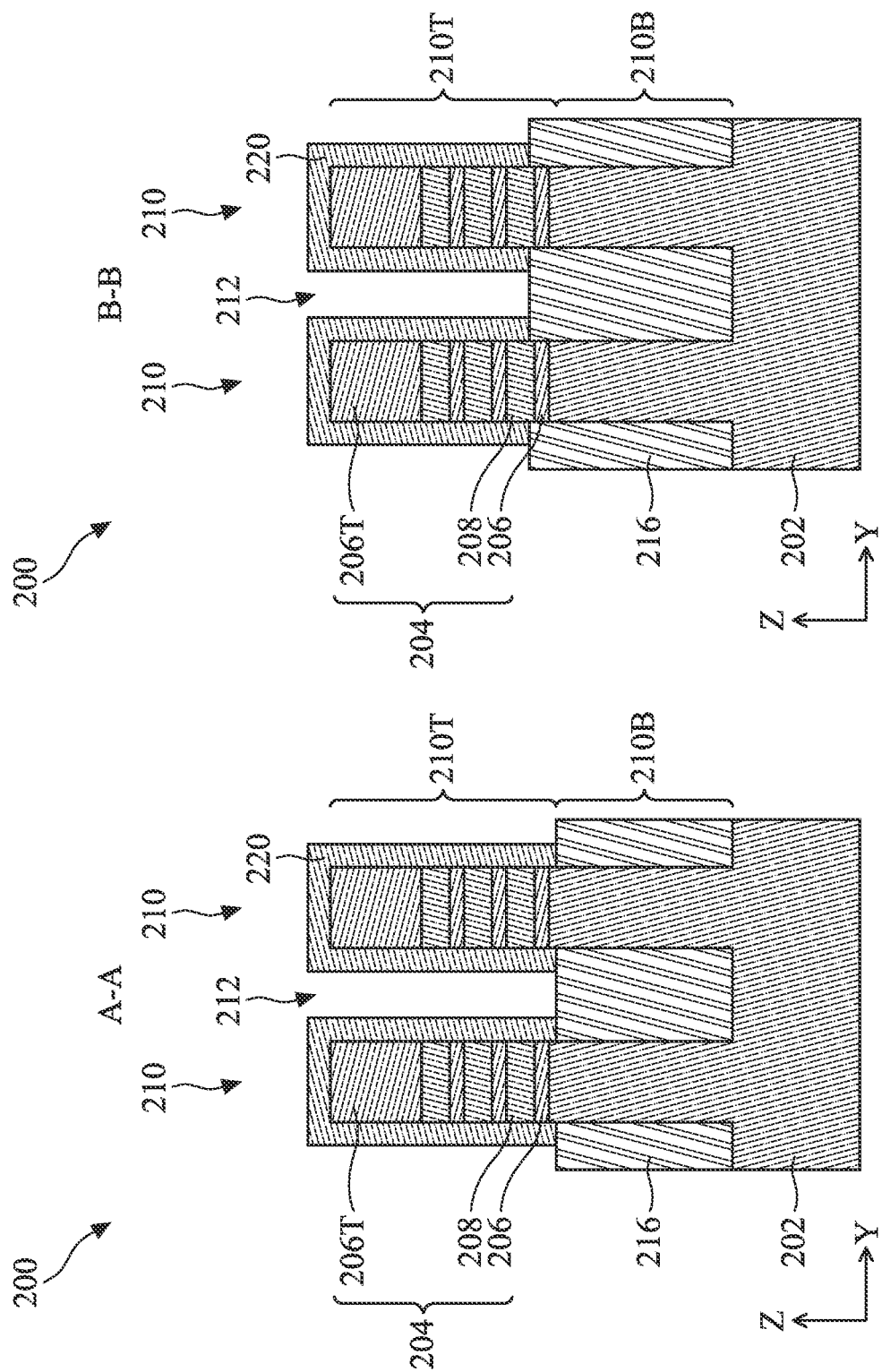

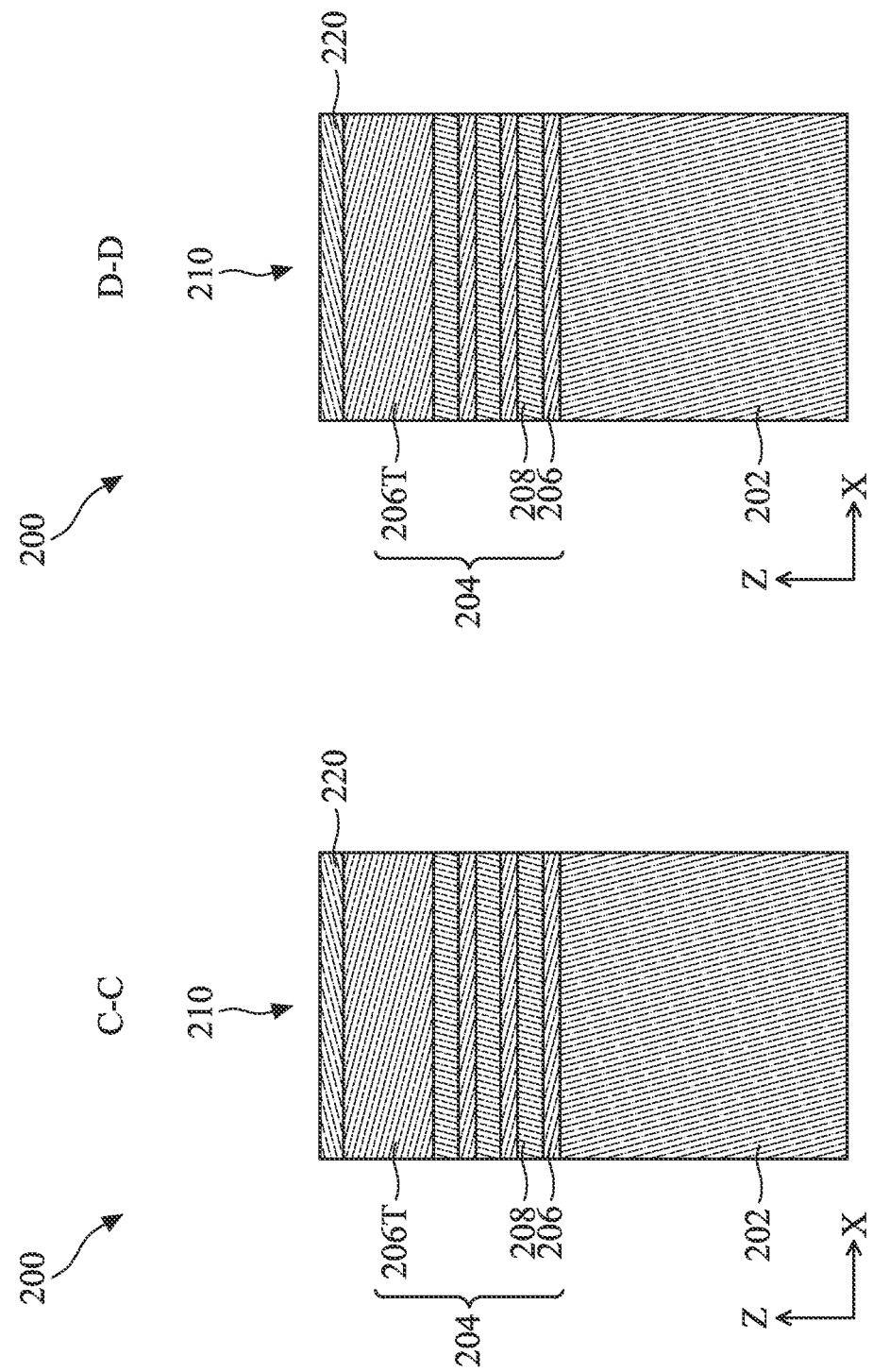

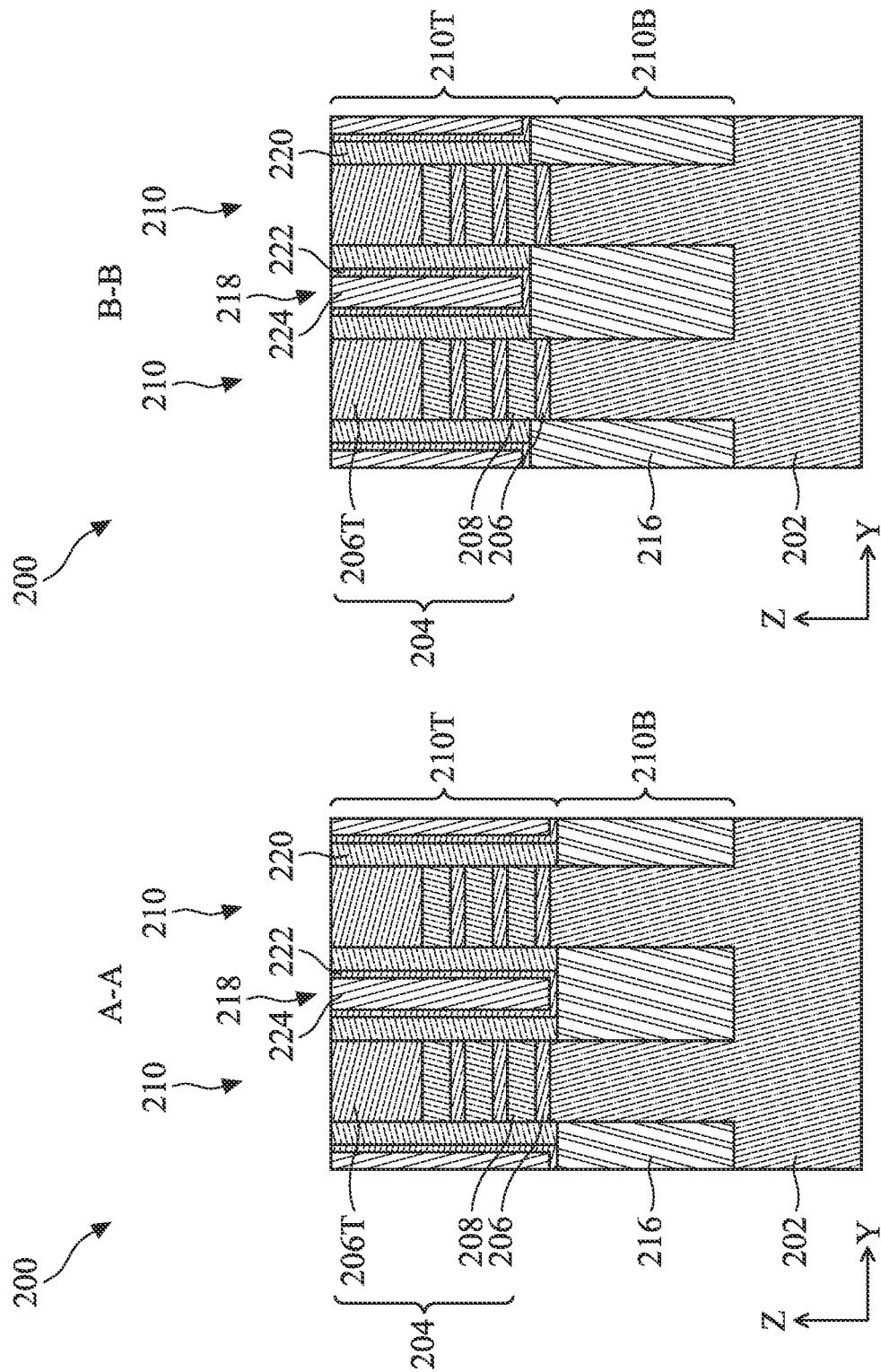

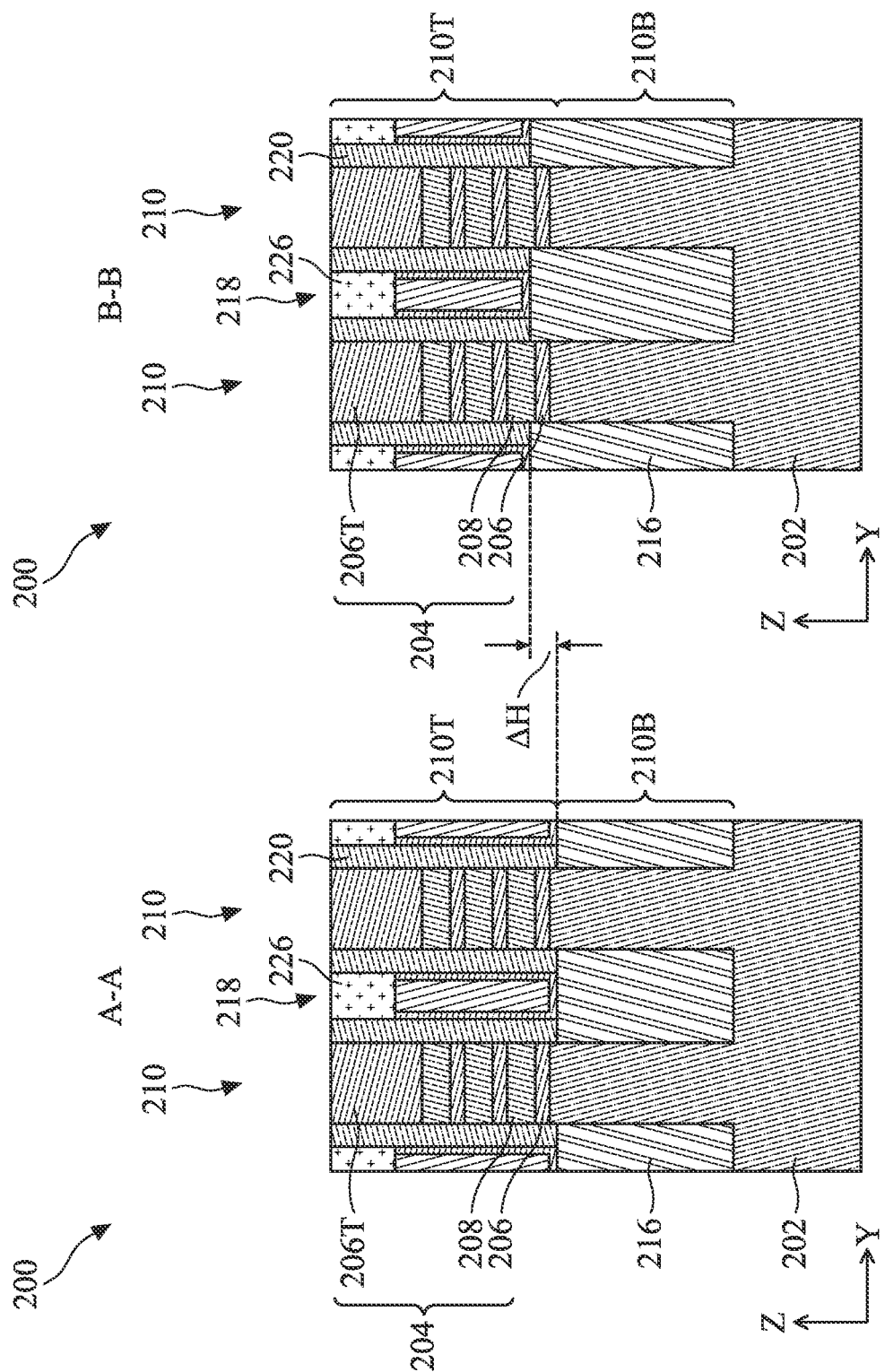

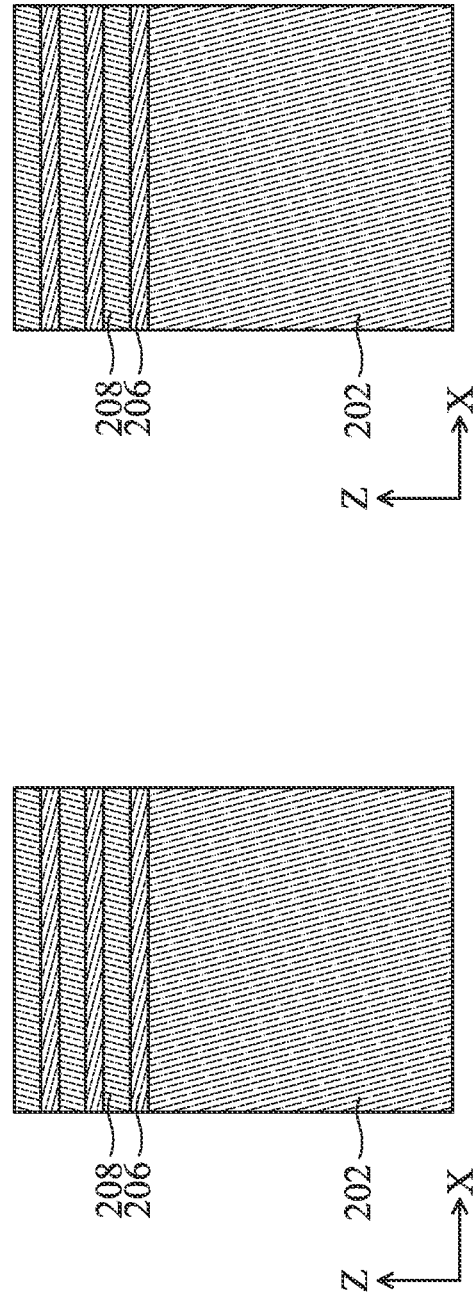

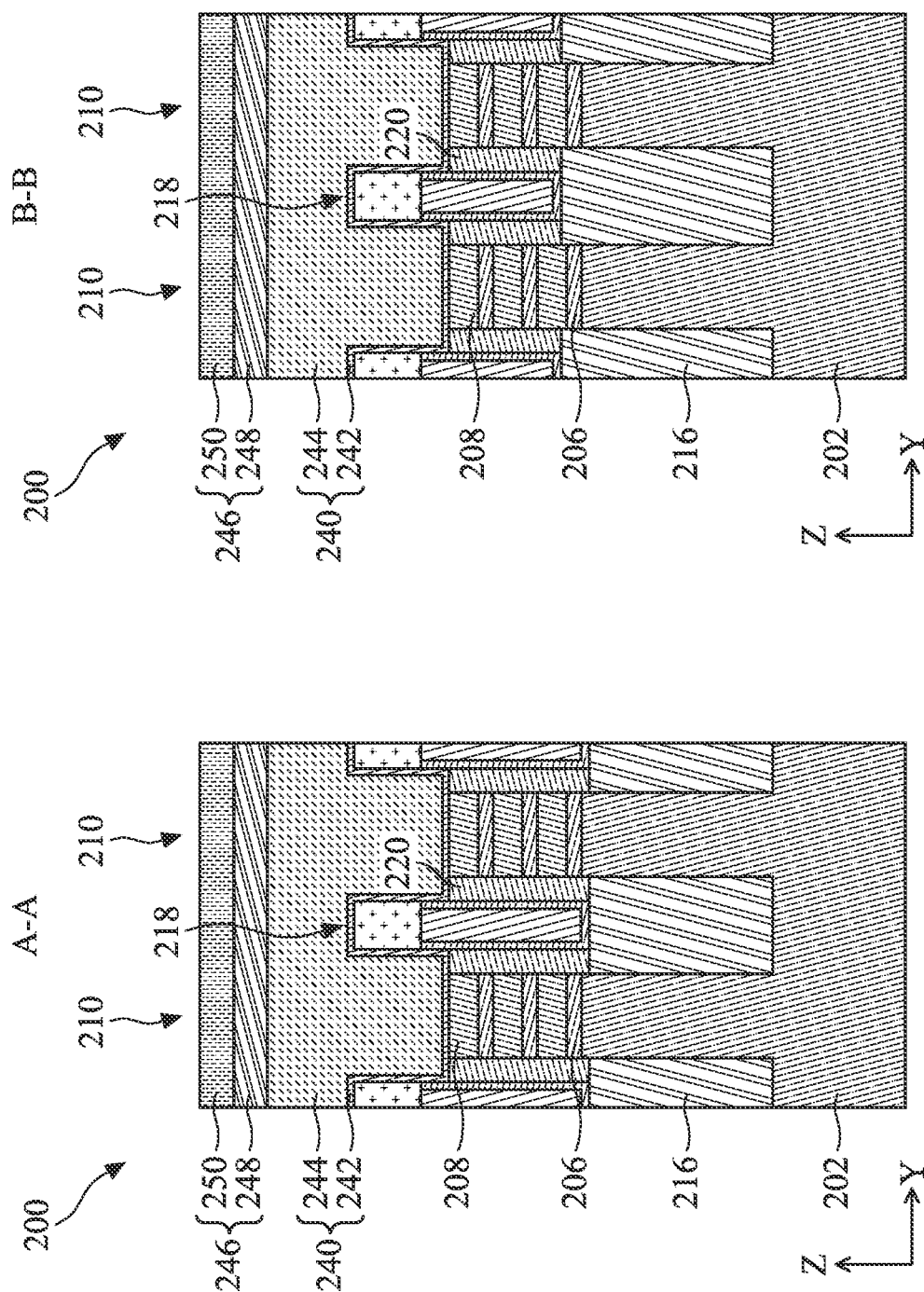

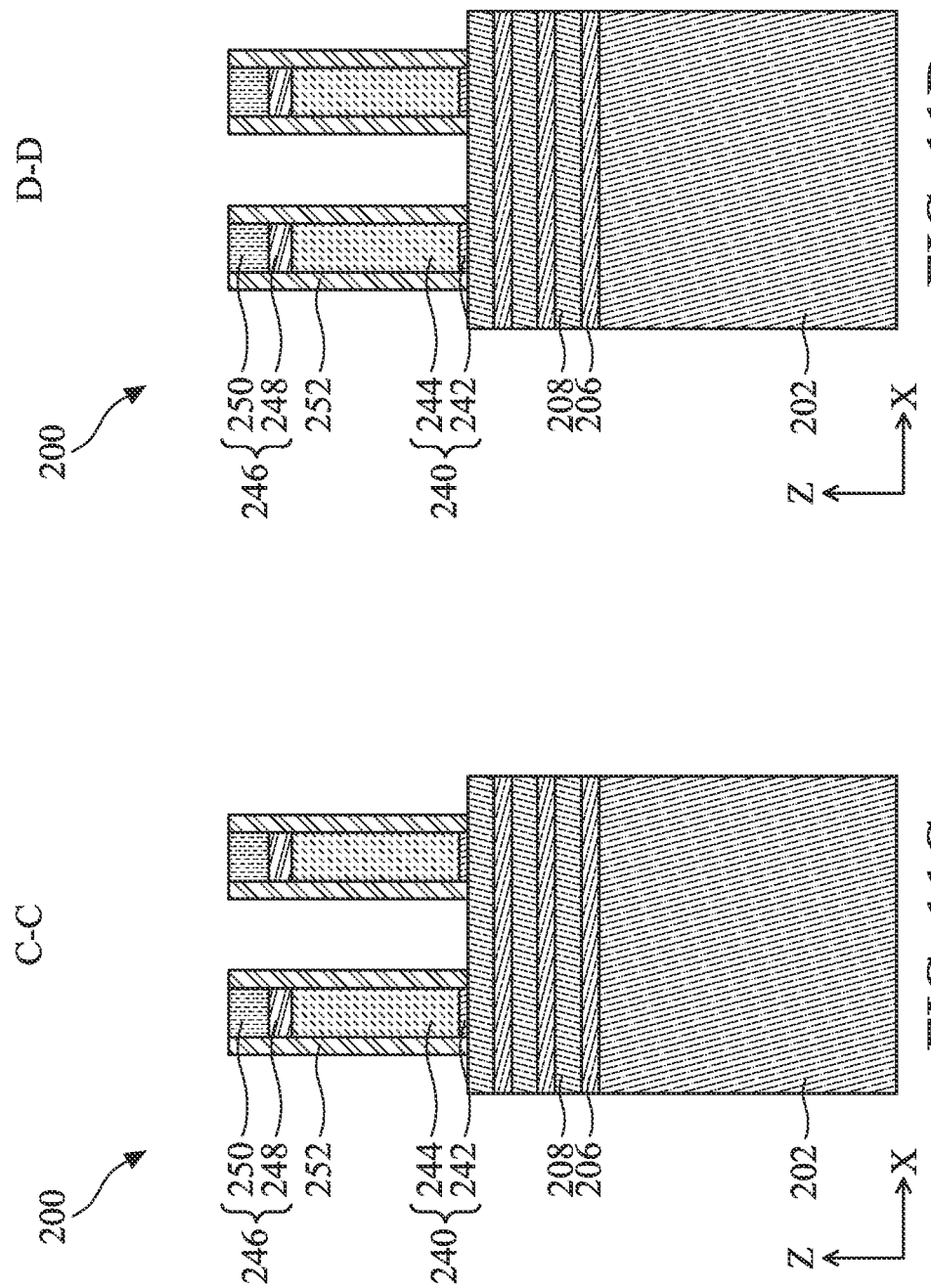

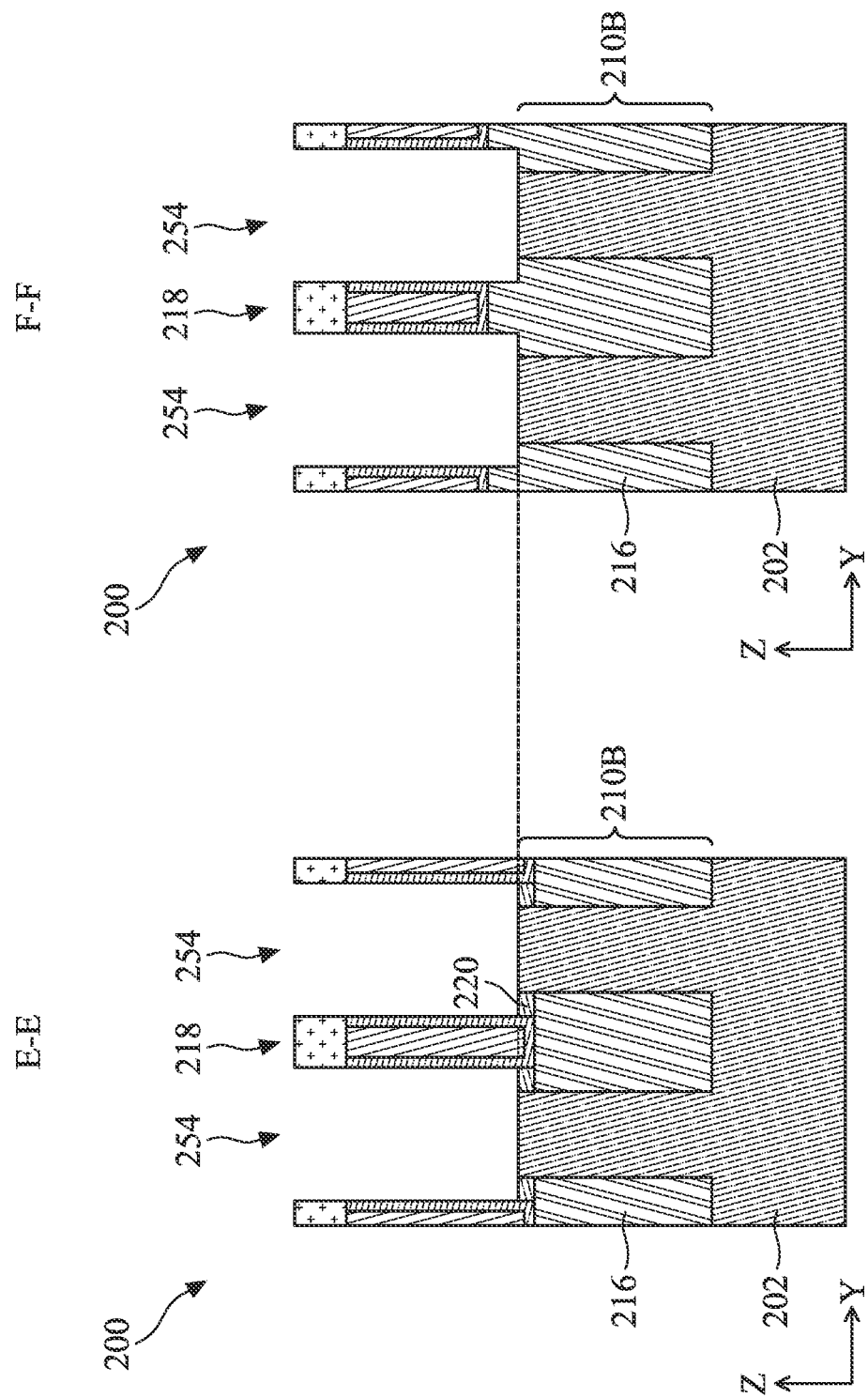

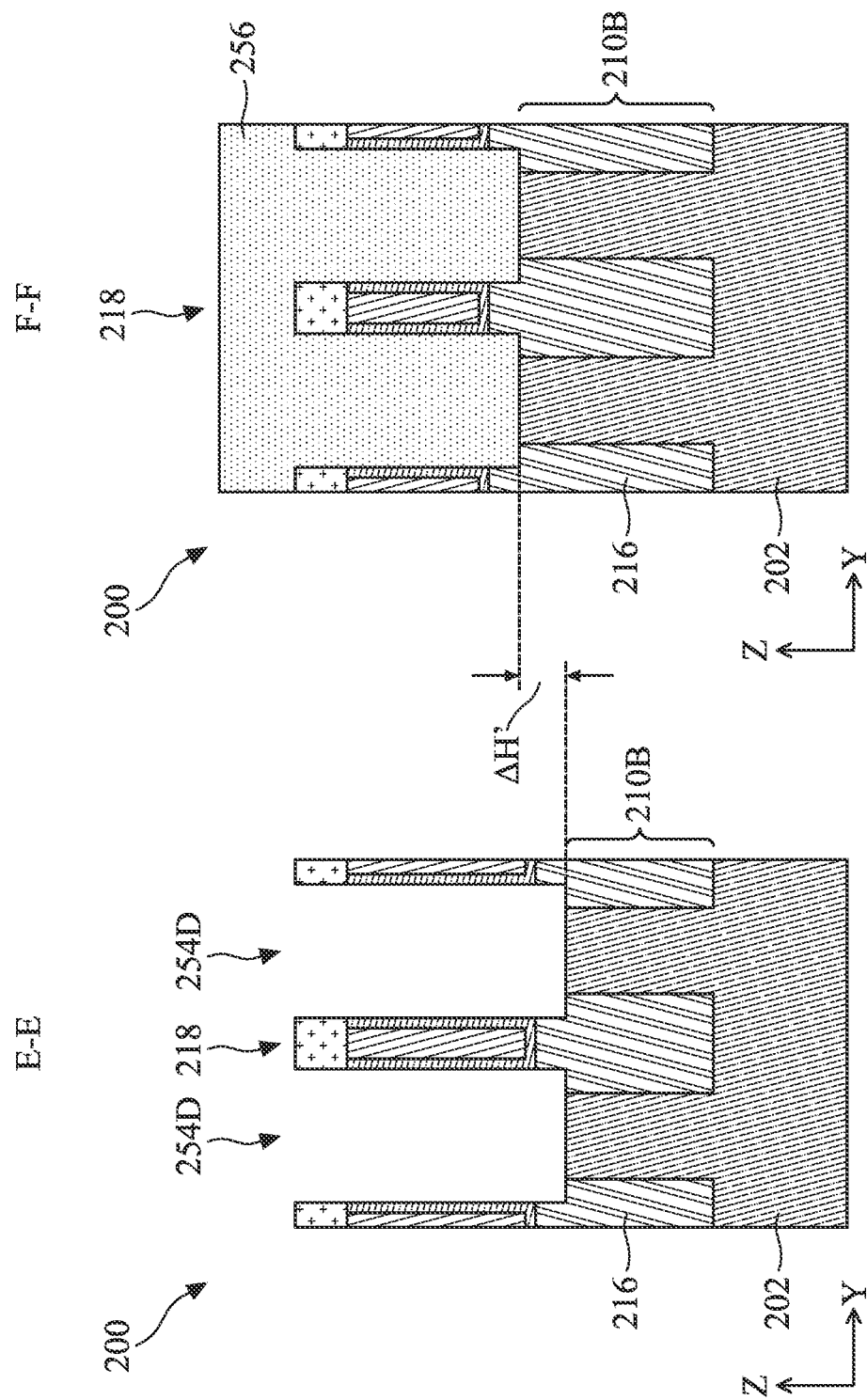

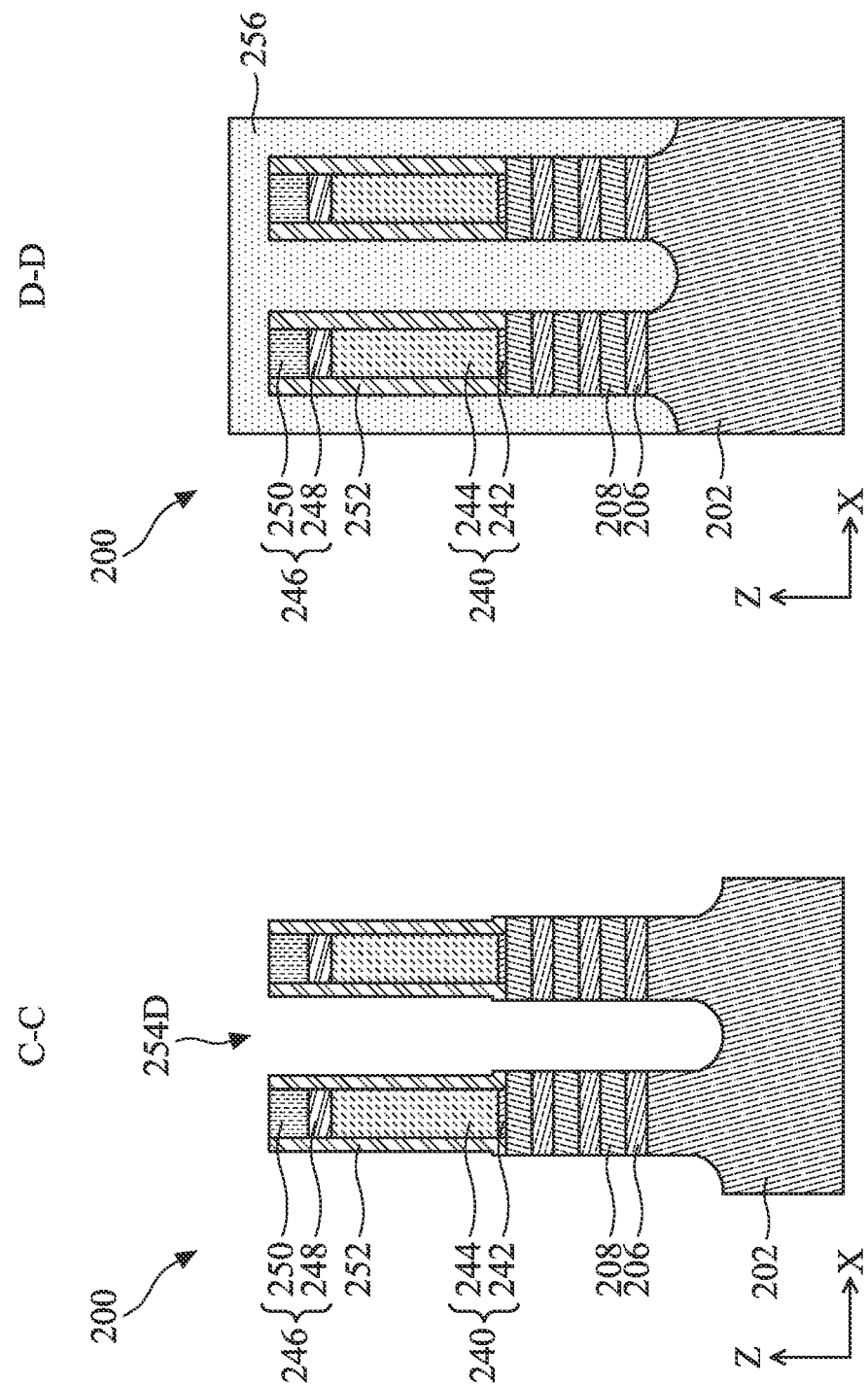

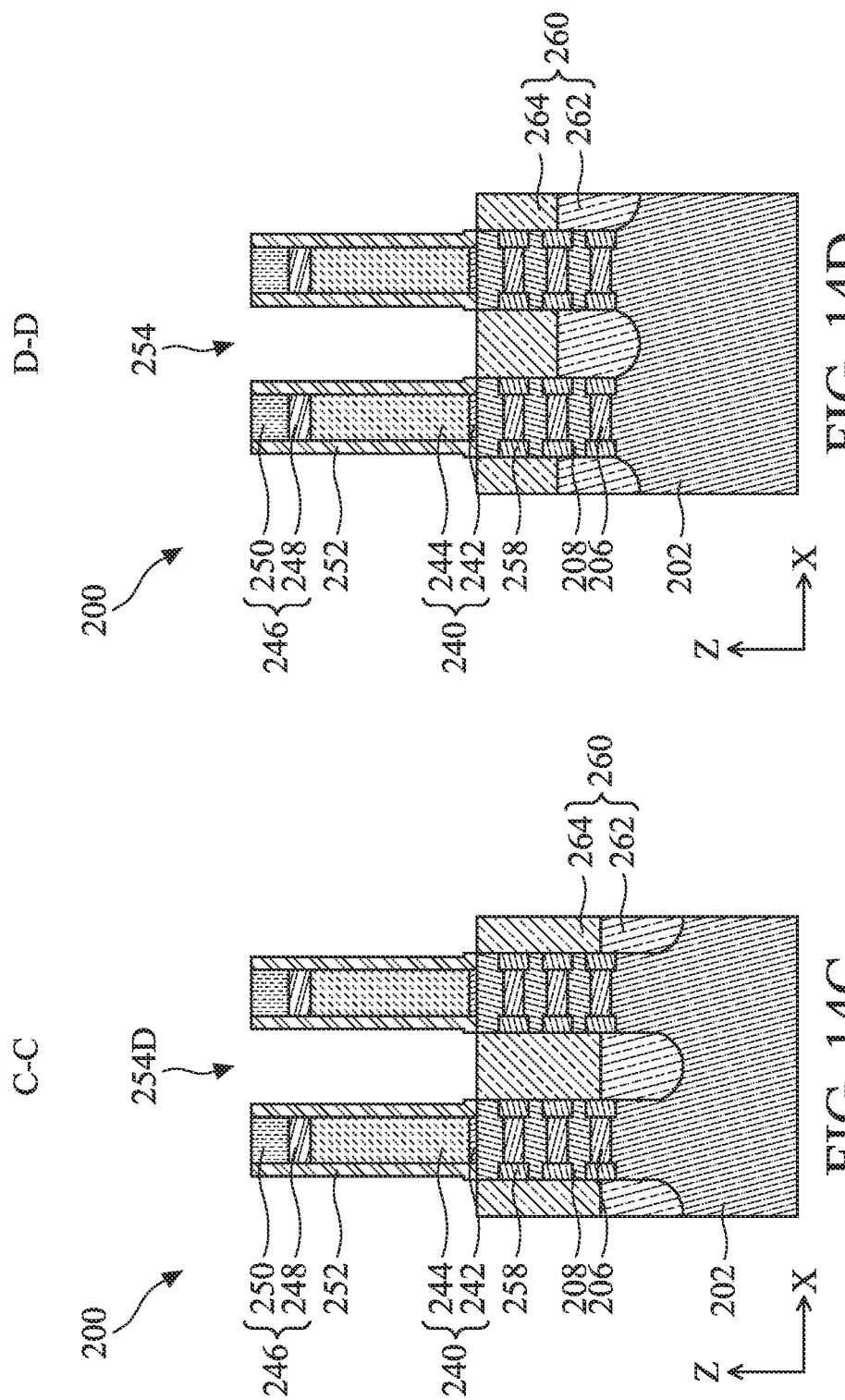

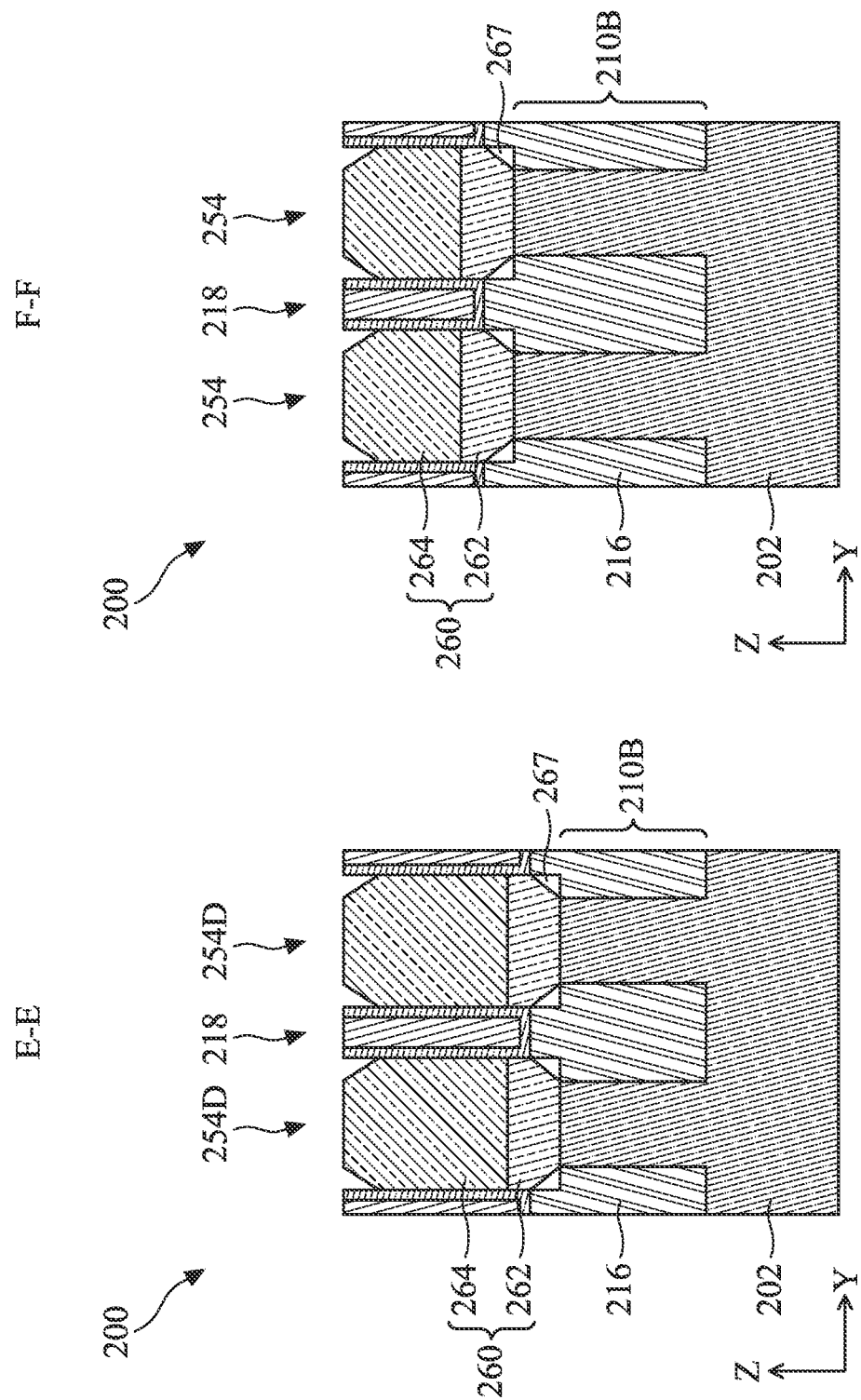

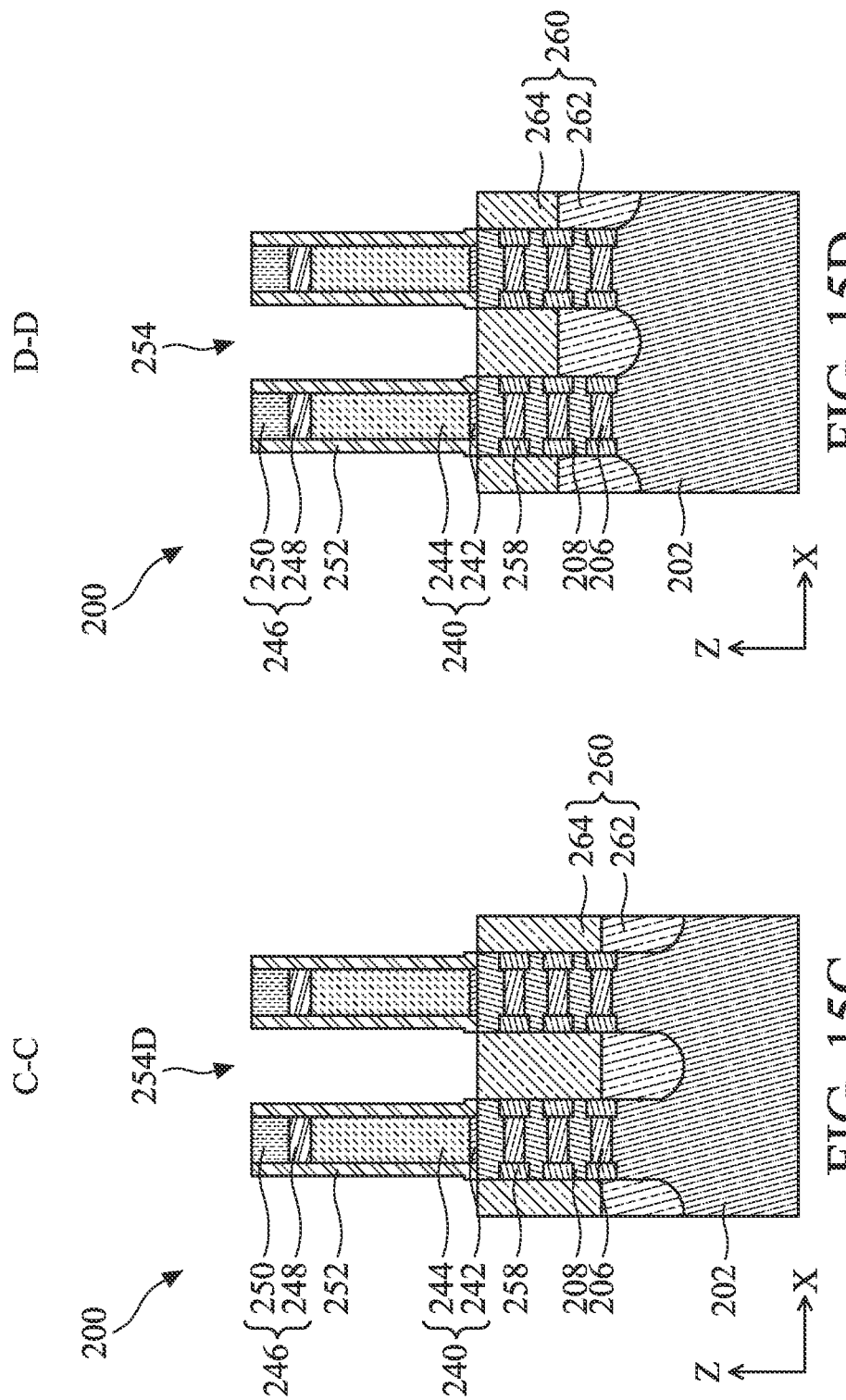

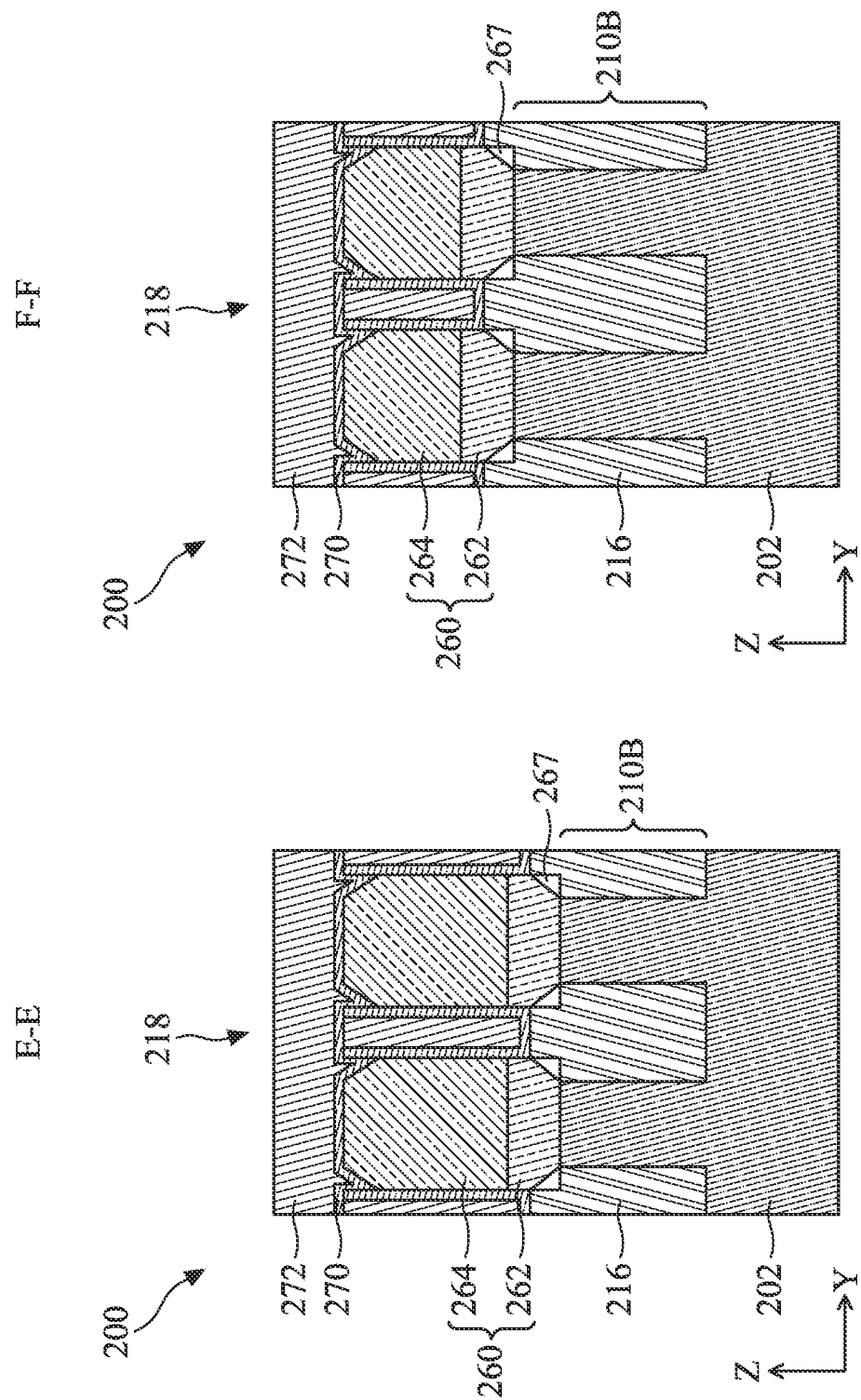

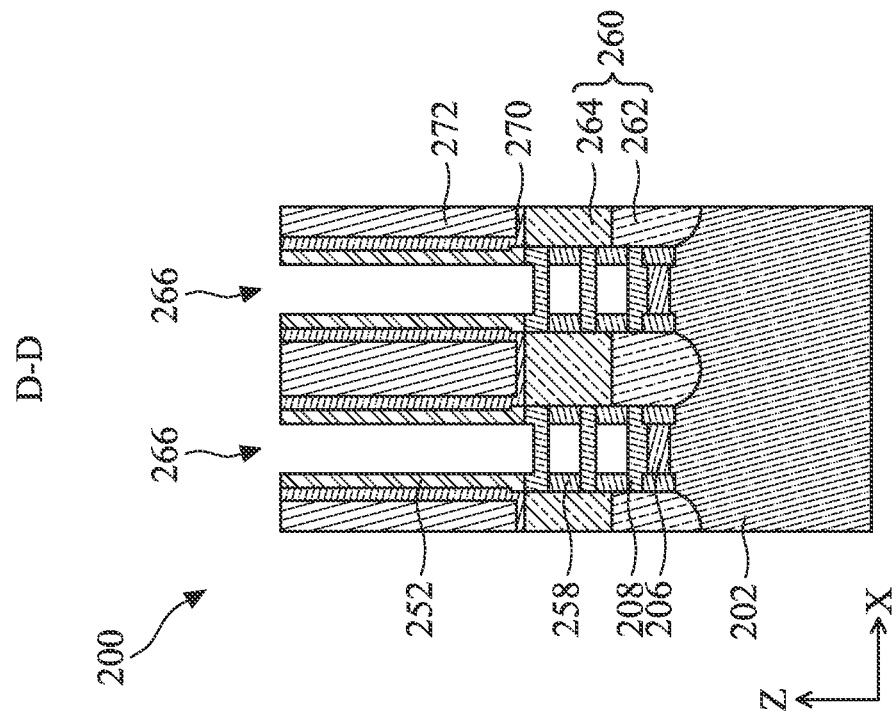
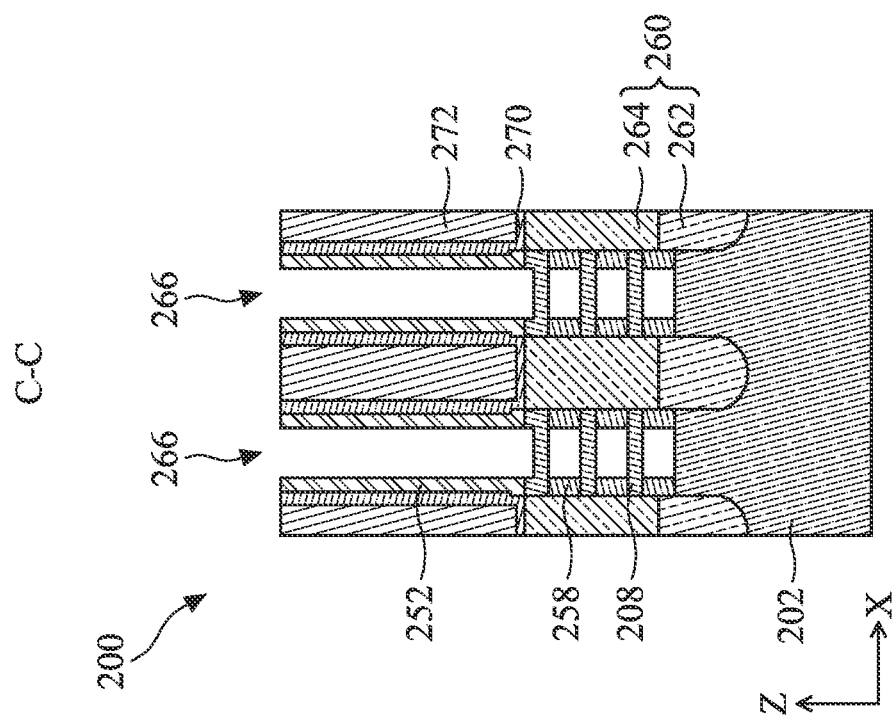

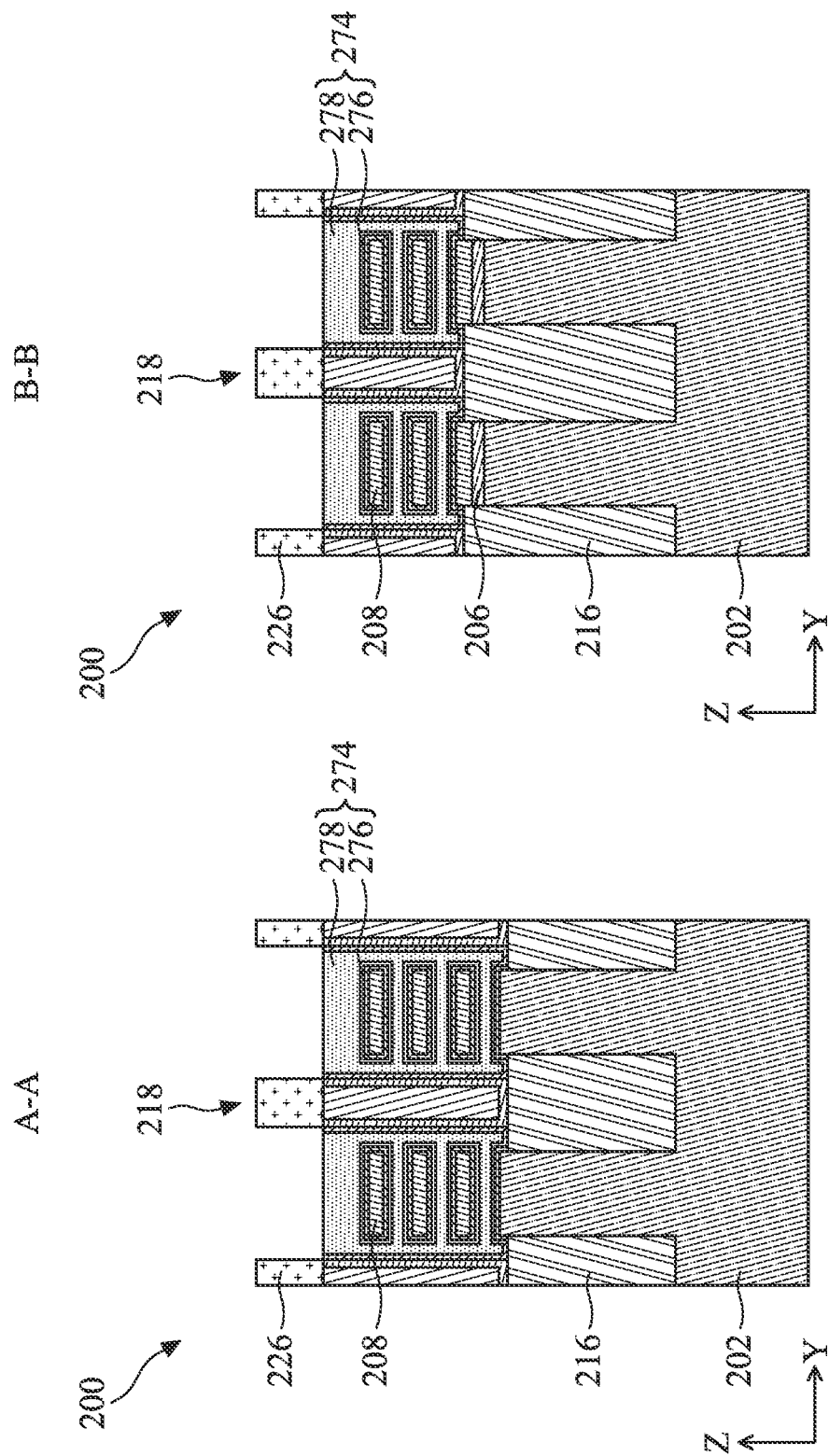

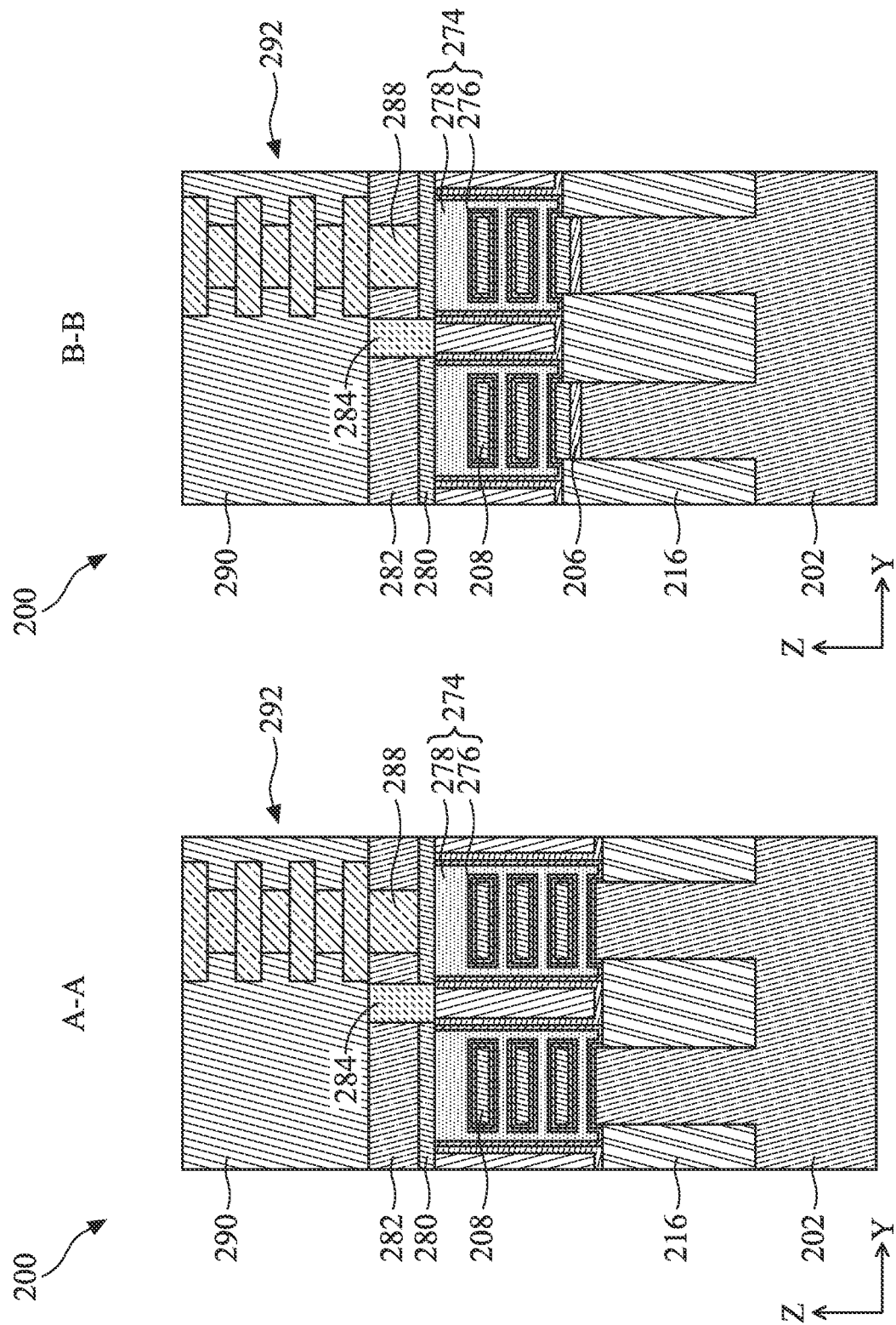

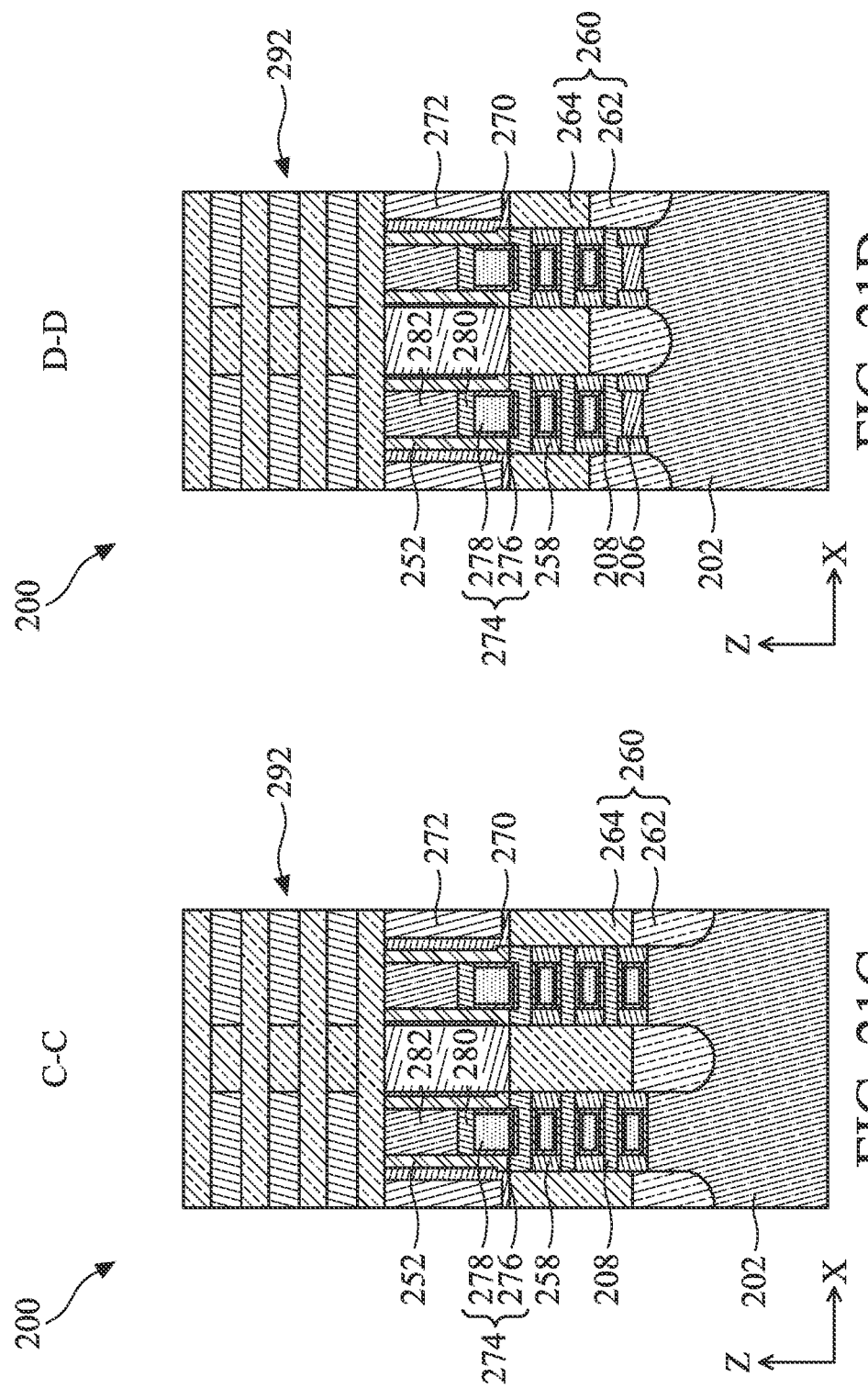

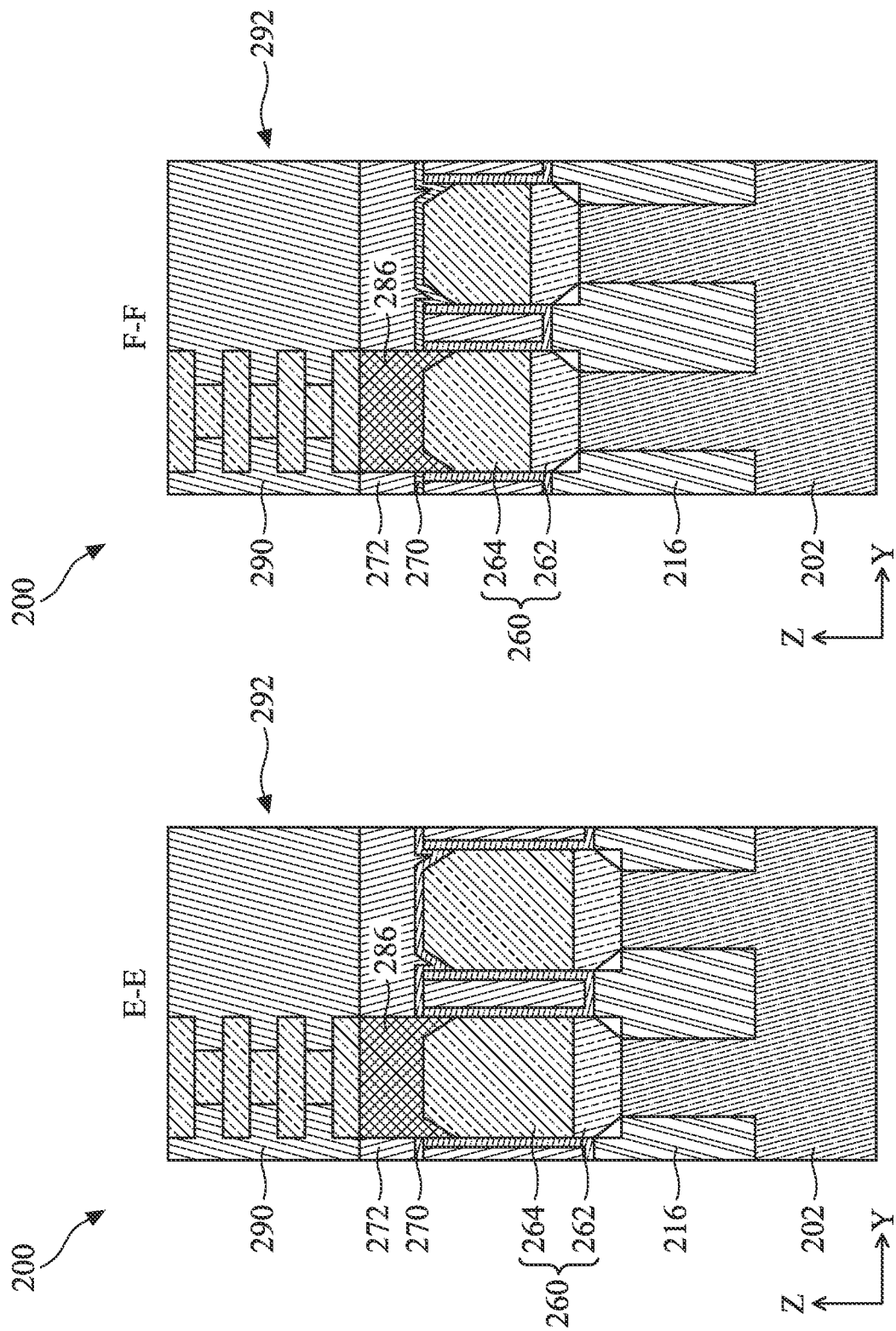

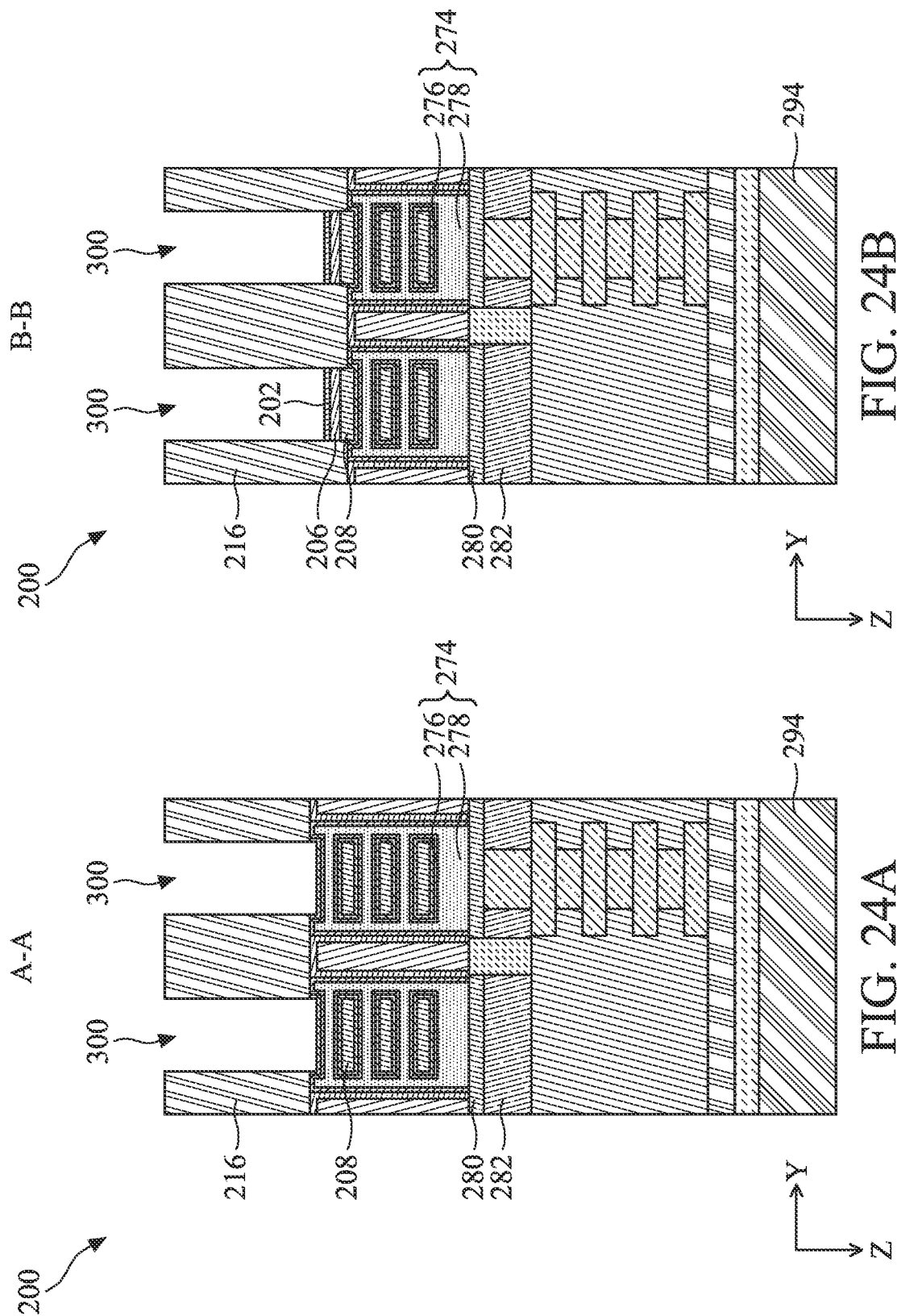

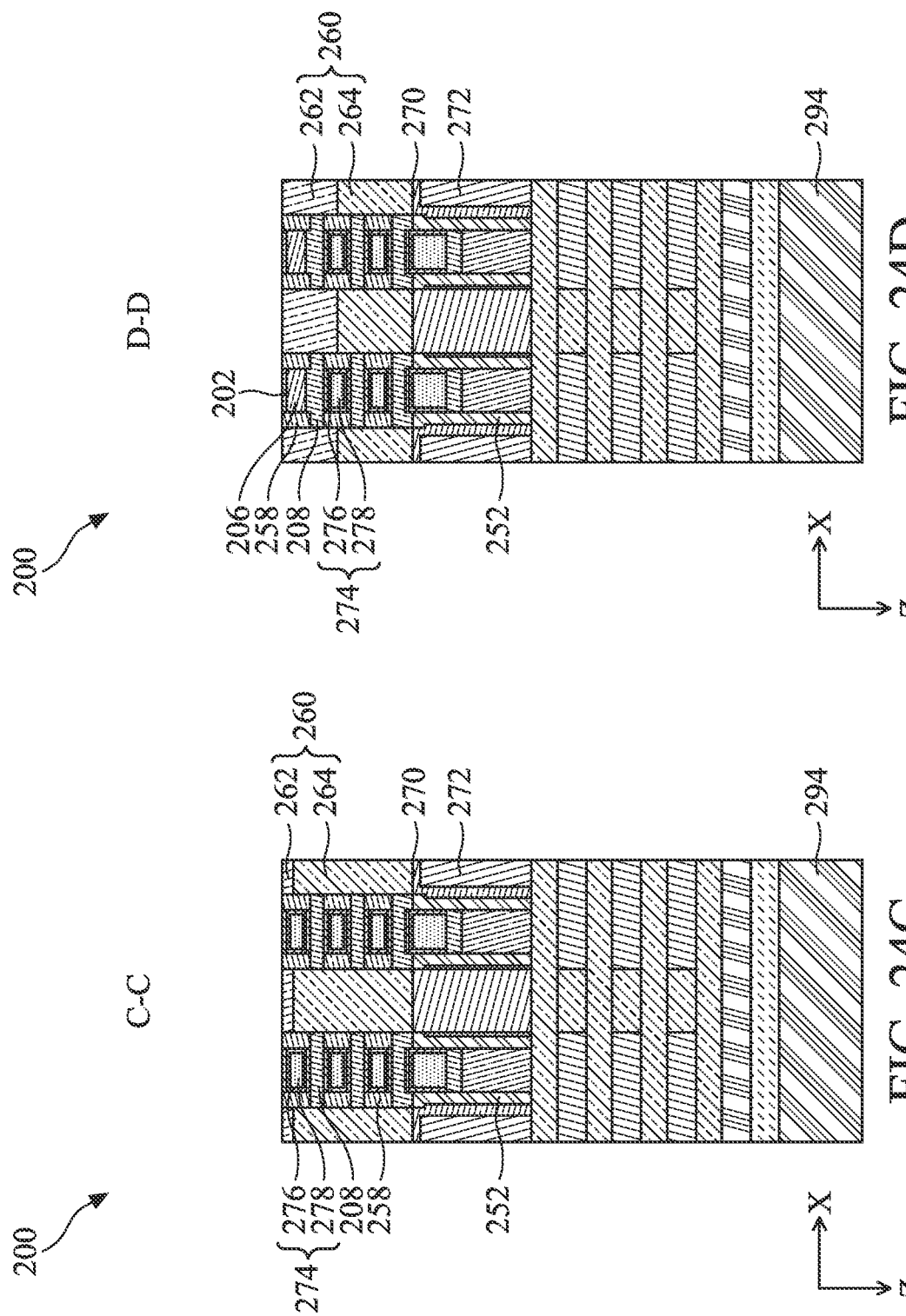

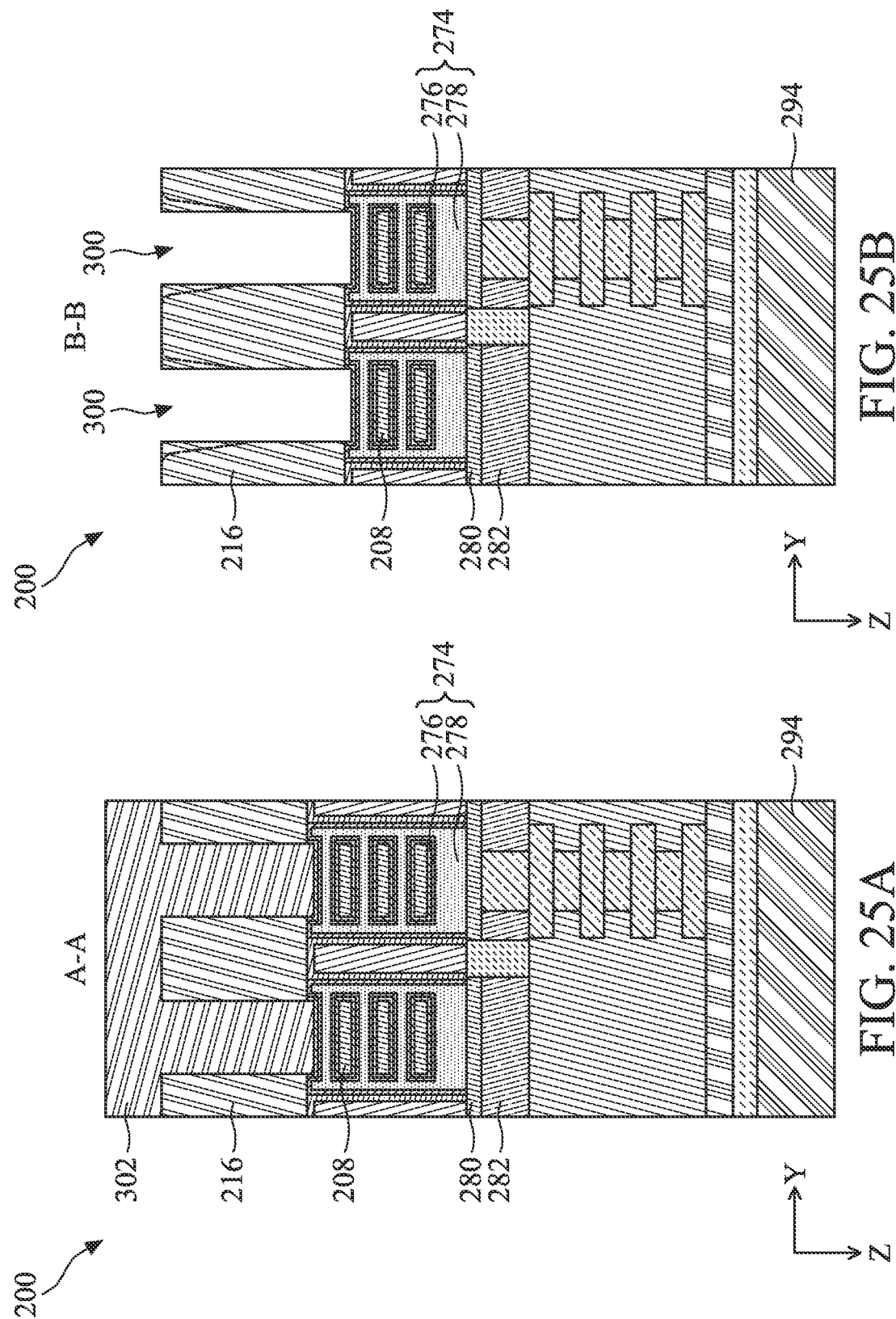

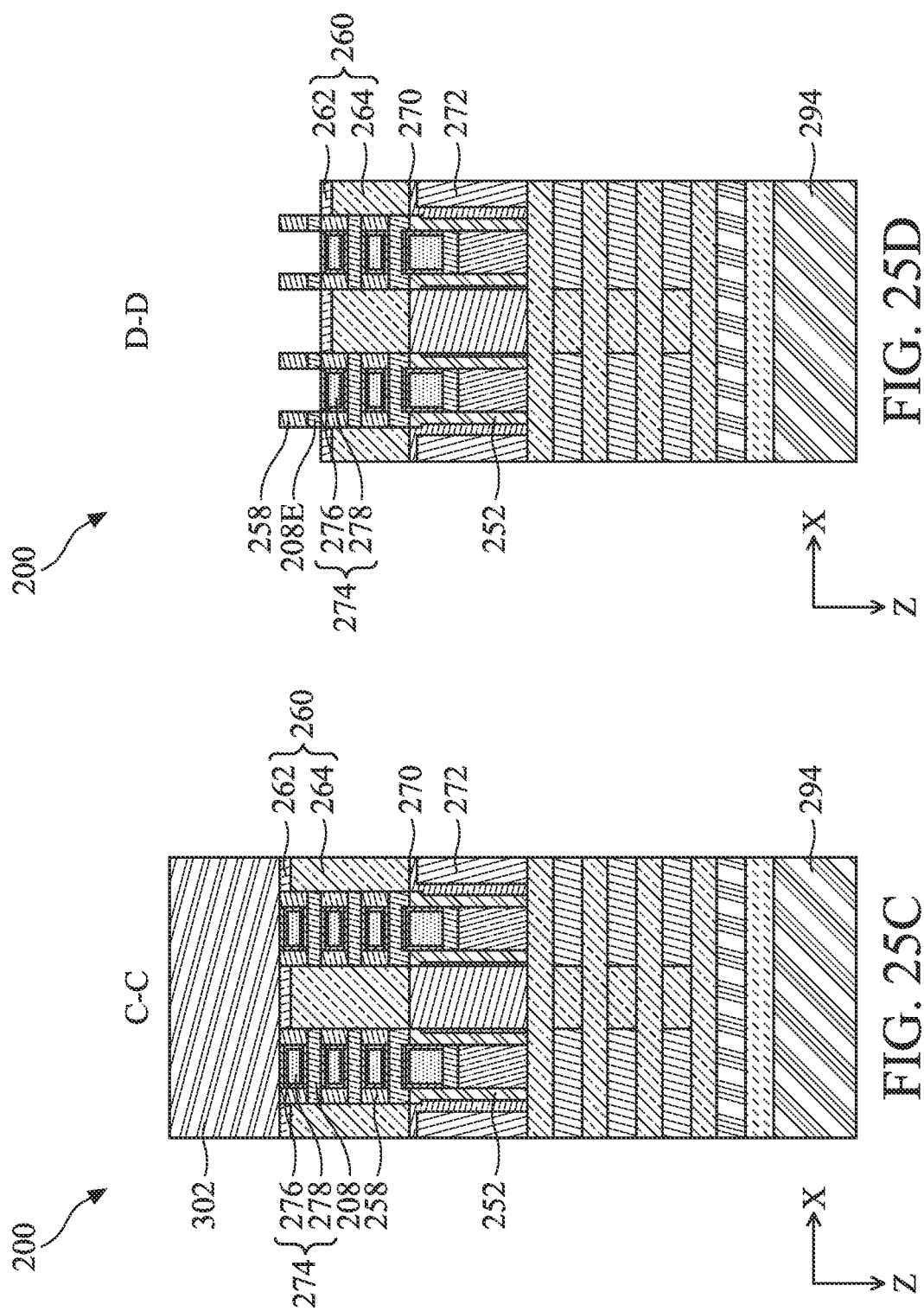

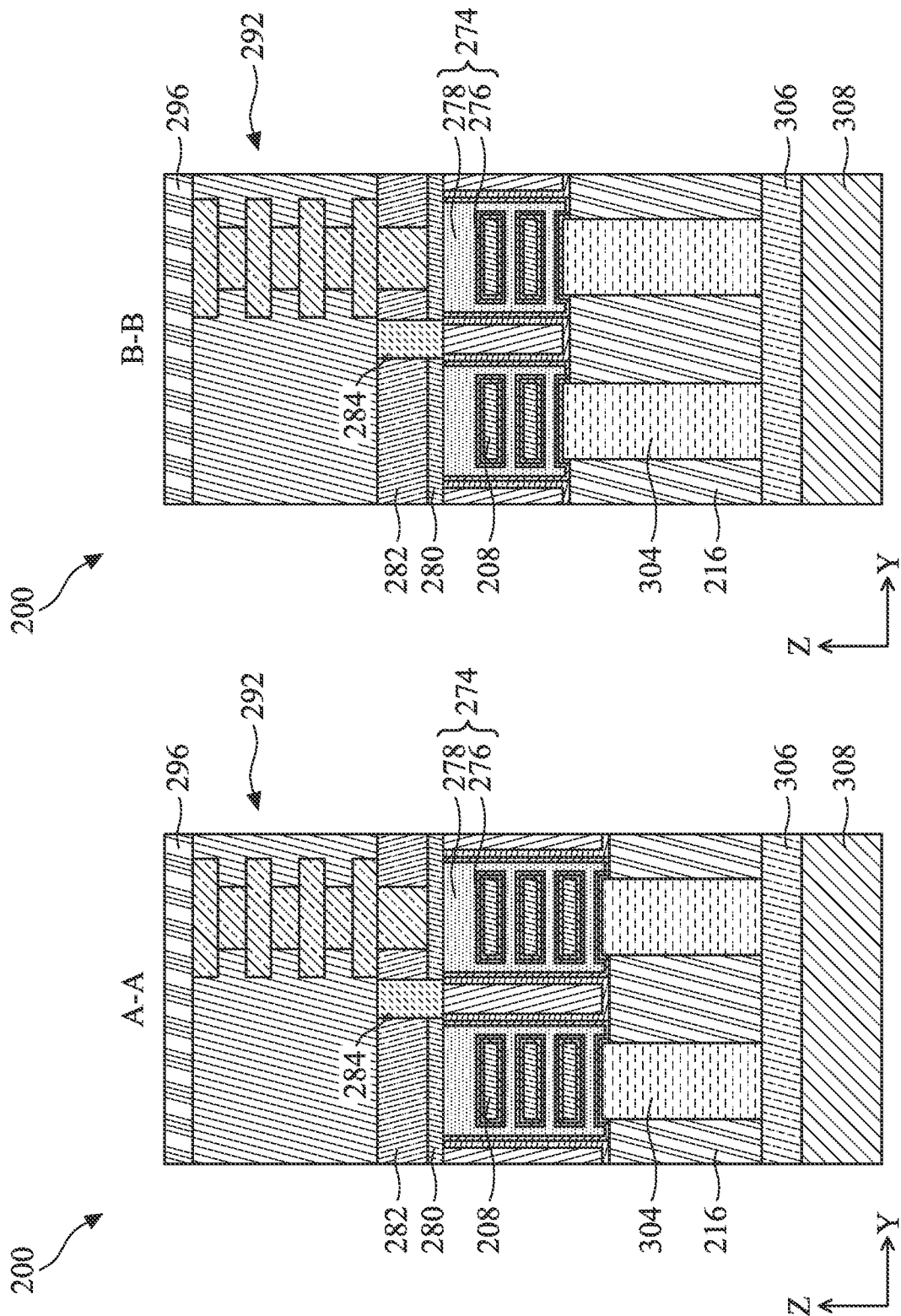

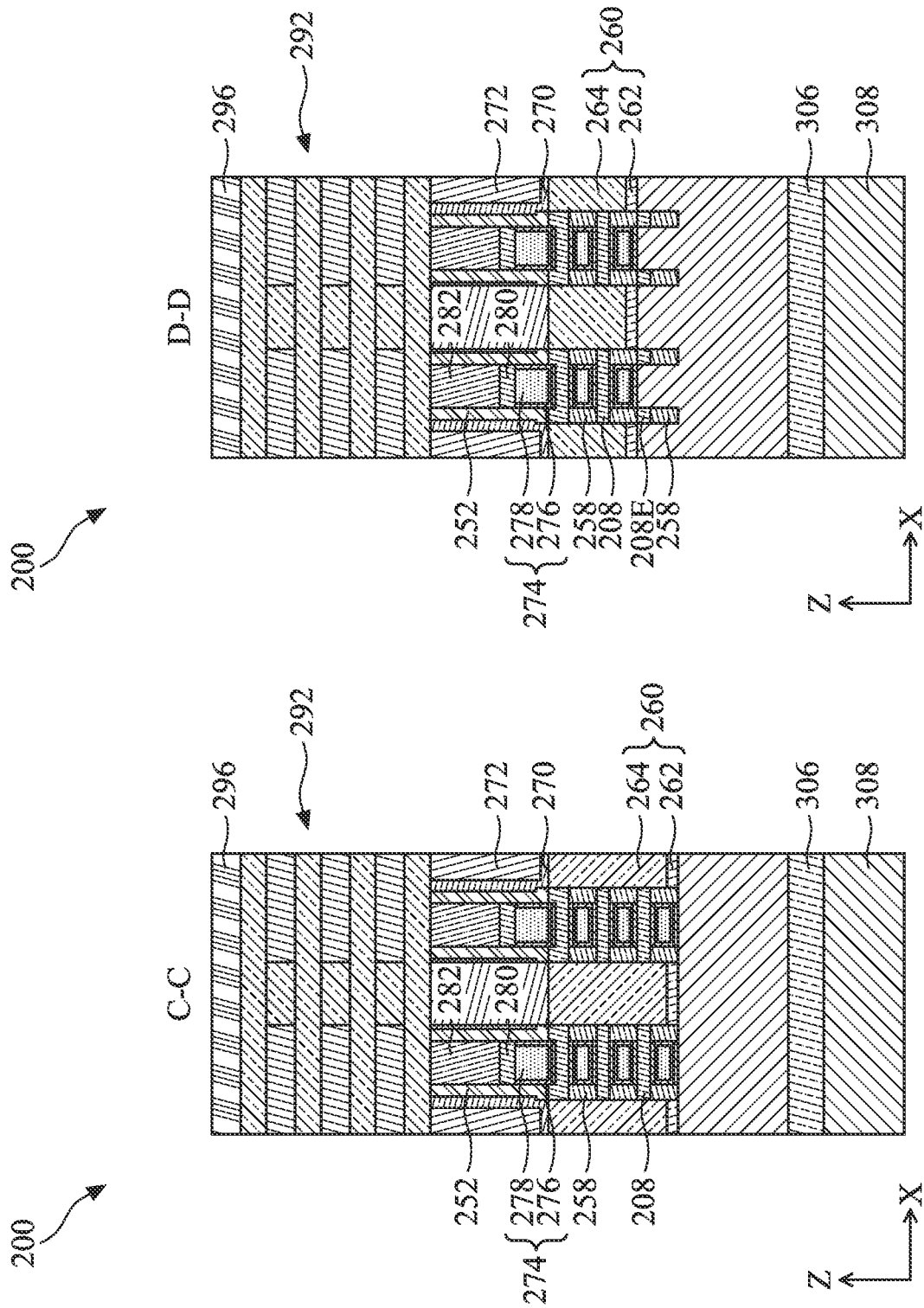

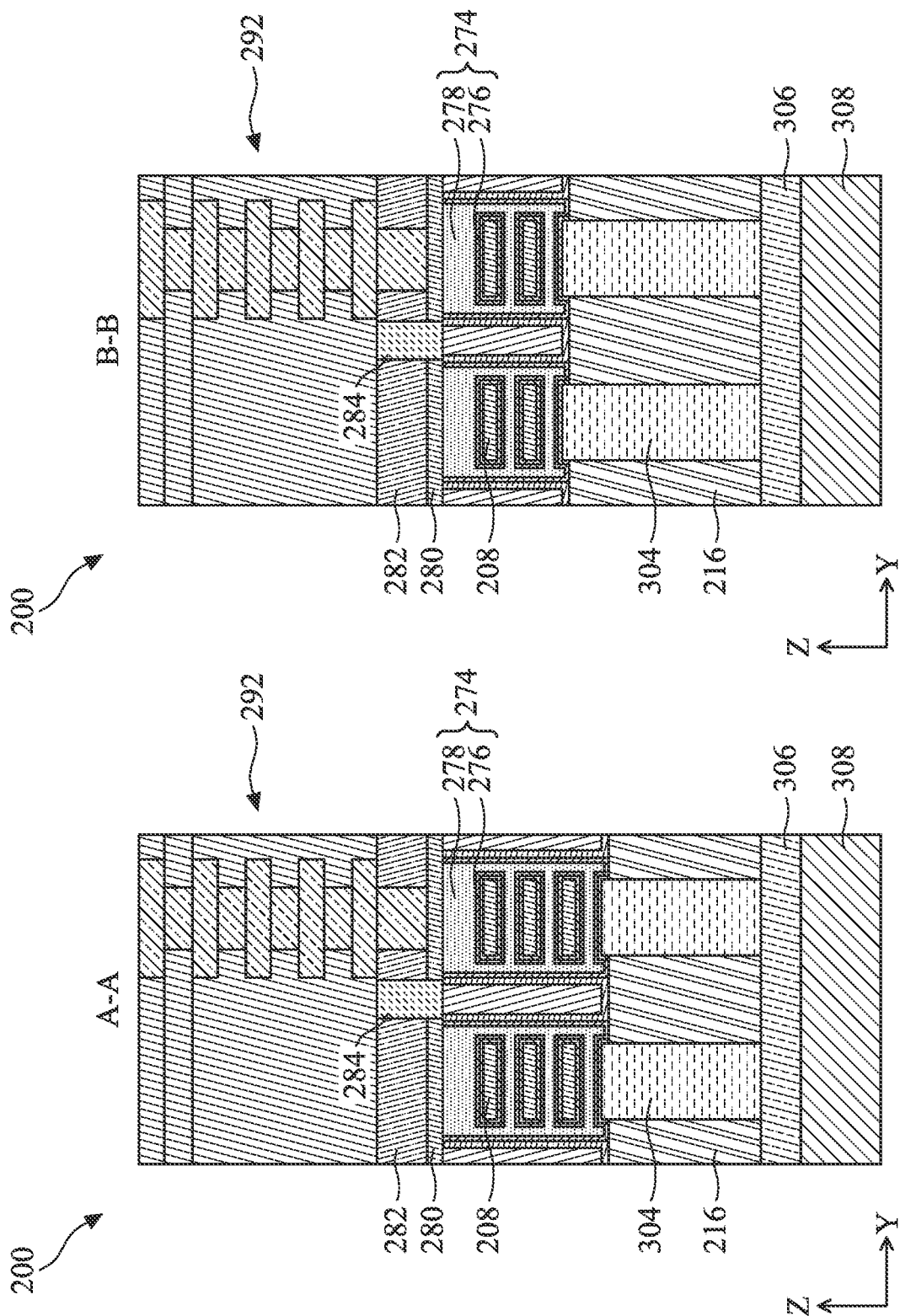

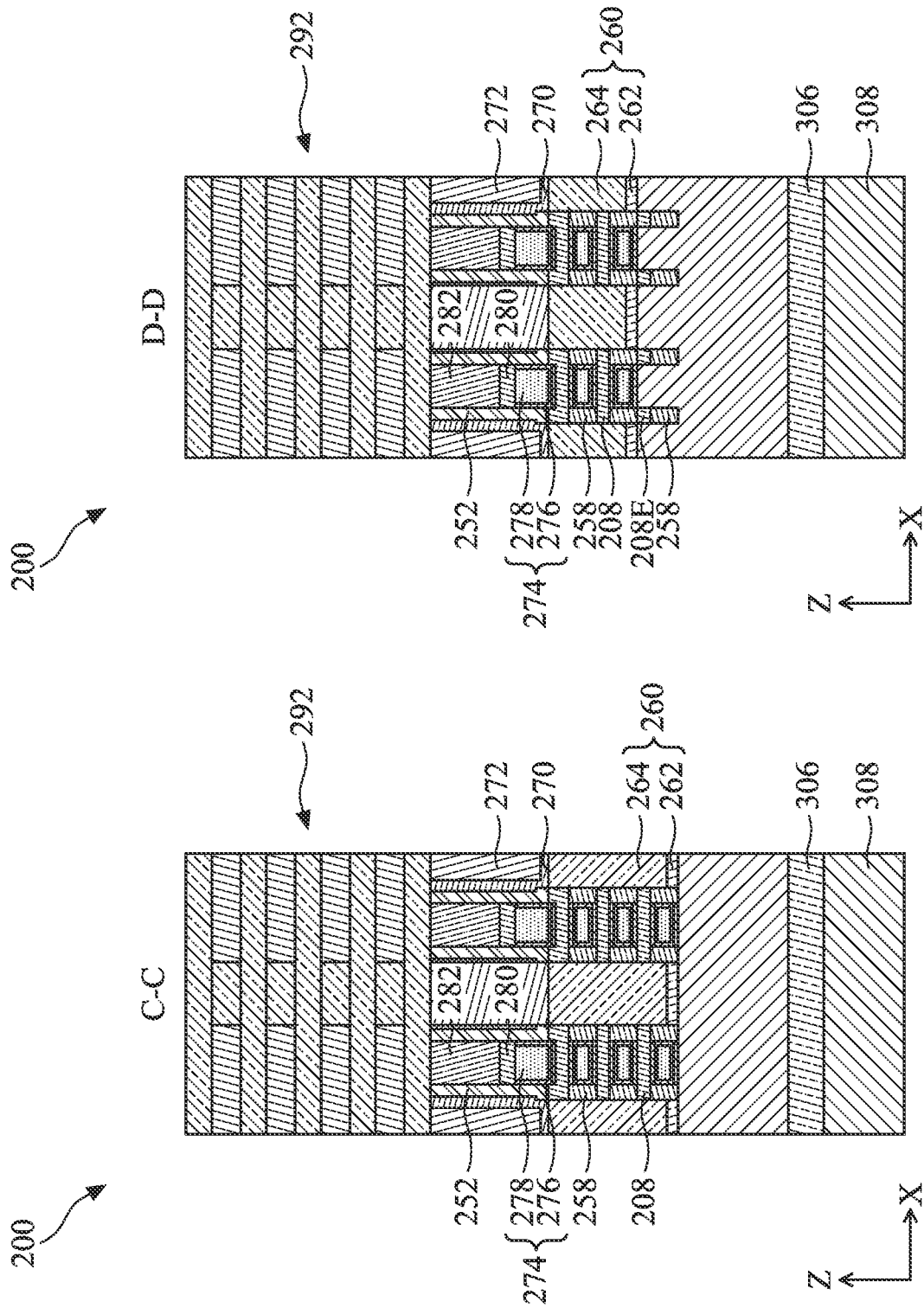

NANOSTRUCTURES AND METHOD FOR MANUFACTURING THE SAME

PRIORITY DATA

This application claims priority to U.S. Provisional Patent Application No. 63/142,532, filed on Jan. 28, 2020, entitled "Nanostructures And Method For Manufacturing The Same", the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate device generally refers to a device having a gate structure (also known as gate stack), or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

MBC transistors in different regions of an IC chip or in different portions of a circuit serve different functions, such as input/output (I/O) functions and core functions. These different functions require the transistors to have different constructions. At the same time, it is advantageous to have similar processes and similar process windows to fabricate these different transistors to reduce cost and improve yield. For example, an IC chip may include high-power regions for high performance computing (HPC) unit or central processing unit (CPU), which requires MBC transistors with strong current driving capability to achieve high operating speed, and low-power regions for I/O or system-on-a-chip (SoC) unit, which requires MBC transistors with less current driving capability to achieve low-capacitance and low-leakage performance. Accordingly, a need of the number of channel members in MBC transistors in different regions may be different in one IC chip. Generally, an MBC transistor having a larger number of channel members provides stronger current driving capability, and vice versa. Therefore, in the course of IC evolution, how to achieve varying numbers of channel members suiting different applications on one IC chip is a challenge faced by the semiconductor industry. At the same time, it is advantageous to have similar processes and similar process windows to fabricate these different transistors to reduce cost and improve yield. Accordingly, while existing semiconductor devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 3B, 3C, 3D, 4A, 4B, 4C, 4D, 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 21E, 21F, 22A, 22B, 22C, 22D, 23A, 23B, 23C, 23D, 24A, 24B, 24C, 24D, 25A, 25B, 25C, 25D, 25E, 25F, 26A, 26B, 26C, 26D, 26E, 26F, 27A, 27B, 27C, 27D, 28A, 28B, 28C, and 28D illustrate fragmentary cross-sectional views of the semiconductor device in FIG. 2 during various fabrication stages of the method in FIGS. 1A and 1B, according to one or more aspects of the present disclosure.

DETAILED DESCRIPTION

Figure 1A:
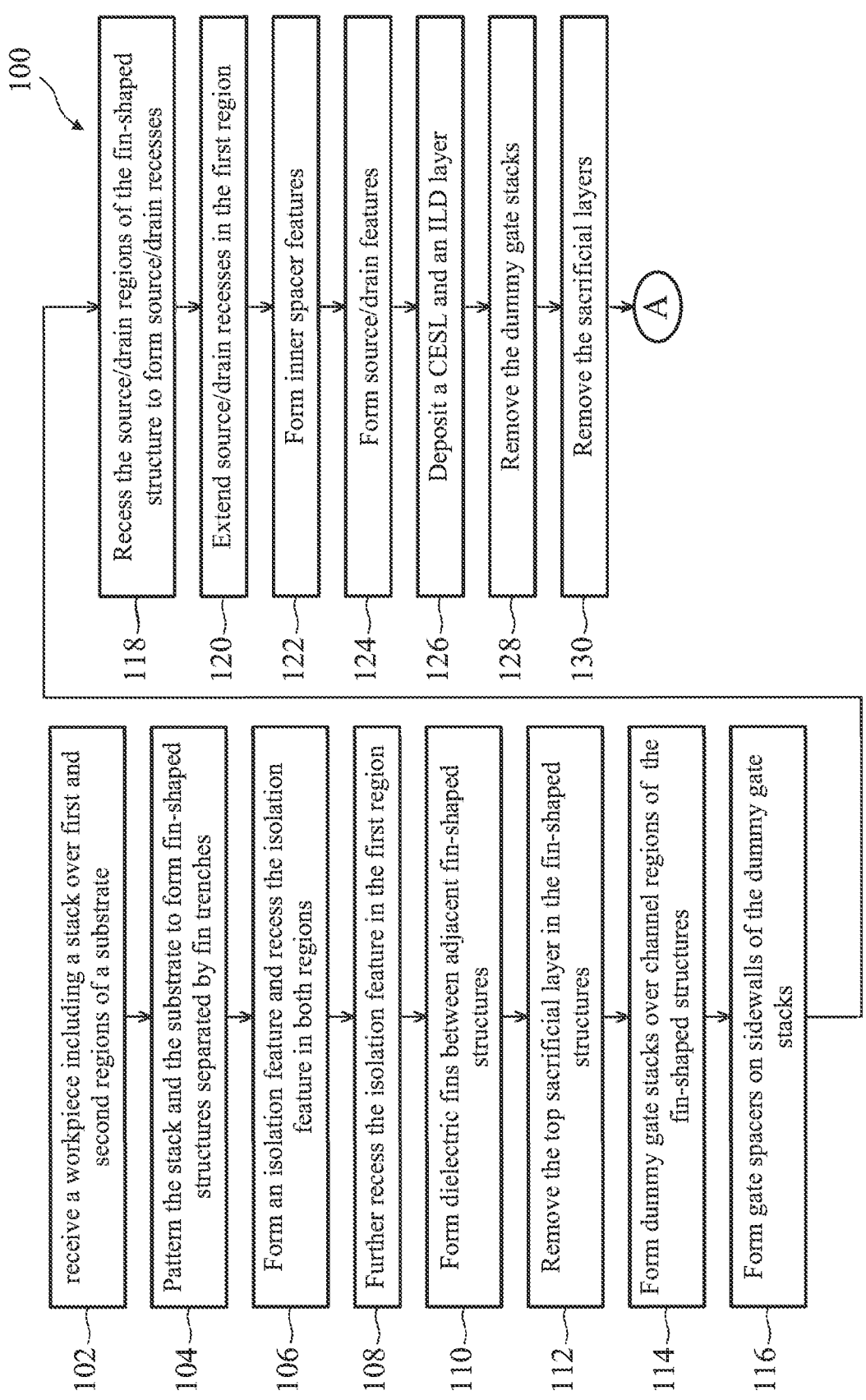
FIGS. 1A and 1B illustrate a flowchart of an example method for making a semiconductor device, according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to integrate circuit (IC) chips having transistors with varying numbers of channel members in different regions suiting different applications on one chip. In various embodiments, multi-bridge-channel (MBC) transistors with different (varying) numbers of channel members on the same substrate are placed in a first region (e.g., a core region for high-power applications) and a second region (e.g., an I/O region for low-leakage applications) inside one IC chip, respectively. The varying numbers of channel members can be achieved from backside of a semiconductor structure, according to various aspects of the present disclosure. Although embodiments that include stacked semiconductor channel layers in forms of nanowires or nanosheets are illustrated as channel members in the figures, the present disclosure is not so limited and may be applicable to other multi-gate devices, such as other types of MBC transistors or FinFETs.

Figure 1B:
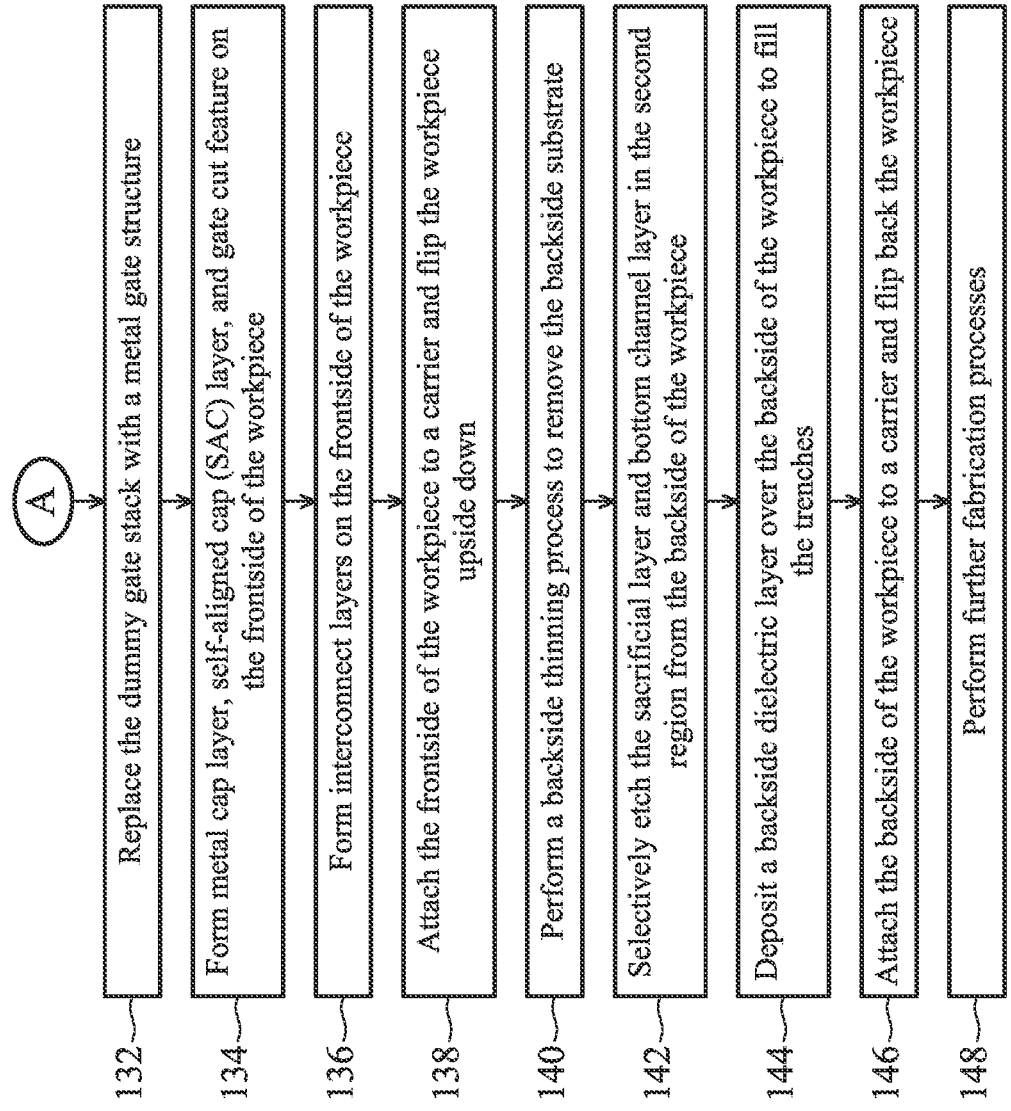

The various aspects of the present disclosure will now be described in more detail with reference to the figures. FIGS. 1A and 1B collectively illustrate a flowchart of a method 100 of forming a semiconductor device. The method 100 is merely an example and is not intended to limit the present disclosure to what is explicitly illustrated in the method 100. Additional steps may be provided before, during and after the method 100, and some steps described can be replaced, eliminated, or moved around for additional embodiments of the method. Not all steps are described herein in detail for reasons of simplicity. The method 100 is described below in conjunction with FIGS. 2-28D, which illustrate fragmentary perspective views and cross-sectional views of a workpiece 200 at different stages of fabrication according to embodiments of the method 100. Because a semiconductor device will be formed from the workpiece 200, the workpiece 200 may be referred to as a semiconductor device 200 or a device 200 as the context requires.

In some embodiments, the workpiece 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2-28D have been simplified for the sake of clarity to better understand the inventive concepts of the present disclosure. Additional features can be added in the workpiece 200, and some of the features described below can be replaced, modified, or eliminated in other embodiments of the workpiece 200. The workpiece 200 includes a first region (also denoted as the region I) for high-power and/or high-speed applications such as a core area that demands stronger current driving capability and a second region (also denoted as the region II) for low-capacitance and/or low-leakage applications, such as an I/O area that demands weaker current driving capability. The region I may include high performance computing (HPC) unit, central processing unit (CPU) logic circuits, memory circuits, and other core circuits. The region II may include I/O cells, ESD cells, and other circuits.

Figure 2:
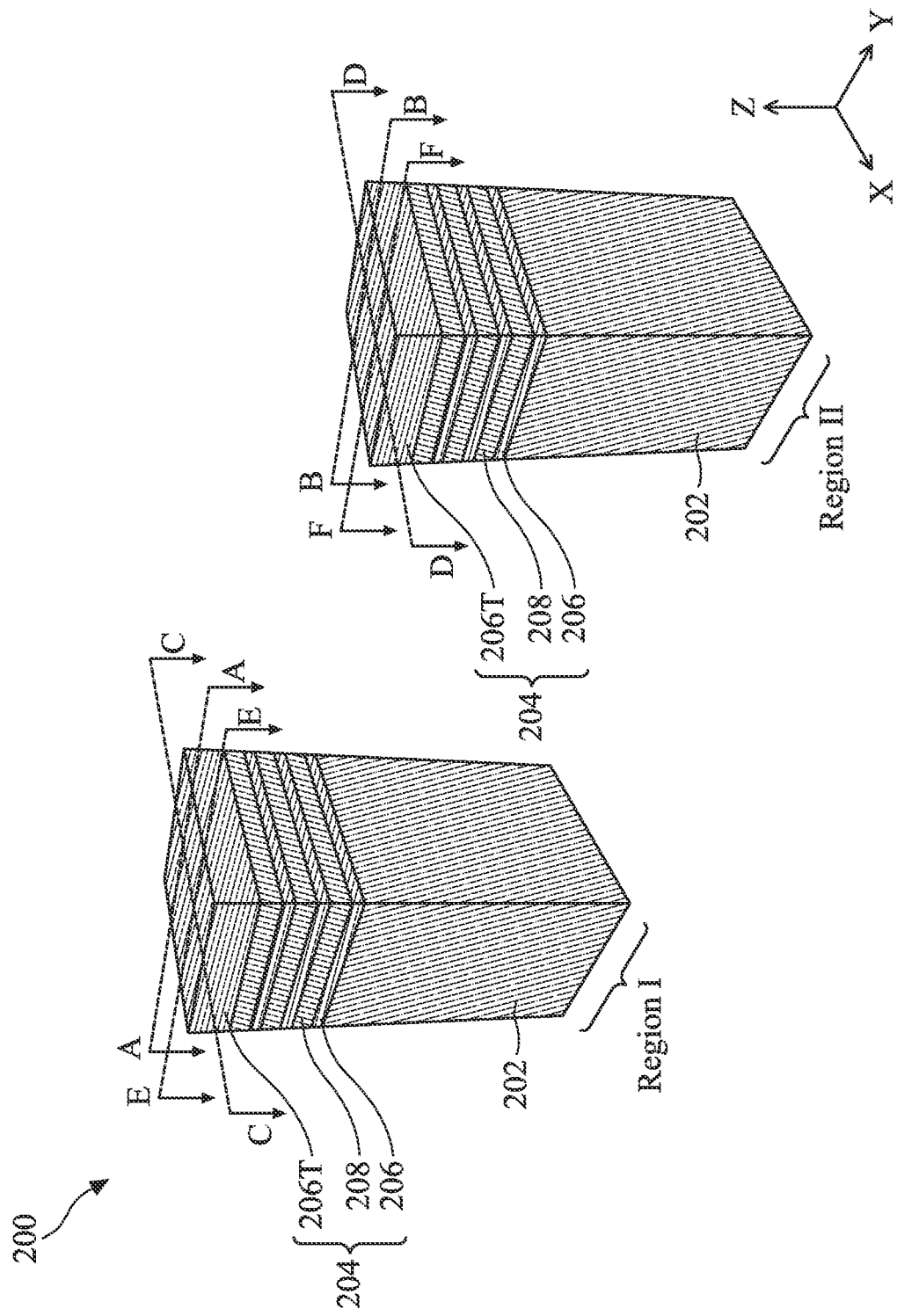
FIG. 2 illustrates a perspective view of a semiconductor device, according to one or more aspects of the present disclosure.
Figure 3A:
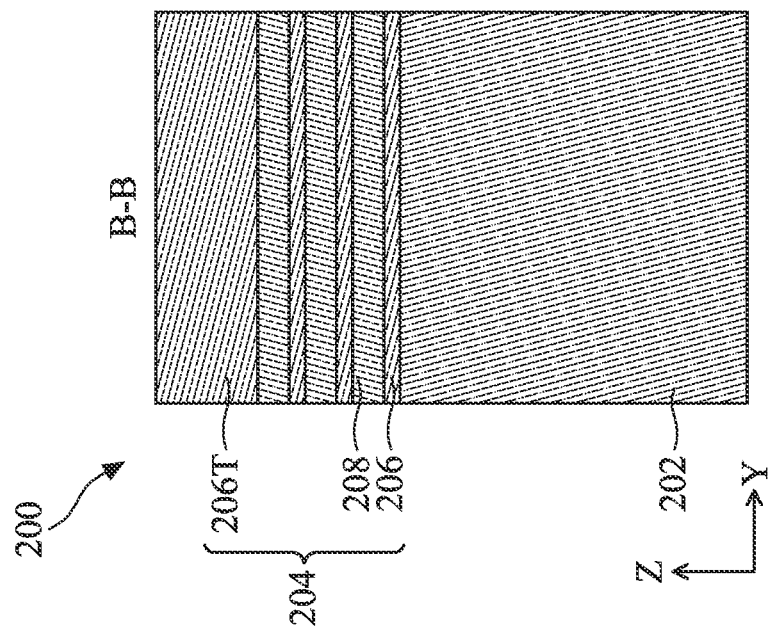
Figure 3B:
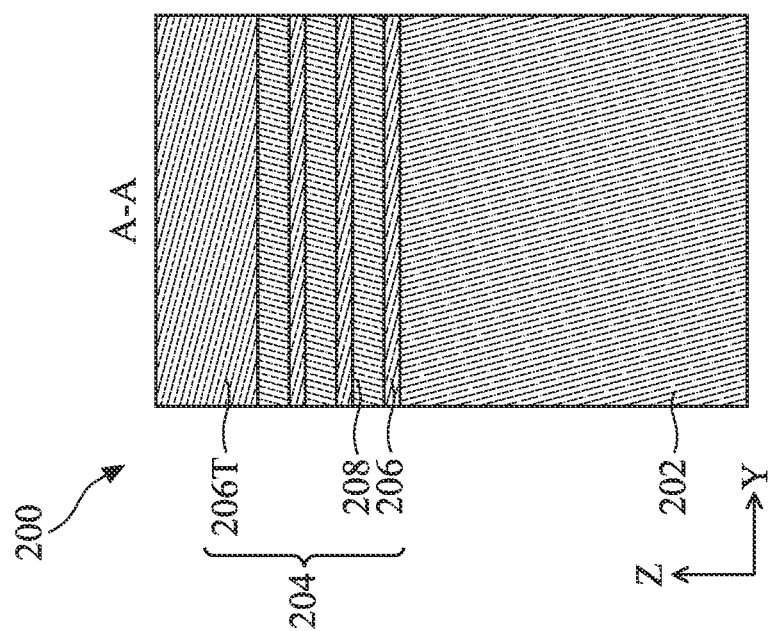
Figure 3D:
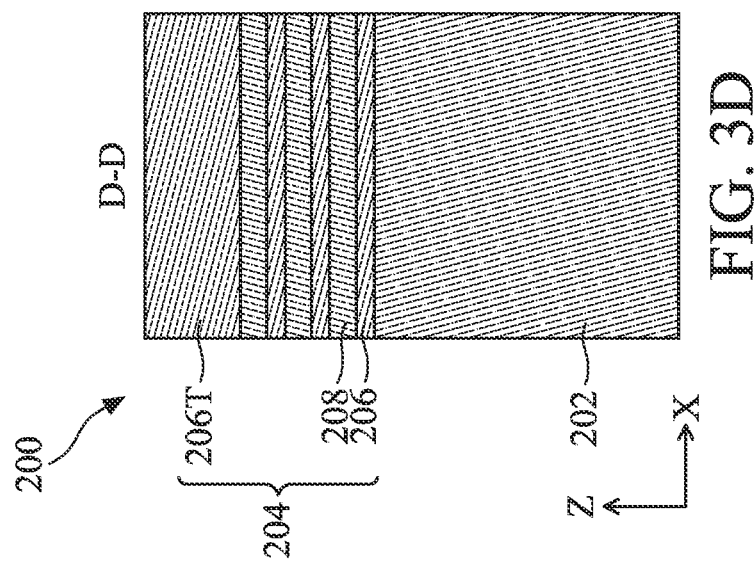
Figure 3C:
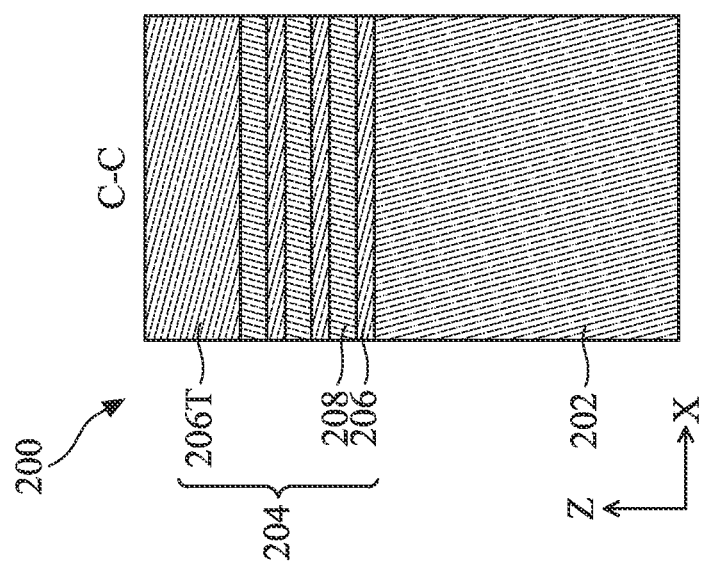

FIG. 2 illustrates a perspective view of the workpiece 200, and FIGS. 3A-28D illustrate cross-sectional views of the workpiece 200, in portion, along the A-A line, the B-B line, the C-C line, the D-D line, the E-E line, and the F-F line in FIG. 2, respectively. Particularly, the A-A line and the B-B line are fragmentary cross-sectional views in channel regions (i.e., a cut in a Y-Z plane in a channel region along the lengthwise direction of gate structures and perpendicular to the lengthwise direction of channel members) of the to-be-formed transistor(s) in the regions I and II, respectively; the C-C line and the D-D line are fragmentary cross-sectional views along the lengthwise direction of channel members (i.e., a cut in an X-Z plane along the lengthwise direction of channel members and though a channel region and abutting source/drain regions) of the to-be-formed transistor(s) in the regions I and II, respectively; the E-E and the F-F lines are fragmentary cross-sectional views of source/drain regions (i.e., a cut in a Y-Z plane in a source region or a drain region that is perpendicular to the lengthwise direction of channel members) of the to-be-formed transistor(s) in the regions I and II, respectively. In the present disclosure, a source and a drain are interchangeably used.

Referring to FIGS. 2 and 3A-3D, the method 100 includes a block 102 (FIG. 1A) where a workpiece 200 is received. The workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). In various embodiments, the substrate 202 is one substrate extending continuously from the region I to the region II.

The stack 204 may include alternating channel layers 208 and sacrificial layers 206 over the substrate 202, and a top sacrificial layer 206T over the sacrificial layers 206 and the channel layers 208. The sacrificial layers 206, the channel layers 208, and the top sacrificial layer 206T may be deposited using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial damages to the channel layers 208. The sacrificial layers 206 and the channel layers 208 are disposed alternatingly such that the sacrificial layers 206 interleave the channel layers 208. FIG. 2 illustrates that three (3) layers of the sacrificial layers 206 and three (3) layers of the channel layers 208 are alternately and vertically arranged, which is for illustrative purposes only and not intended to be limiting beyond what is specifically recited in the claims. The number of layers depends on the desired number of channel layers 208 for the semiconductor device 200. In some embodiments, the number of the channel layers 208 is between 2 and 7.

Like the sacrificial layers 206, the top sacrificial layer 206T may be formed of silicon germanium (SiGe). In some instances, compositions of the sacrificial layers 206 and the top sacrificial layer 206T are substantially the same. The top sacrificial layer 206T may be thicker than the sacrificial layers 206 and functions to protect the stack 204 from damages during fabrication processes. In some instances, a thickness of the top sacrificial layer 206T may be between about 20 nm and about 40 nm while a thickness of a sacrificial layer 206 may be between about 4 nm and about 15 nm.

Figure 4D:
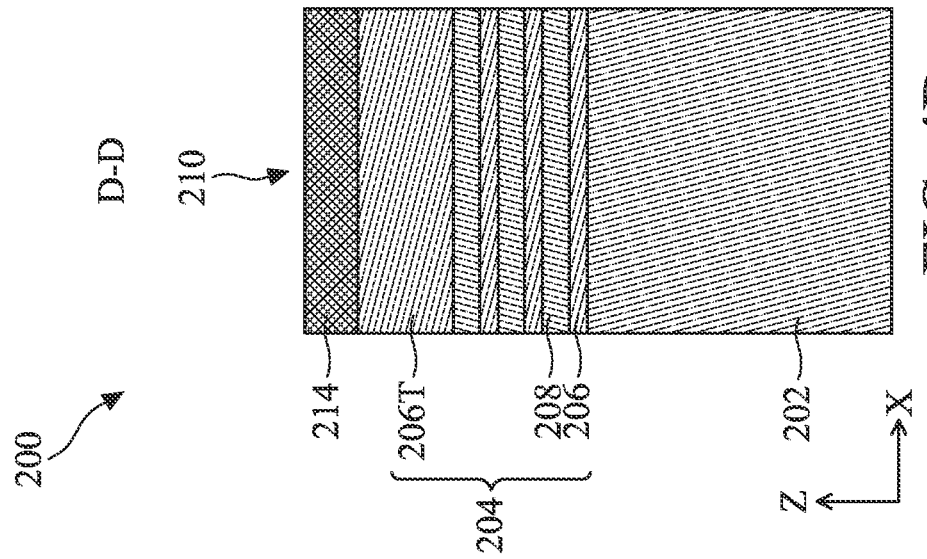
Figure 4C:
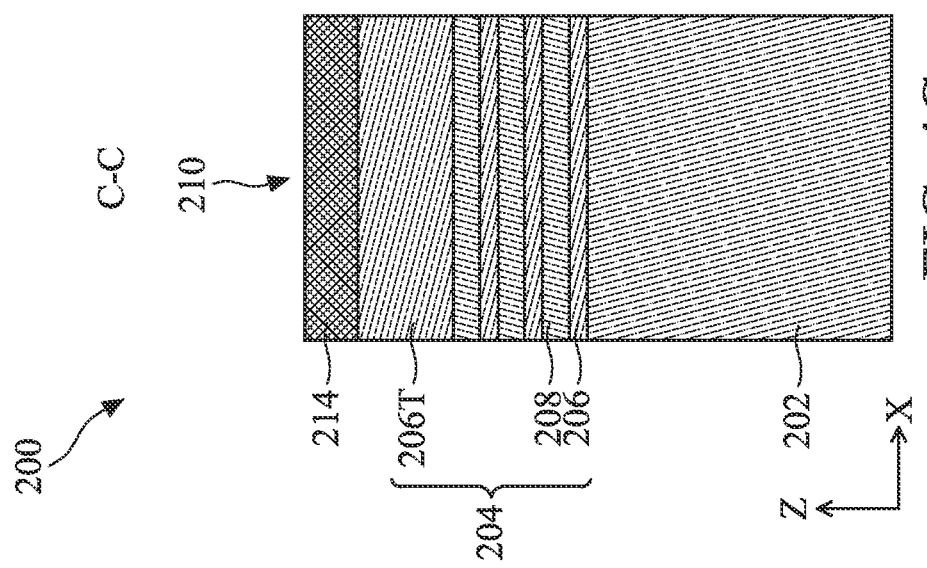
Figure 5C:
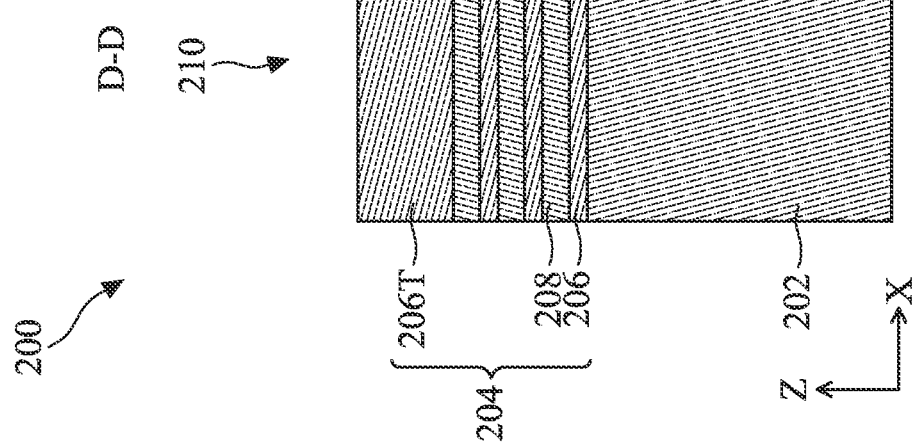
Figure 5D:
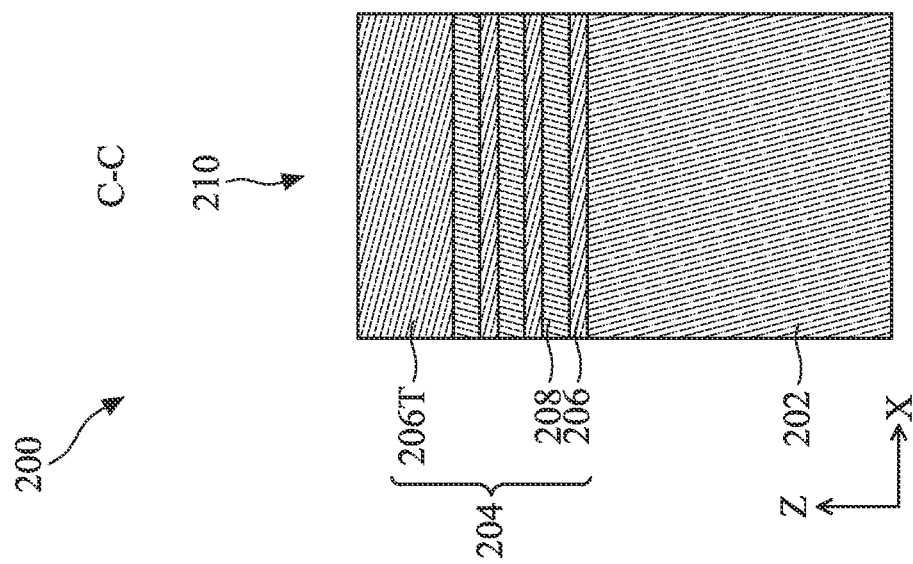
Figure 8D:
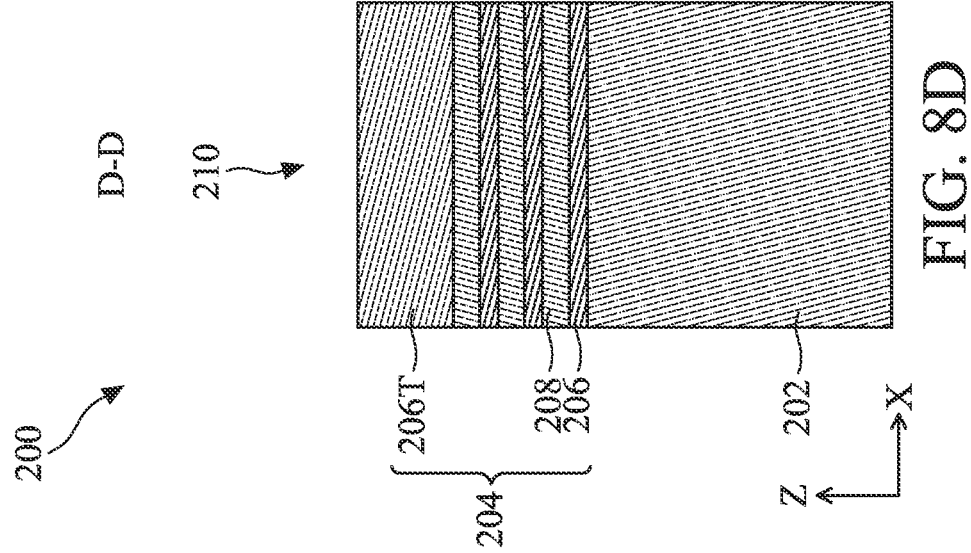
Figure 8C:
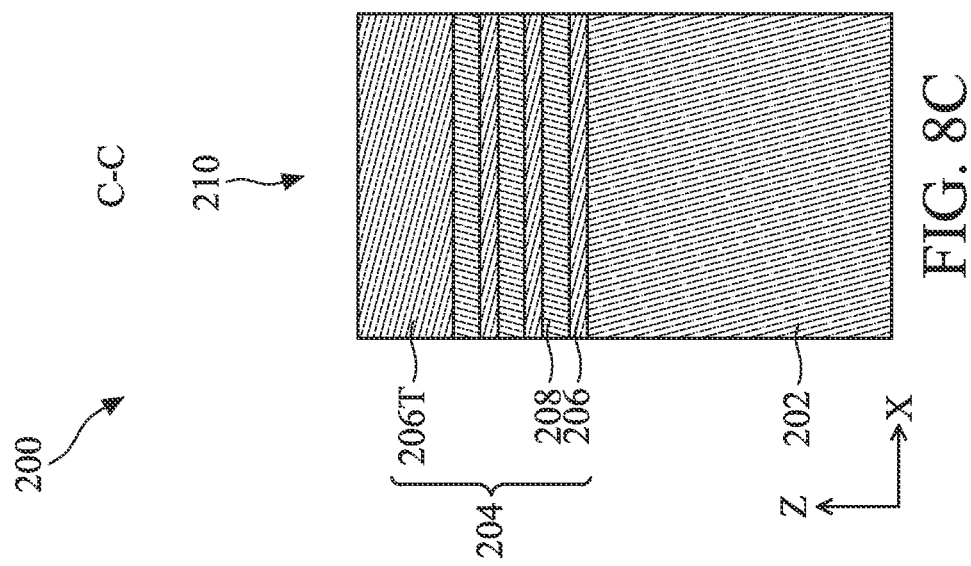
Figure 9C:
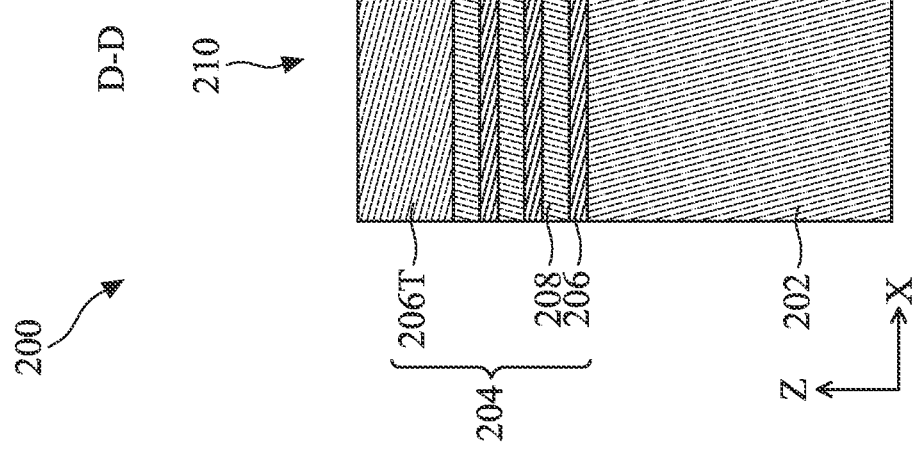
Figure 9D:
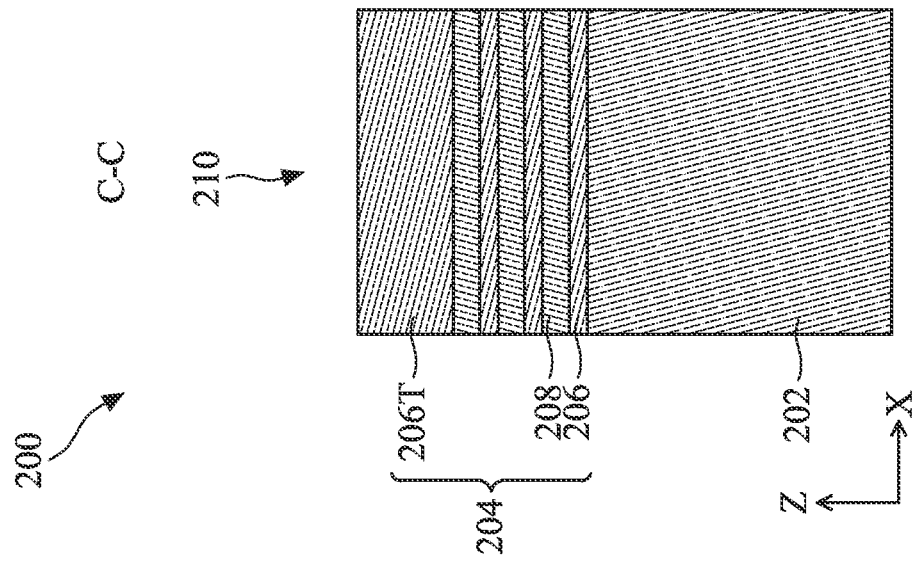
Figure 10A:
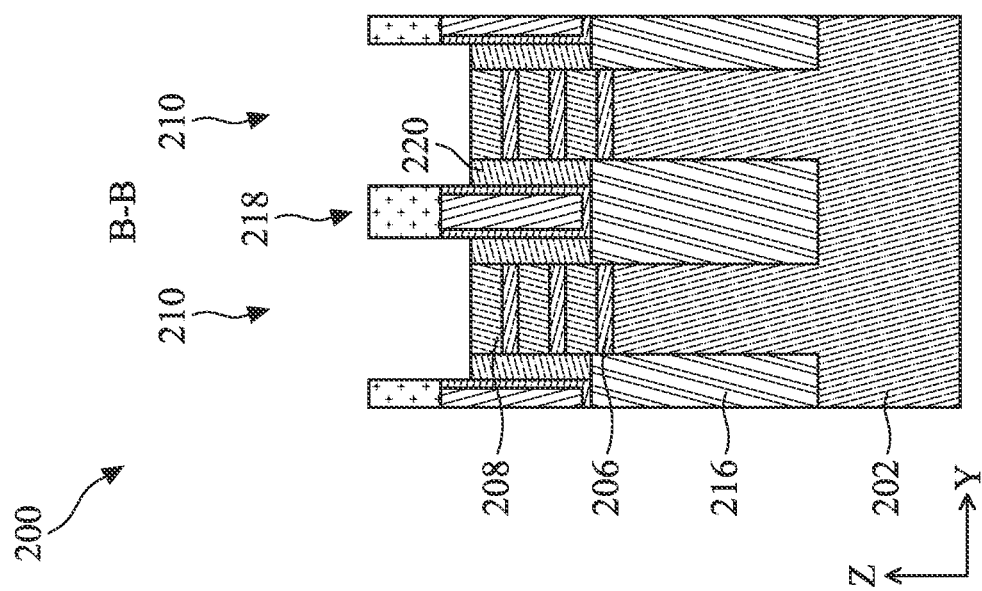
Figure 10B:
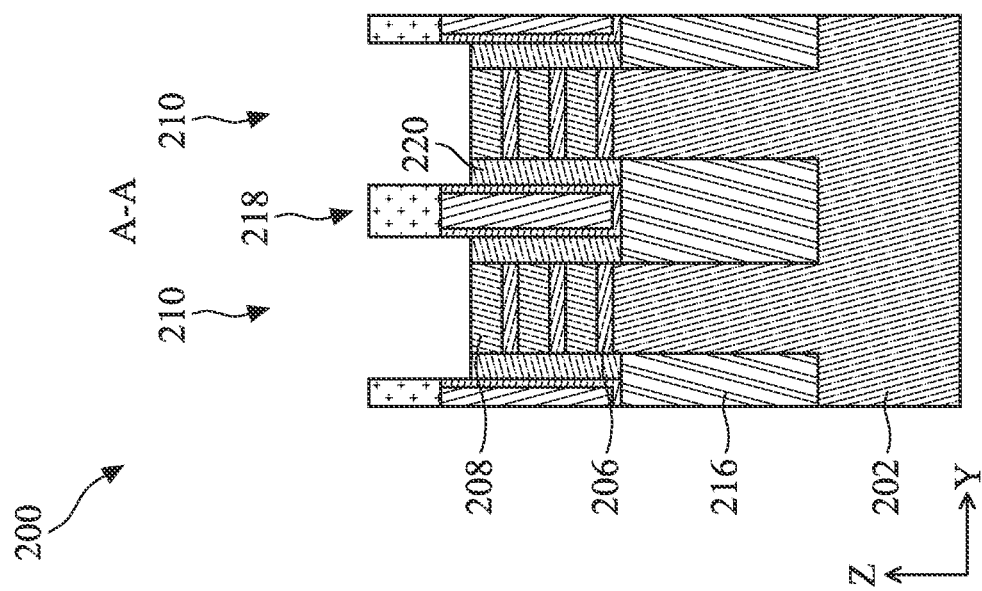

Referring to FIGS. 4A-4C, the method 100 includes a block 104 (FIG. 1A) where the stack 204 and the substrate 202 are patterned to form fin-shaped structures 210 separated by fin trenches 212. To pattern the stack 204 and the substrate 202, a hard mask layer 214 is deposited over the top sacrificial layer 206T. The hard mask layer 214 is then patterned to serve as an etch mask to pattern the top sacrificial layer 206T, the stack 204, and a top portion of the substrate 202. In some embodiments, the hard mask layer 214 may be deposited using CVD, plasma-enhanced CVD (PECVD, atomic layer deposition (ALD), plasma-enhanced ALD (PEALD), or a suitable deposition method. The hard mask layer 214 may be a single layer or a multi-layer. When the hard mask layer 214 is a multi-layer, the hard mask layer 214 may include a pad oxide and a pad nitride layer. In an alternative embodiment, the hard mask layer 214 may include silicon (Si). The fin-shaped structures 210 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 214 and then the patterned hard mask layer 214 may be used as an etch mask to etch the stack 204 and the substrate 202 to form fin-shaped structures 210. The etching process can include dry etching, wet etching, reactive ion etching (RIE), and/or other suitable processes.

Still referring to FIGS. 4A-4D, each of the fin-shaped structures 210 includes a base portion 210B formed from a portion of the substrate 202 and a top portion 210T formed from the stack 204. The top portion 210T is disposed over the base portion 210B. The fin-shaped structures 210 extend lengthwise along the X direction and extend vertically along the Z direction from the substrate 202. Along the Y direction, the fin-shaped structures 210 are separated by fin trenches 212. In some instances, the fin trench 212 has a width ranging from about 20 nm to about 50 nm, defining a spacing between adjacent fin-shape structures 210.

Referring to FIGS. 5A-5D, the method 100 includes a block 106 (FIG. 1A) where an isolation feature 216 is formed in the fin trenches 212. The isolation feature 216 may be referred to as a shallow trench isolation (STI) feature 216. In an example process to form the isolation feature 216, a dielectric material is deposited over the workpiece 200, filling the fin trenches 212 with the dielectric material. In some embodiments, the dielectric material may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until the hard mask layer 214 is exposed.

After the planarization, the deposited dielectric material is recessed in an etching-back process until some of the sacrificial layers 206 and the channel layers 208 located in the top portion of the fin-shaped structures 210 rise above the isolation feature 216. As a comparison, the base portion 210B remains fully covered by the isolation feature 216, as well as rest of the sacrificial layers 206 and the channel layers 208 located in the bottom portion of the fin-shaped structures 210. As will be discussed in further details below, although the number of channel layers 208 appears the same in both regions I and II, the channel layers 208 fully or partially covered by the isolation feature 216 in the region II will later be removed from backside of the workpiece 200. Particularly, in the illustrated embodiment, the bottommost sacrificial layer 206 is fully covered by the isolation feature 216 and the bottommost channel layer 208 is partially covered by the isolation feature 216, and the bottommost channel lay 208 will be removed such that the number of channel layers 208 in the region II will be reduced by one than that in the region I. In various embodiments, by having more bottom channel layers 208 not fully raised above the isolation feature 216, the number of channel layers 208 in the region II will be reduced further, such as from one to four layers less than that in the region I. In other words, as to be shown below, a height of the isolation feature 216 is used to control the number of channel layers 208 that would be removed from the region II. The difference of channel layers in the regions I and II is determined by device performance needs. The etching-back process at the block 106 may include, for example, wet etching, dry etching, reactive ion etching, or other suitable etching methods. The hard mask layer 214 may also be removed in the etching-back process.

Referring to FIGS. 6A-6D, the method 100 includes a block 108 (FIG. 1A) where the isolation feature 216 in the region I is further recessed in an etching-back process until the stack 204 fully rises above the isolation feature 216. The base portion 210B in the region I may also be partially exposed as shown in the illustrated embodiment. The etching-back process may include, for example, wet etching, dry etching, reactive ion etching, or other suitable etching methods. The distance of the further recess ΔH may range from about 5 nm to about 30 nm. To limit the etching-back process in the region I, a mask layer 214 may be first deposited (e.g., by spin coating) to cover the region II. In some embodiments, the mask layer 214 is a photoresist layer, such as a bottom antireflective coating (BARC) layer. After the isolation feature 216 in the region I is further recessed, the mask layer 214 may be removed in an etching process, or other suitable processes, such as ashing or resist stripping.

Referring to FIGS. 7A-7D, 8A-8D, and 9A-9D, the method 100 includes a block 110 (FIG. 1A) where dielectric fins 218 are formed. In the illustrated embodiment, at block 110, the dielectric fins 218 are formed in the fin trenches 212. An example process to form the dielectric fins 218 includes conformally depositing a cladding layer 220 (as illustrated in FIGS. 7A-7D), conformally depositing a first dielectric layer 222 and depositing a second dielectric layer 224 in the fin trenches 212 (as illustrated in FIGS. 8A-8D), and depositing a high-k dielectric layer 226 on top of the first dielectric layer 222 and the second dielectric layer 224 (as illustrated in FIGS. 9A-9D).

The cladding layer 220 is deposited over the workpiece 200, including over the sidewalls of the stack 204 and a top portion of the base portion 210B in the region I and partially over the sidewalls of stack 204 in the region II. In some embodiments, the cladding layer 220 may have a composition similar to that of the sacrificial layers 206 or the top sacrificial layer 206T. In one example, the cladding layer 220 may be formed of silicon germanium (SiGe). Their common composition allows selective and simultaneous removal of the sacrificial layers 206 and the cladding layer 220 in a subsequent etching process. In some embodiments, the cladding layer 220 may be conformally and epitaxially grown using vapor phase epitaxy (VPE) or molecular beam epitaxy (MBE). As shown in FIGS. 7A-7D, the cladding layer 220 is selectively disposed on exposed sidewall surfaces in the fin trenches 212. Depending on the extent of the selective growth of the cladding layer 220, an etching-back process may be performed to expose the isolation feature 216.

An example process to form the dielectric fins 218 further includes conformally depositing a first dielectric layer 222 and a second dielectric layer 224 over the workpiece 200 in sequence. The second dielectric layer 224 is surrounded by the first dielectric layer 222. The first dielectric layer 222 may be conformally deposited using CVD, ALD, or a suitable method. The first dielectric layer 222 lines the sidewalls and the bottom surfaces of the fin trenches 212. The second dielectric layer 224 is then conformally deposited over the first dielectric layer 222 using CVD, high density plasma CVD (HDPCVD), flowable CVD (FCVD), and/or other suitable process. In some instances, a dielectric constant of the second dielectric layer 224 is smaller than that of the first dielectric layer 222. The first dielectric layer 222 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In one embodiment, the first dielectric layer 222 includes aluminum oxide. The second dielectric layer 224 may include silicon oxide, silicon carbide, silicon oxynitride, silicon oxycarbonitride, or a suitable dielectric material. In one embodiment, the second dielectric layer 224 includes silicon oxide. In some instances, as shown in FIGS. 8A-8D, after depositing the dielectric layers 222 and 224, a CMP process may be performed to remove excess material portions and to planarize a top surface of the workpiece 200 such that the top sacrificial layer 206T is exposed.

An example process to form the dielectric fins 218 may further include depositing a high-k dielectric layer 226. In some instances, a recessing process is performed to remove top portions of the dielectric layers 222 and 224. The recessing process may include a dry etching process, a wet etching process, and/or a combination thereof. In some embodiments, a recessing depth is controlled (e.g., by controlling an etching time) to result in a desired recess depth. After performing the recessing process, a high-K dielectric layer 226 is deposited within trenches formed by the recessing process. In some embodiments, the high-K dielectric layer 226 may include $HfO_2$, $ZrO_2$, $HfAlO_x$, $HfSiO_x$, $Y_2O_3$, $Al_2O_3$, or another high-K material. The high-K dielectric layer 226 may be deposited by a CVD process, an ALD process, a PVD process, and/or other suitable process. As shown in FIGS. 9A-9D, after deposition of the high-K dielectric layer 226, a CMP process is performed to remove excess material portions and to planarize a top surface of the workpiece 200. Upon conclusion of the block 110, the dielectric fins 218 are defined as having a lower portion including the recessed portions of the dielectric layers 222, 224 and an upper portion including the high-K dielectric layer 226. The dielectric fins 218 are also referred to as hybrid fins 218. The dielectric fins 218 in the regions I and II have uneven bottom surfaces such that the bottom surface in the region I is $\Delta H$ lower than that in the region II. As discussed above, $\Delta H$ may range from about 5 nm to about 30 nm.

Referring to FIGS. 10A-10D, the method 100 includes a block 112 (FIG. 1A) where the top sacrificial layer 206T in the fin-shaped structures 210 are removed. At the block 112, the workpiece 200 is etched to selectively remove the top sacrificial layer 206T and a portion of the cladding layer 220 to expose the topmost channel layer 208, without substantially damaging the dielectric fins 218. In some instances, because the top sacrificial layer 206T and the cladding layer 220 are formed of silicon germanium (SiGe), the etching process at the block 112 may be selective to silicon germanium (SiGe). For example, the cladding layer 220 and the top sacrificial layer 206T may be etched using a selective wet etching process that includes ammonium hydroxide ($NH_4OH$), hydrogen fluoride (HF), hydrogen peroxide ($H_2O_2$), or a combination thereof. After the removal of the top sacrificial layer 206T and a portion of the cladding layer 220, the dielectric fins 218 rise above the topmost channel layer 208.

Referring to FIGS. 11A-11D, the method 100 includes a block 114 (FIG. 1A) where dummy gate stacks 240 are formed over the channel regions of the fin-shaped structures 210. In some embodiments, a gate replacement process (or gate-last process) is adopted where the dummy gate stacks 240 serve as a placeholder for functional gate structures. Other processes and configuration are possible. In the illustrated embodiment, the dummy gate stack 240 includes a dummy dielectric layer 242 and a dummy electrode 244 disposed over the dummy dielectric layer 242. For patterning purposes, a gate top hard mask 246 is deposited over the dummy gate stacks 240. The gate top hard mask 246 may be a multi-layer and include a silicon nitride mask layer 248 and a silicon oxide mask layer 250 over the silicon nitride mask layer 248. The regions of the fin-shaped structures 210 underlying the dummy gate stacks 240 may be referred to as channel regions. Each of the channel regions in a fin-shaped structure 210 is sandwiched between two source/drain regions for source/drain formation. In an example process, the dummy dielectric layer 242 is blanketly deposited over the workpiece 200 by CVD. A material layer for the dummy electrode 244 is then blanketly deposited over the dummy dielectric layer 242. The dummy dielectric layer 242 and the material layer for the dummy electrode 244 are then patterned using photolithography processes to form the dummy gate stacks 240. In some embodiments, the dummy dielectric layer 242 may include silicon oxide and the dummy electrode 244 may include polycrystalline silicon (polysilicon).

Still referring to FIGS. 11A-11D, the method 100 includes a block 116 (FIG. 1A) where gate spacers 252 are formed along sidewalls of the dummy gate stacks 240. The gate spacers 252 may include two or more gate spacer layers. Dielectric materials for the gate spacers 252 may be selected to allow selective removal of the dummy gate stacks 240. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the gate spacers 252 may be conformally deposited over the workpiece 200 using CVD, subatmospheric CVD (SACVD), or ALD, and then be anisotropically etched to remove horizontal portions while vertical portions of the gate spacers 252 remain on the sidewalls of the dummy gate stacks 240.

Referring to FIGS. 12A-12D, the method 100 includes a block 118 (FIG. 1A) where the source/drain regions of the fin-shaped structures 210 are recessed to form source recesses and drain recesses, collectively as source/drain recesses 254 (or source/drain trenches 254). With the dummy gate stack 240 and the gate spacers 252 serving as an etch mask, the workpiece 200 is anisotropically etched to form the source/drain recesses 254 over the source/drain regions of the fin-shaped structures 210. In the illustrated embodiment, operations at the block 118 remove the sacrificial layers 206 and the channel layers 208 from the source/drain regions in both regions I and II thereby exposing the base portion 210B, and remove the cladding layer 220 and a portion of the isolation feature 216 from the regions II thereby exposing the isolation feature 216 (FIG. 12B). As a comparison, because the cladding layer 220 extends below the bottommost sacrificial layer 206 in the region I, a bottommost portion of the cladding layer 220 remains and covers the isolation features 216 in the region I (FIG. 12A). The anisotropic etch at the block 118 may include a dry etching process. For example, the dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Upon conclusion of the block 118, the exposed top surfaces of the base portion 210B in both regions I and II are level, as illustrated by the dotted line in FIGS. 12A and 12B.

Referring to FIGS. 13A-13D, the method 100 includes a block 120 where source/drain recesses 254 in the region I are further extended into the base portion 210B by an etching process to form deeper source/drain recesses 254D and remove the remaining portions of the cladding layer 220 in the region I. To limit the etching process in the region I, a mask layer 256 may be first deposited (e.g., by spin coating) to cover the region II. In some embodiments, the mask layer 256 is a photoresist layer, such as a bottom antireflective coating (BARC) layer. After the deeper source/drain recesses 254D in the region I is extended, the mask layer 256 may be removed in an etching process, or other suitable processes, such as ashing or resist stripping. The distance of the further recess ΔH' may range from about 5 nm to about 10 nm.

Referring to FIGS. 14A-14D, the method 100 includes a block 122 where inner spacer features 258 are formed. In some embodiments, at the block 122, the sacrificial layers 206 exposed in the source/drain recesses 254 and the deeper source/drain recess 254D are first selectively and partially recessed to form inner spacer recesses, while the exposed channel layers 208 are substantially unetched. In an embodiment where the channel layers 208 consist essentially of silicon (Si) and the sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the partial recess may include a selective etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 258, as illustrated in FIGS. 14A-14D.

Figure 14A:
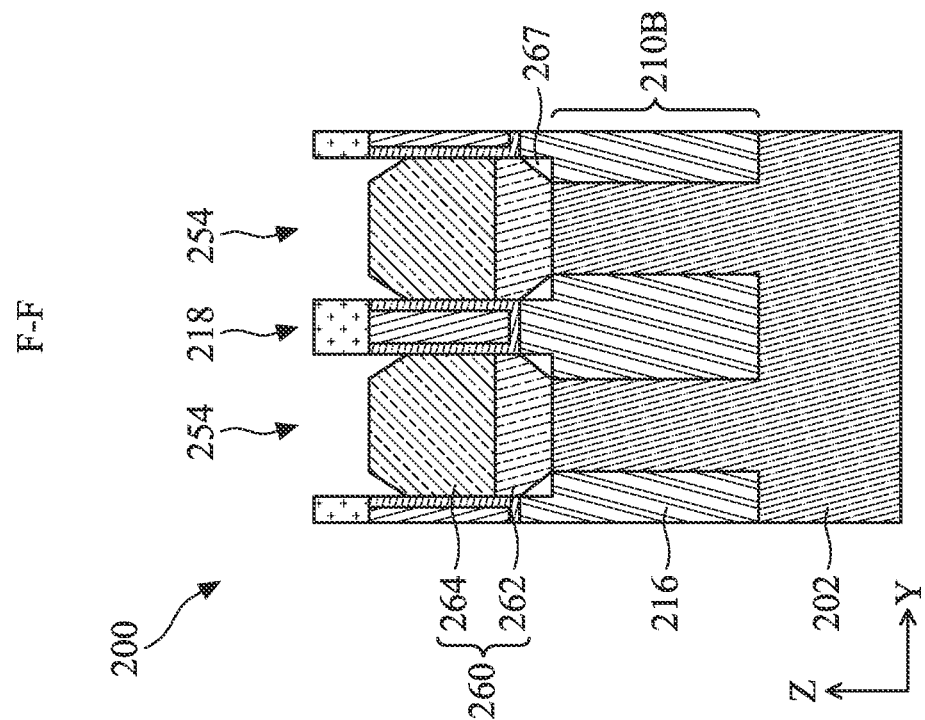
Figure 14B:
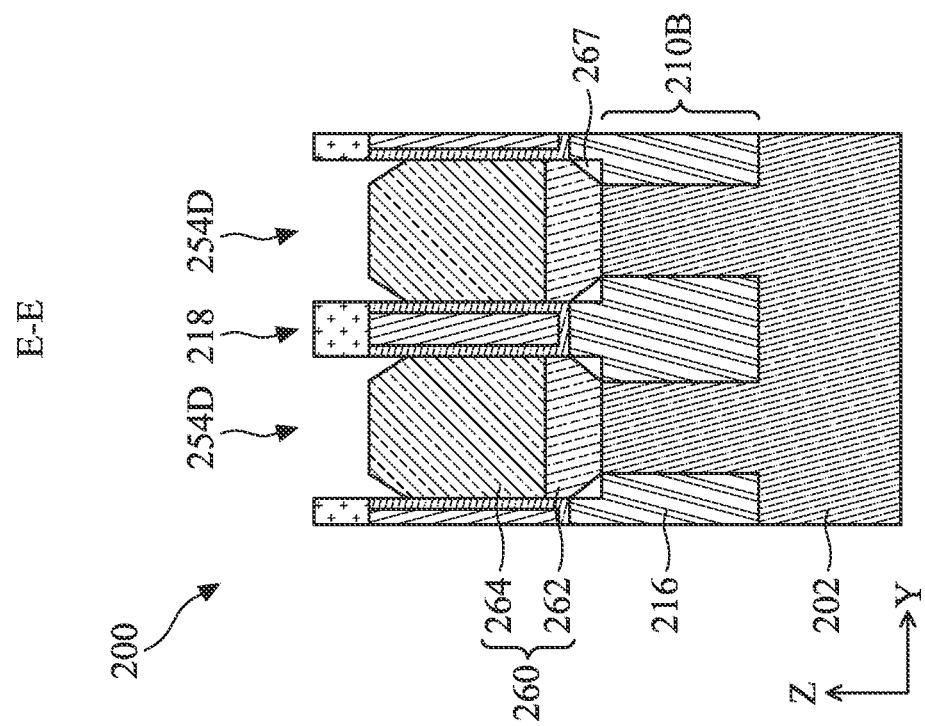
Figure 16C:
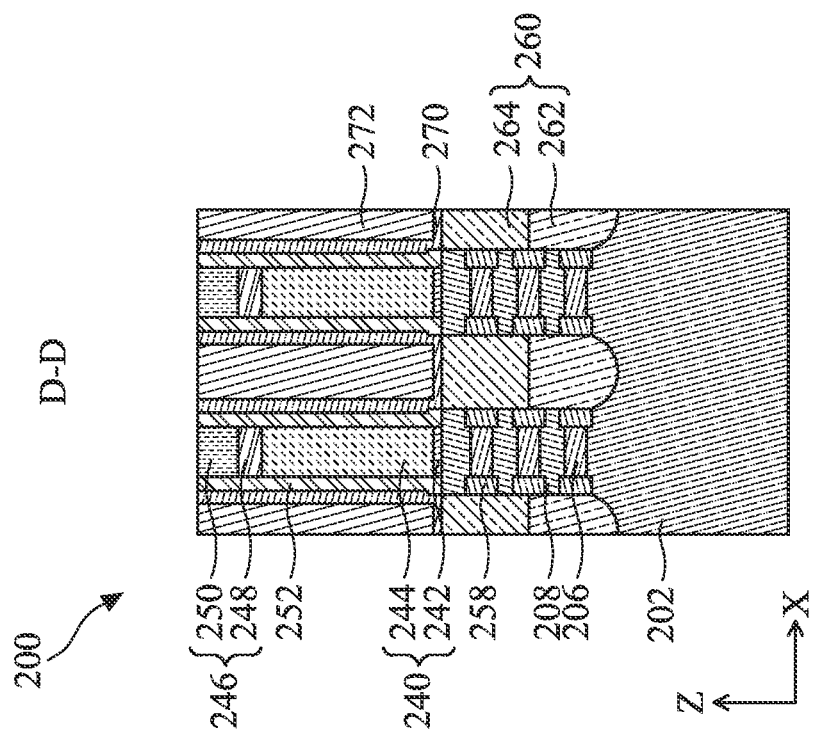
Figure 16D:
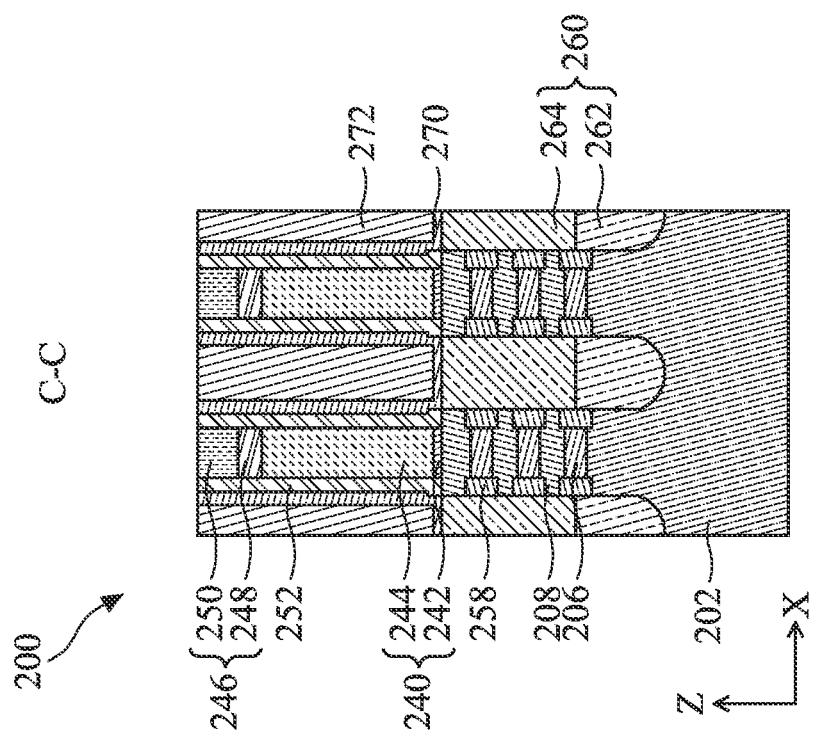
Figure 17A:
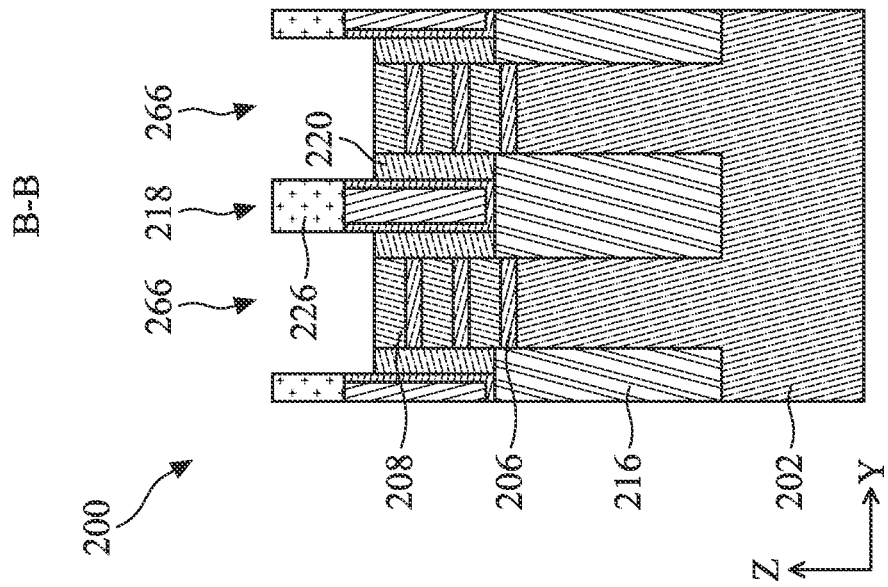
Figure 17B:
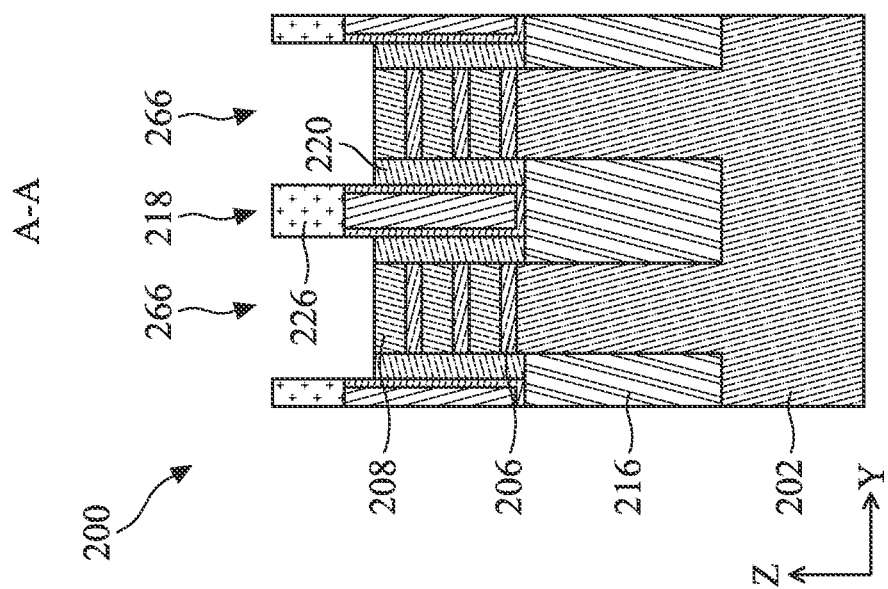
Figure 17C:
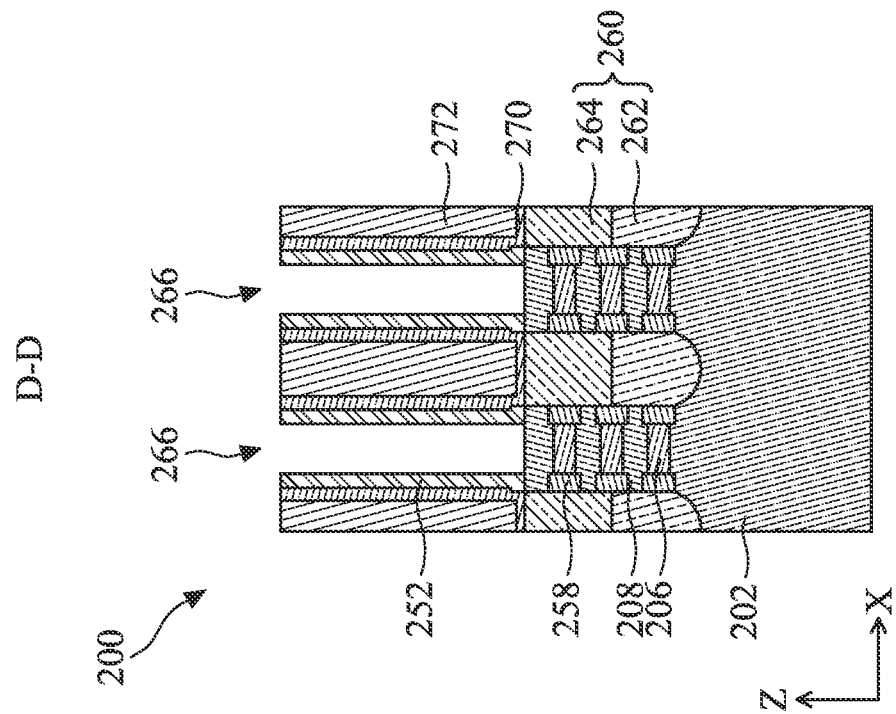
Figure 17D:
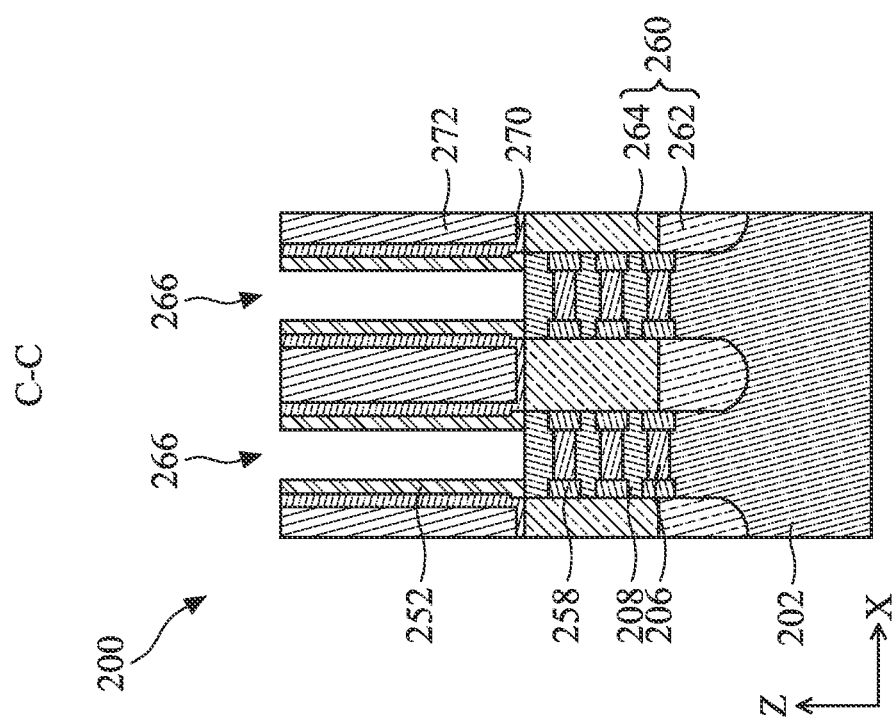
Figure 18B:
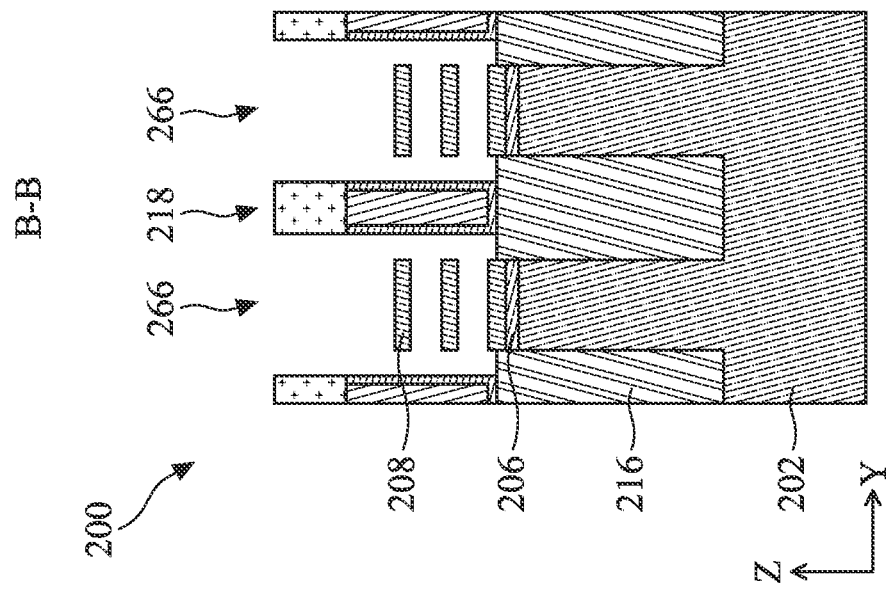
Figure 18A:
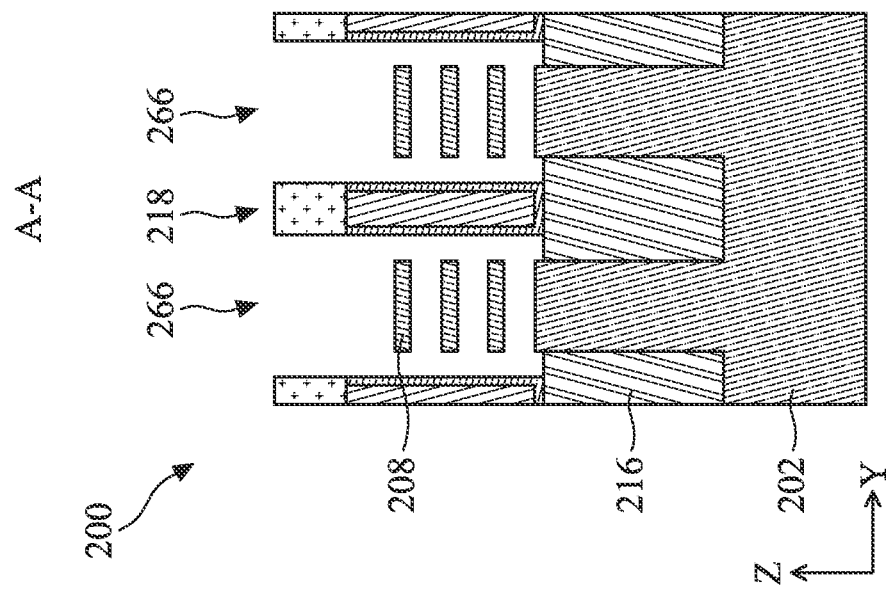
Figure 19C:
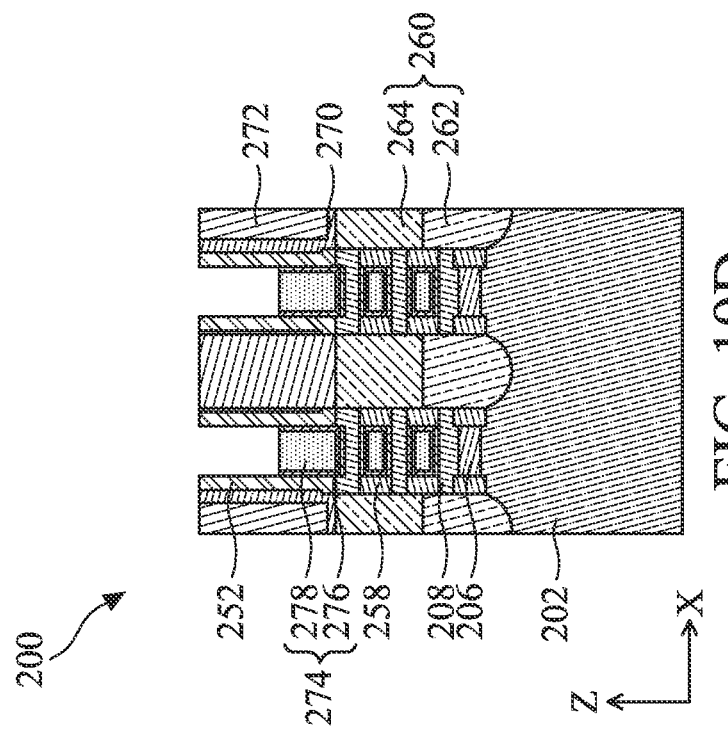
Figure 19D:
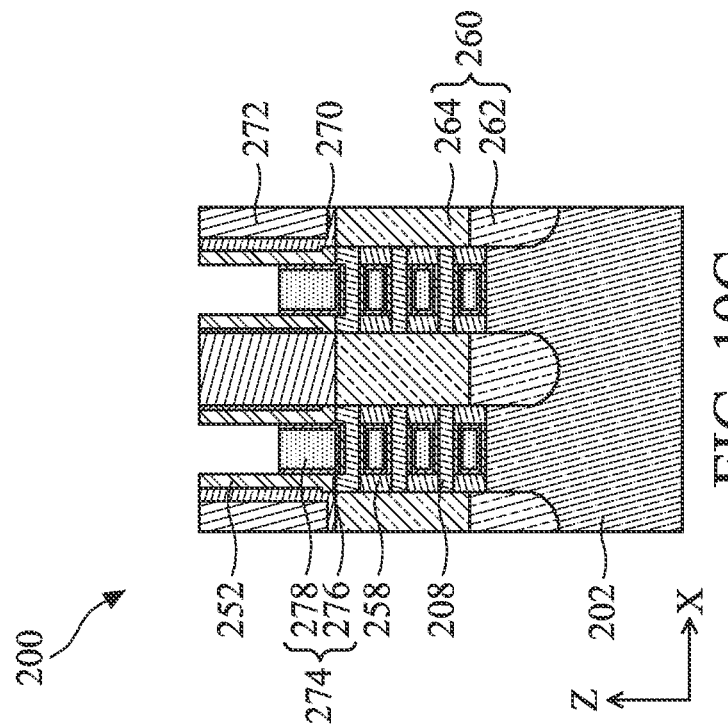
Figures 20A, 20B:
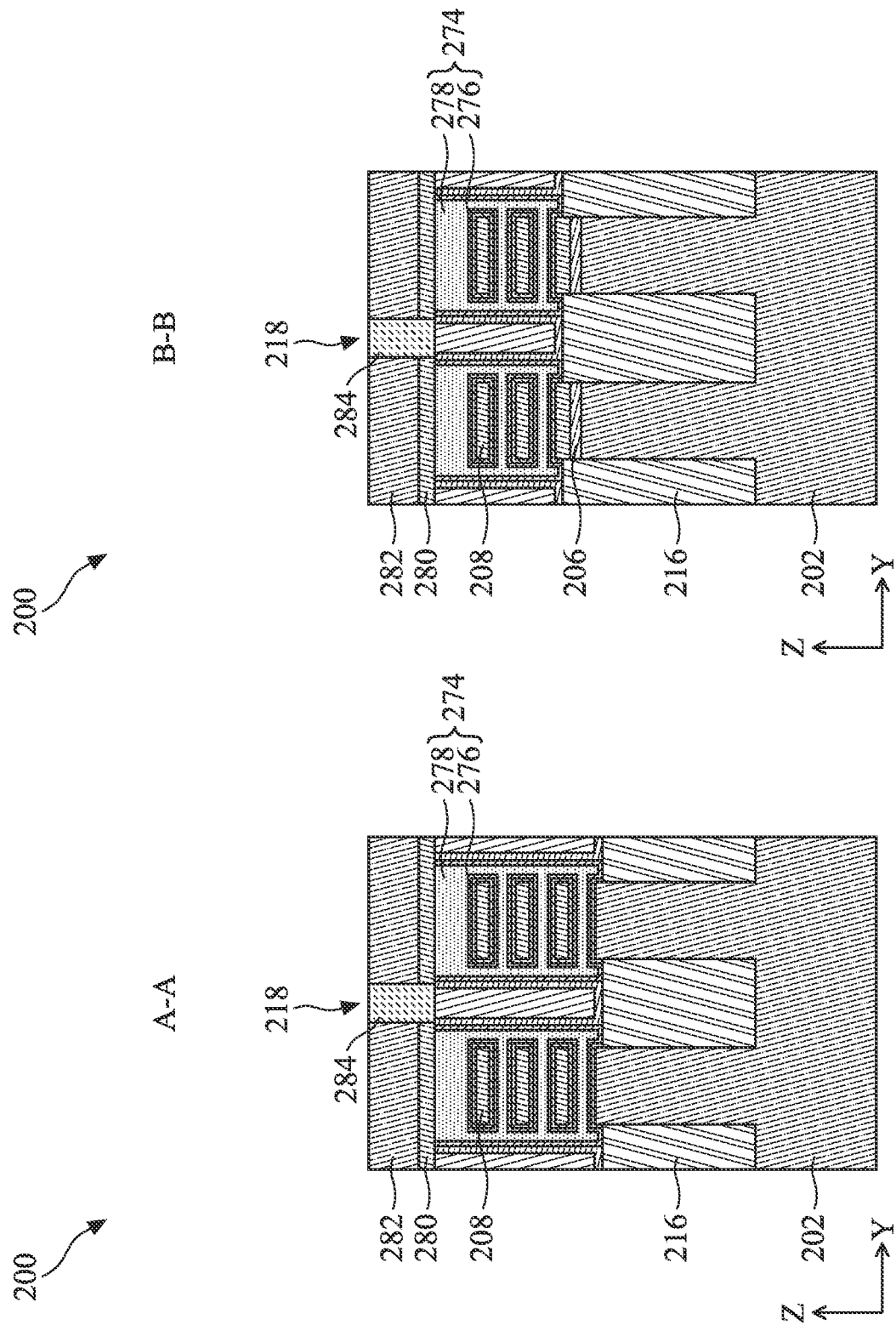
Figure 20D:
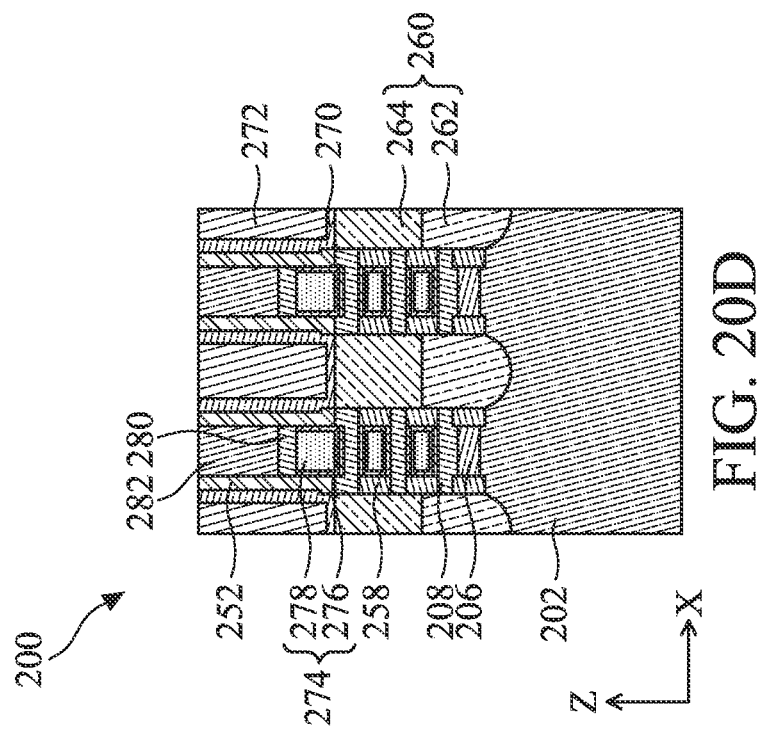
Figure 20C:
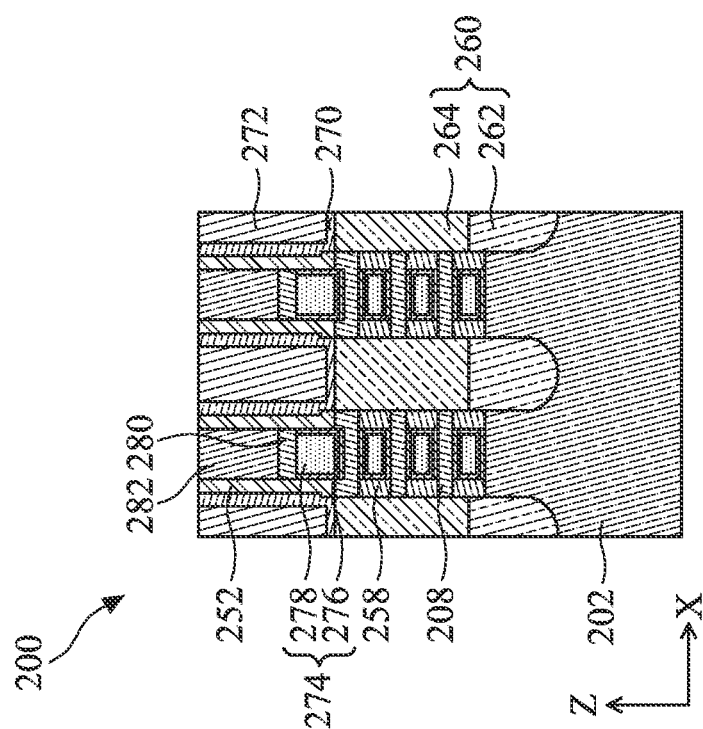
Figures 22A, 22B:
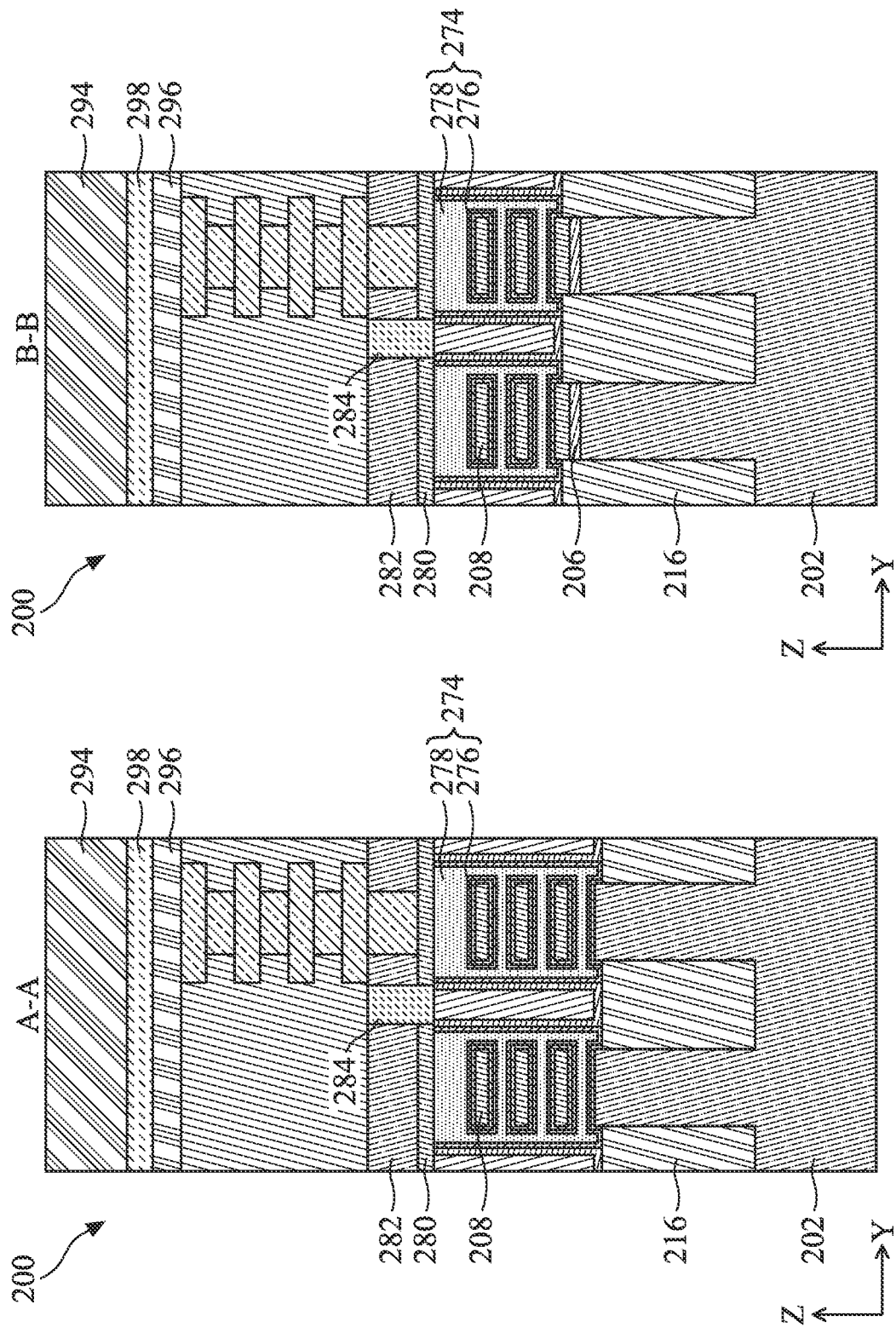
Figure 22C:
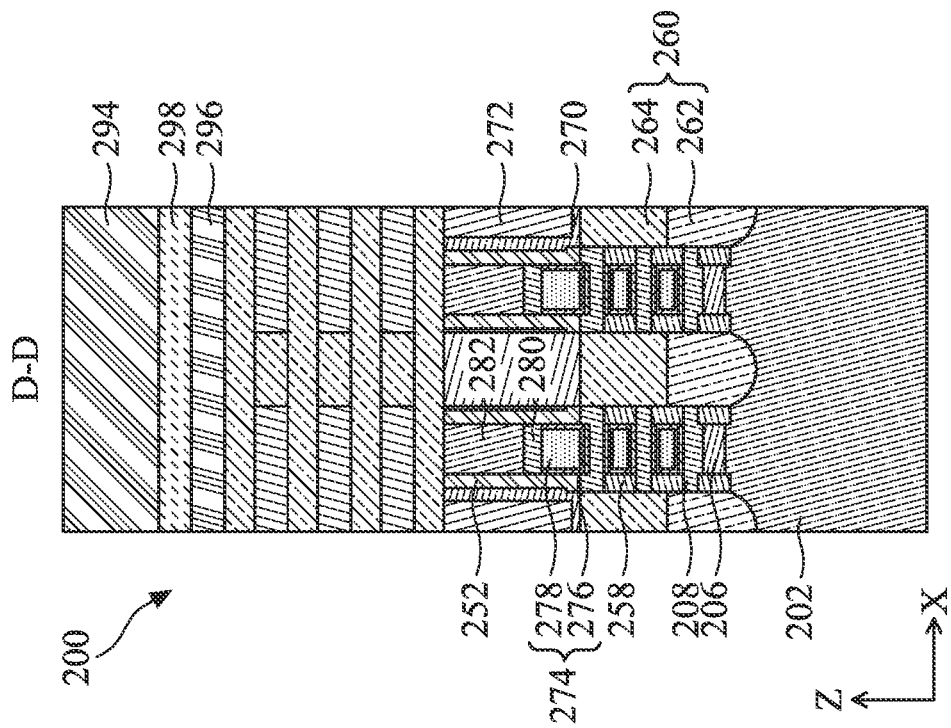
Figure 22D:
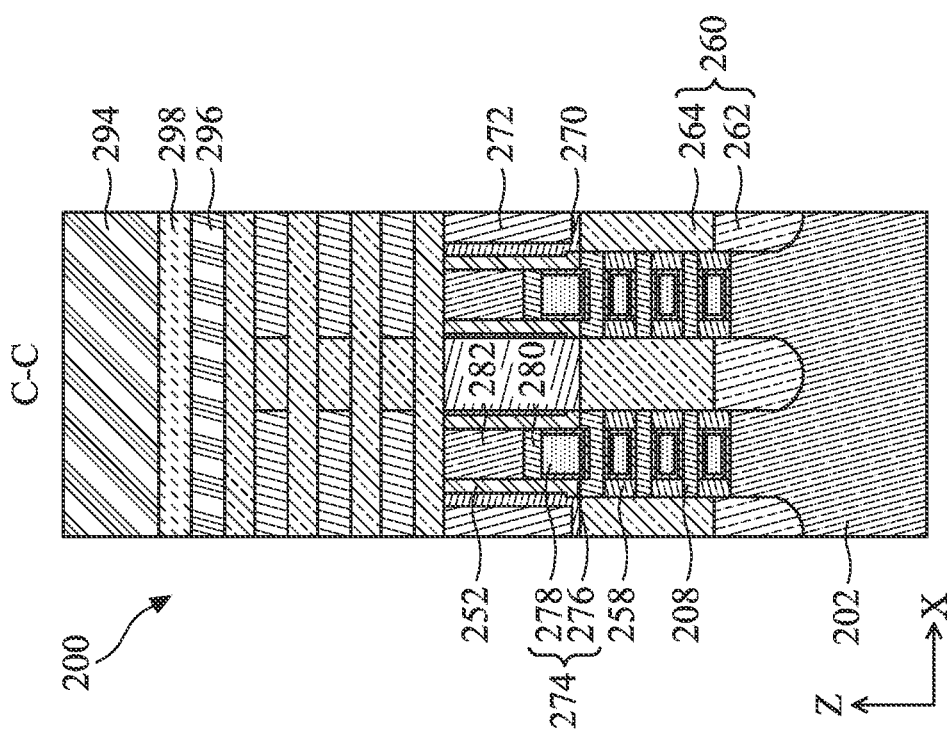
Figures 23A, 23B:
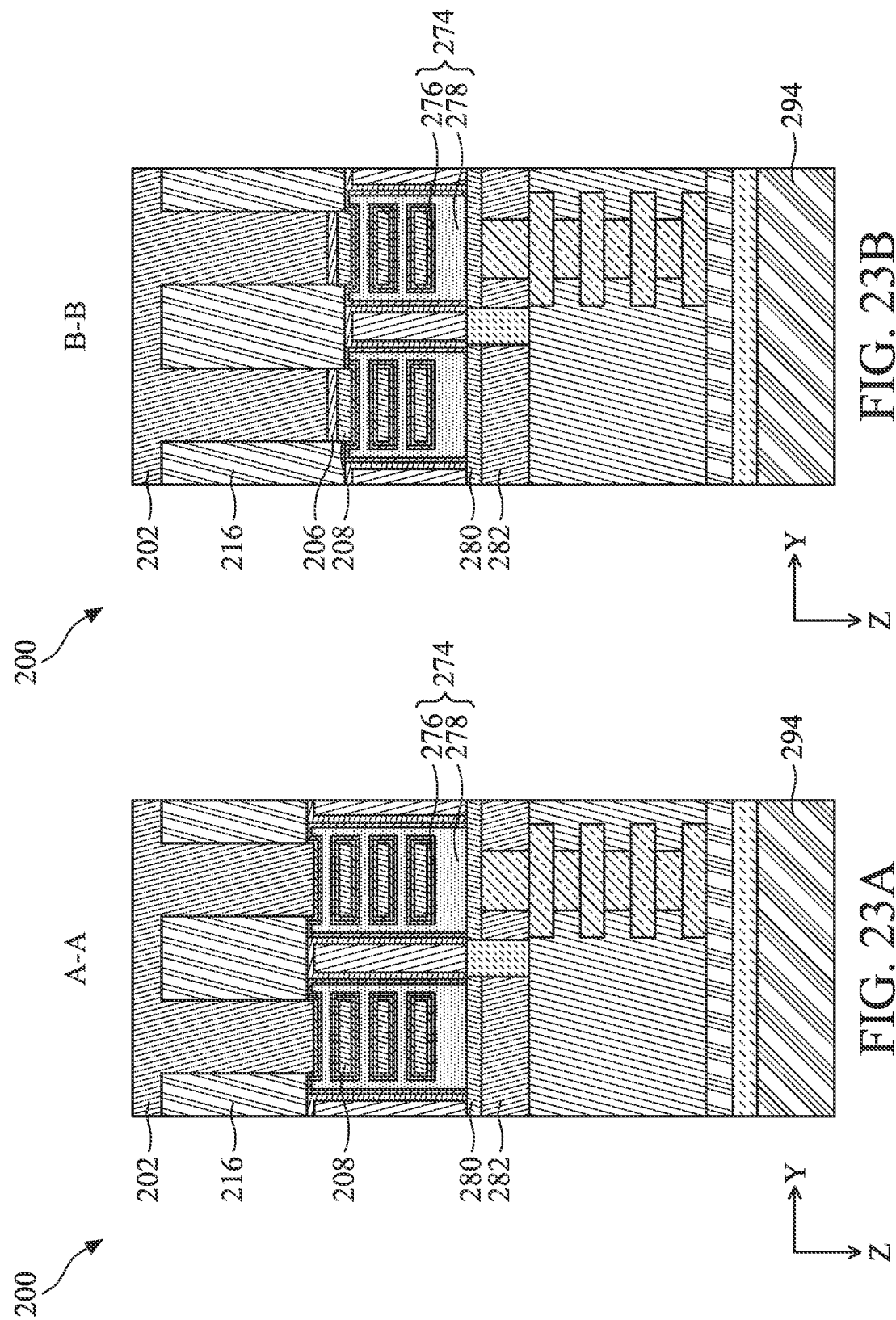
Figure 23C:
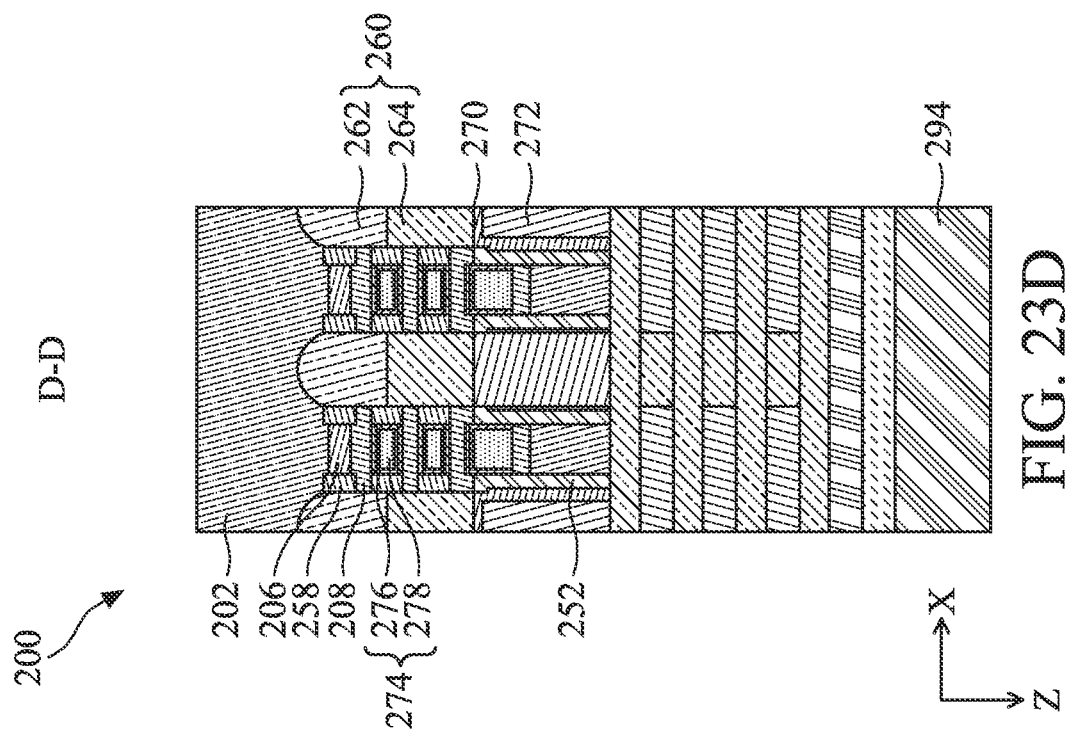
Figure 23D:
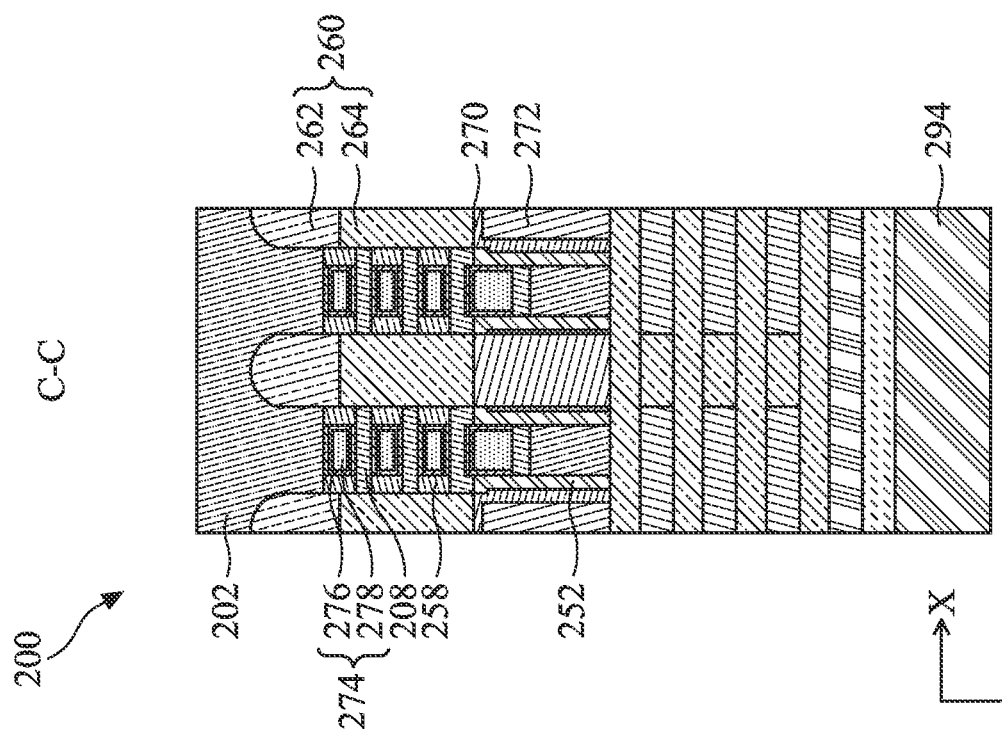

Still referring to FIGS. 14A-14D, the method 100 includes a block 124 where source/drain features 260 are formed. The source/drain features 260 are selectively and epitaxially deposited on the exposed semiconductor surfaces of the channel layers 208 and the base portion 210B in the source/drain recesses 254 and the deeper source/drain recess 254D. The source/drain features 260 may be deposited using an epitaxial process, such as vapor-phase epitaxy (VPE), ultra-high vacuum CVD (UHV-CVD), molecular beam epitaxy (MBE), and/or other suitable processes. In some instances, the source/drain features 260 includes an undoped epitaxial layer 262 and a heavily doped epitaxial layer 264. The undoped epitaxial layer 262 is to prevent leakage current between heavily doped epitaxial layer 264 and the well regions. In some instances, the undoped epitaxial layer 262 has a thickness from about 5 nm to about 15 nm. Due to the larger depth of the deeper source/drain recesses 254D, the undoped epitaxial layer 262 is in the region I below the bottommost channel layer 208 (FIG. 14C) and in the region II above the bottommost channel layer 208 (FIG. 14D). Heavily doped epitaxial layer 264 may be doped with p-type dopants or n-type dopants depending on the desired configuration of the transistors. When the source/drain features 260 are n-type, the heavily doped epitaxial layer 264 may include silicon (Si) doped with an n-type dopant, such as phosphorus (P) or arsenic (As). When the source/drain features 260 are p-type, the heavily doped epitaxial layer 264 may include silicon germanium (SiGe) doped with a p-type dopant, such as boron (B) or gallium (Ga). Doping of the heavily doped epitaxial layer 264 may be performed either in situ with their deposition or ex situ using an implantation process, such as a junction implant process. Also as shown in FIGS. 14A and 14B, at the step region of the sidewalls of the source/drain recesses 254 and the deeper source/drain recess 254D, facets of the source/drain features 260 may trap voids 267 between the source/drain features 260 and dielectric features, such as the dielectric fins 218 and the isolation feature 216. Subsequently, the high-k dielectric layer 226 of the dielectric fins 218 in source/drain regions is selectively removed in an etching process, as shown in FIGS. 15A-15D. The etching process can include dry etching, wet etching, reactive ion etching (RIE), and/or other suitable processes.

Referring to FIGS. 16A-16D, the method 100 includes a block 126 (FIG. 1A) where a contact etch stop layer (CESL) 270 and an interlayer dielectric (ILD) 272 layer are deposited on the frontside of the workpiece 200. In an example process, the CESL 270 is first conformally deposited over the workpiece 200 and then the ILD layer 272 is blanketly deposited over the CESL 270. The CESL 270 may include silicon nitride, silicon oxide, silicon oxynitride, and/or other materials known in the art. The CESL 270 may be deposited using ALD, plasma-enhanced chemical vapor deposition (PECVD) process and/or other suitable deposition or oxidation processes. In some embodiments, the ILD layer 272 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 272 may be deposited by spin-on coating, an FCVD process, or other suitable deposition technique. In some embodiments, after formation of the ILD layer 272, the workpiece 200 may be annealed to improve integrity of the ILD layer 272. To remove excess materials (including the gate top hard mask 246) and to expose top surfaces of the dummy electrode 244 of the dummy gate stacks 240, a planarization process (such as a CMP process) may be performed to the workpiece 200 to provide a planar top surface.

Referring to FIGS. 17A-17D, the method 100 includes a block 128 (FIG. 1A) where the dummy gate stacks 240 are selectively removed. The dummy gate stacks 240 exposed at the conclusion of the block 126 are removed from the workpiece 200 by a selective etching process. The selective etching process may be a selective wet etching process, a selective dry etching process, or a combination thereof. In the depicted embodiments, the selective etching process selectively removes the dummy dielectric layer 242 and the dummy electrode 244 without substantially damaging the channel layers 208 and the gate spacers 252. The removal of the dummy gate stacks 240 results in gate trenches 266 over the channel regions. After the removal of the dummy gate stacks 240, the channel layers 208, the sacrificial layers 206, and the cladding layer 220 in the channel regions are exposed in the gate trenches 266.

Referring to FIGS. 18A-18D, the method 100 includes a block 130 (FIG. 1A) where the sacrificial layers 206 and the cladding layer 220 are removed from the gate trenches 266 to release the channel layers 208. To be noticed, while the sacrificial layers 206 in the region I are all removed, at least the bottommost sacrificial layer 206 in the region II (FIG. 18B) remains as it is protected under the bottommost channel layer 208 and the isolation feature 216. The released channel layers 208 at the conclusion of the block 130 are also denoted as the channel members 208. In the depicted embodiments where the channel members 208 resemble a sheet or a nanosheet, the channel member release process may also be referred to as a sheet formation process. The channel members 208 are vertically stacked along the Z direction. All channel members 208 are spaced laterally apart from the dielectric fins 218 for a distance reserved by the cladding layer 220. The selective removal of the sacrificial layers 206 and the cladding layer 220 may be implemented by selective dry etching, selective wet etching, or other selective etching processes. In some embodiments, the selective wet etching includes ammonium hydroxide (NH$_4$OH), hydrogen fluoride (HF), hydrogen peroxide (H$_2$O$_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as NH$_4$OH.

Referring to FIGS. 19A-19D, the method 100 includes a block 132 (FIG. 1A) where gate structures 274 (also known as functional gate structures 274 or metal gate structures 274) are formed in the gate trenches 266 to engage the channel members 208. In the region I, each of the channel members 208 is wrapped around by a respective gate structure 274. As a comparison, in the region II, the bottommost channel layer 208 has top surface deposited with the gate structure 274 but not on its bottom surface which remains interfacing with the bottommost sacrificial layer 206. Each of the gate structures 274 includes a gate dielectric layer 276 disposed on the channel members 208 and a gate electrode layer 278 over the gate dielectric layer 276. In some embodiments, the gate dielectric layer 276 includes an interfacial layer and a high-k dielectric layer. The interfacial layer may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 208 to form the interfacial layer. The high-k dielectric layer is then deposited over the interfacial layer using ALD, CVD, and/or other suitable methods. The high-k dielectric layer includes high-K dielectric materials. In one embodiment, the high-k dielectric layer may include hafnium oxide. Alternatively, the high-k dielectric layer may include other high-K dielectrics, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), (Ba,Sr)TiO$_3$ (BST), silicon nitride (SiN), silicon oxynitride (SiON), combinations thereof, or other suitable material. After the formation of the gate dielectric layer 276, the gate electrode layer 278 is deposited over the gate dielectric layer 276. The gate electrode layer 278 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 278 may be formed by ALD, PVD, CVD, e-beam evaporation, or other suitable process. Although not explicitly shown in the figures, the gate structures 274 are deposited as a joint gate structure and then etched back until the dielectric fins 218 separate the joint gate structure into the gate structures 274 that are separated apart from each other. The dielectric fins 218 also provide electrical isolation between neighboring gate structures 274. The etching back of the gate structures 274 may include a selective wet etching process that uses nitric acid, hydrochloric acid, sulfuric acid, ammonium hydroxide, hydrogen peroxide, or a combination thereof. Although in the illustrated embodiments, the top surface of the gate structures 274 after the etching back process appears level with the bottom surface of the high-k dielectric layer 226, in alternative embodiments, the top surface of the gate structures 274 after the etching back process may be below the bottom surface of the high-k dielectric layer 226. The etching back of the gate structures 274 may also include etching back the high-k dielectric layer 226 of the dielectric fins 218 in the channel regions.

Referring to FIGS. 20A-20D, the method 100 includes a block 134 (FIG. 1B) where a metal cap layer 280, a self-aligned cap (SAC) layer 282, and a gate cut feature 284 are formed in the frontside of the workpiece 200. In some embodiments, the metal cap layer 280 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 280 includes tungsten (W), such as fluorine-free tungsten (FFW), and is deposited by PVD. In some alternative embodiments where the metal cap layer 280 is deposited by MOCVD, the deposition of the metal cap layer 280 may be selectively deposited on the gate structures 274. After the deposition of the metal cap layer 280, the SAC layer 282 is deposited over the workpiece 200 by CVD, PECVD, or a suitable deposition process. The SAC layer 282 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etching processes are then performed to etch the deposited SAC layer 282 to form gate cut openings to expose the top surfaces of the dielectric fins 218. Thereafter, a dielectric material is deposited and planarized by a CMP process to form the gate cut features 284 in the gate cut openings. The dielectric material for the gate cut features 284 may be deposited using HDPCVD, CVD, ALD, or a suitable deposition technique. In some instances, the gate cut features 284 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut features 284 and the SAC layer 282 may have different compositions to introduce etch selectivity.

Referring to FIGS. 21A-21D, the method 100 includes a block 136 (FIG. 1B) where one or more frontside middle-end-of-line (MEOL) and frontside back-end-of-line (BEOL) processes are performed to form one or more interconnect layers with contacts, vias, and metal lines (also known as metal wiring layers) embedded in dielectric layers. In some embodiments, operations at the block 136 include forming source/drain contacts 286, gate contacts 288, additional ILD layer 290, and metal wiring layers 292. The workpiece 200 may further include passivation layers and/or other layers built on the frontside of the workpiece 200. These layers and the one or more interconnect layers connect gate, source, and drain electrodes of various transistors, as well as other circuits in the workpiece 200, to form an integrated circuit in part or in whole.

Referring to FIGS. 22A-22D, the method 100 includes a block 138 (FIG. 1B) where a carrier 294 is attached to the frontside of the workpiece 200. The carrier 294 may be a silicon wafer in some embodiments. Operations at the block 138 may use any suitable attaching processes, such as direct bonding, hybrid bonding, using adhesive, or other bonding methods. In the illustrated embodiment, a bonding oxide layer 296 and an adhesive layer 298 are formed on the frontside of the workpiece 200 and adjoins the carrier 294 to the frontside of the workpiece 200. Operations at the block 138 may further include alignment, annealing, and/or other processes. The attaching of the carrier 294 allows the workpiece 200 to be flipped upside down, as illustrated in FIGS. 23A-23D. This makes the workpiece 200 accessible from the backside of the workpiece 200 for further processing. It is noted that the workpiece 200 is flipped upside down also in the following figures, namely FIGS. 24A-26D.

Referring to FIGS. 24A-24D, the method 100 includes a block 140 (FIG. 1B) where the workpiece 200 is thinned down from the backside of the workpiece 200. An example thinning process may include remove the substrate 202 in a selective etching process to form trenches 300 over the backside of the workpiece. In some instances, the gate structure 274 (particularly, the gate dielectric layer 276) is exposed in the trenches 300 in the region I and the bottom-most sacrificial layer 206 is exposed in the trenches 300 in the region II. Alternatively, in the region II, a thin layer of the substrate 202 may remain covering the bottommost sacrificial layer 206 as in the illustrated embodiment, such as due to an etching process controlled by duration of the etching process. The undoped epitaxial layer 262 is also exposed in both regions I and II and partially recessed. In some embodiments, a recessing depth of the undoped epitaxial layer 262 is controlled (e.g., by controlling an etching time) to result in a desired recess depth. Exposed surfaces of the undoped epitaxial layer 262 in the regions I and II may be even at conclusion of the block 140, as illustrated in FIGS. 24C and 24D. In some embodiments, the first stage of the thinning process includes a mechanical grinding process to remove a substantial amount of the substrate 202, while the isolation feature 216 functions as a mechanical grinding stop layer. Afterwards, a chemical thinning process may apply an etching chemical to the backside of the workpiece to remove the substrate 202, while the bottommost sacrificial layer 206 may function as an etch stop layer. Similarly, in some embodiments, the chemical thinning process may be controlled by a timer such that a thin layer of the substrate 202 may still remain on the bottommost sacrificial layer 206.

Referring to FIGS. 25A-25F, the method 100 includes a block 142 (FIG. 1B) where sacrificial layer(s) 206 and channel layer(s) 208 abutting the sacrificial layer(s) 206 and not wrapped by the gate structure 274 are selectively etched from the trenches 300 in the region II. To limit the etching process in the region I, a mask layer 302 may be first deposited (e.g., by spin coating) to cover the region I. In some embodiments, the mask layer 302 is a photoresist layer, such as a bottom antireflective coating (BARC) layer. In the illustrated embodiment, one sacrificial layer 206 (the bottommost one) and one channel layer 208 (the bottommost one) are etched, thereby exposing the gate structure 274 (particularly, the gate dielectric layer 276) in the region II. In an instance, the interfacial layer in the gate dielectric layer 276 is further etched and the high-k dielectric layer in the gate dielectric layer 276 is exposed in the trenches 300. As discussed above in association with FIGS. 5A-5D, a height of the isolation feature 216 in the region II is used to determine the number of channel layers 208 to be removed, such that only channel layers 208 fully rise above the isolation feature 216 would remain. In other words, depending on device performance needs, there can be multiple channel layers 208 not wrapped by the gate structure 274 being selectively etched, such as from one to four layers of the channel layer 208.

Figure 25F:
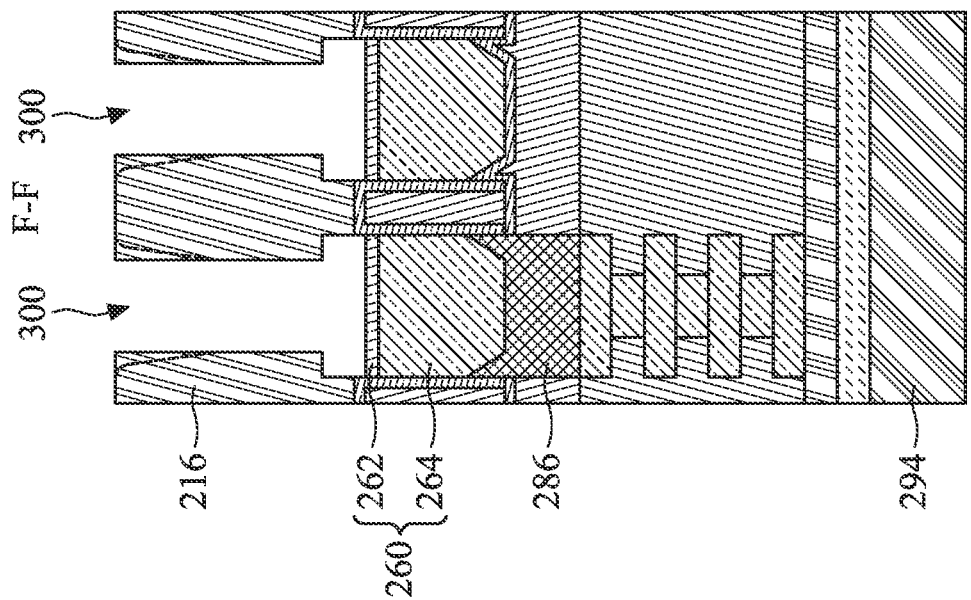
Figure 25E:
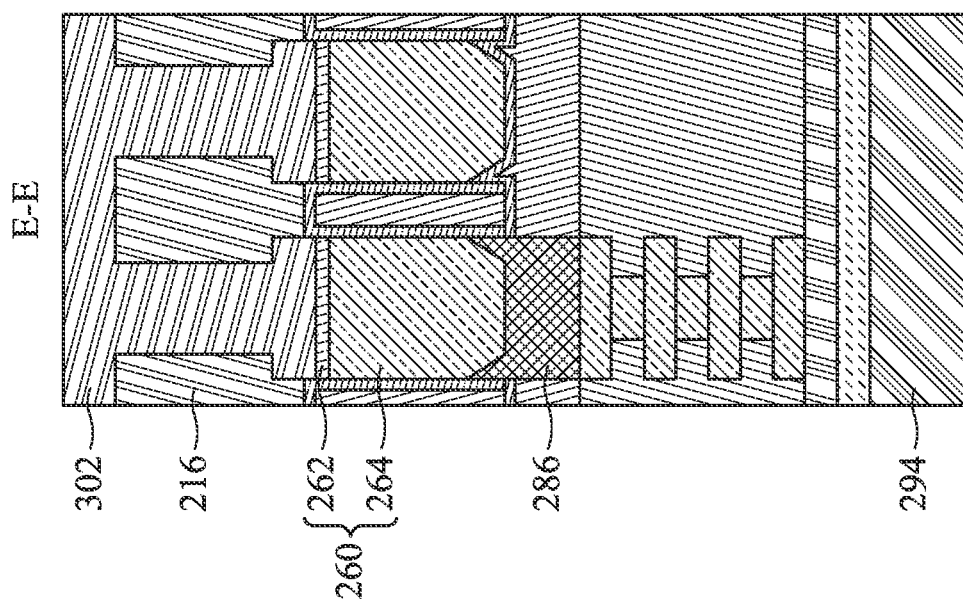

Operations at the block 142 apply one or more etching processes that are tuned to be selective to the semiconductor materials of the sacrificial layers 206 and the channel layers 208 and with no (or minimal) etching to the dielectric materials of the inner spacer features 258 and the gate dielectric layer 276. Further, the undoped epitaxial layer 262 may also be recessed in the trenches 300 but not completely removed for protecting the heavily doped epitaxial layer 264 from being damaged by the etching process. The selective etching process can be dry etching, wet etching, reactive ion etching, or other suitable etching methods. As shown in FIG. 25D, the removal of the sacrificial layer 206 and the recessing of the undoped epitaxial layer 262 makes the inner spacer features 258 protrude from the backside of the workpiece 200. End portions of the channel layer 208 (denoted as end portions 208E) directly under the inner spacer features 258 may remain from an anisotropic etching process and also protrude from the backside of the workpiece 200. Depending on the recess depth, the exposed surface of the undoped epitaxial layer 262 may be fully under the end portions 208E or interfacing sidewalls of the end portions 208E. In some instances, the exposed surface of the undoped epitaxial layer 262 is level with the exposed surface of the gate dielectric layer 276. On some alternative instances, the exposed surface of the undoped epitaxial layer 262 is under the exposed surface of the gate dielectric layer 276. Yet in some instances, the recessing of the undoped epitaxial layer 262 is optional and can be skipped, such that the undoped epitaxial layer 262 remains its thickness and is above the dielectric fins 218 towards the backside of the workpiece 200 in a Y-Z plane. After the selective etching process at the block 142, the mask layer 302 may be removed in an etching process, or other suitable processes, such as ashing or resist stripping. Further, since the isolation feature 216 in the region I is protected by the mask layer 302 from the extra selective etching process, the isolation feature 216 in the region I may have shaper edges compared with the one in the region II that may have rounded corners as illustrated by the dotted line in FIGS. 25B and 25F.

Figures 26A, 26B:
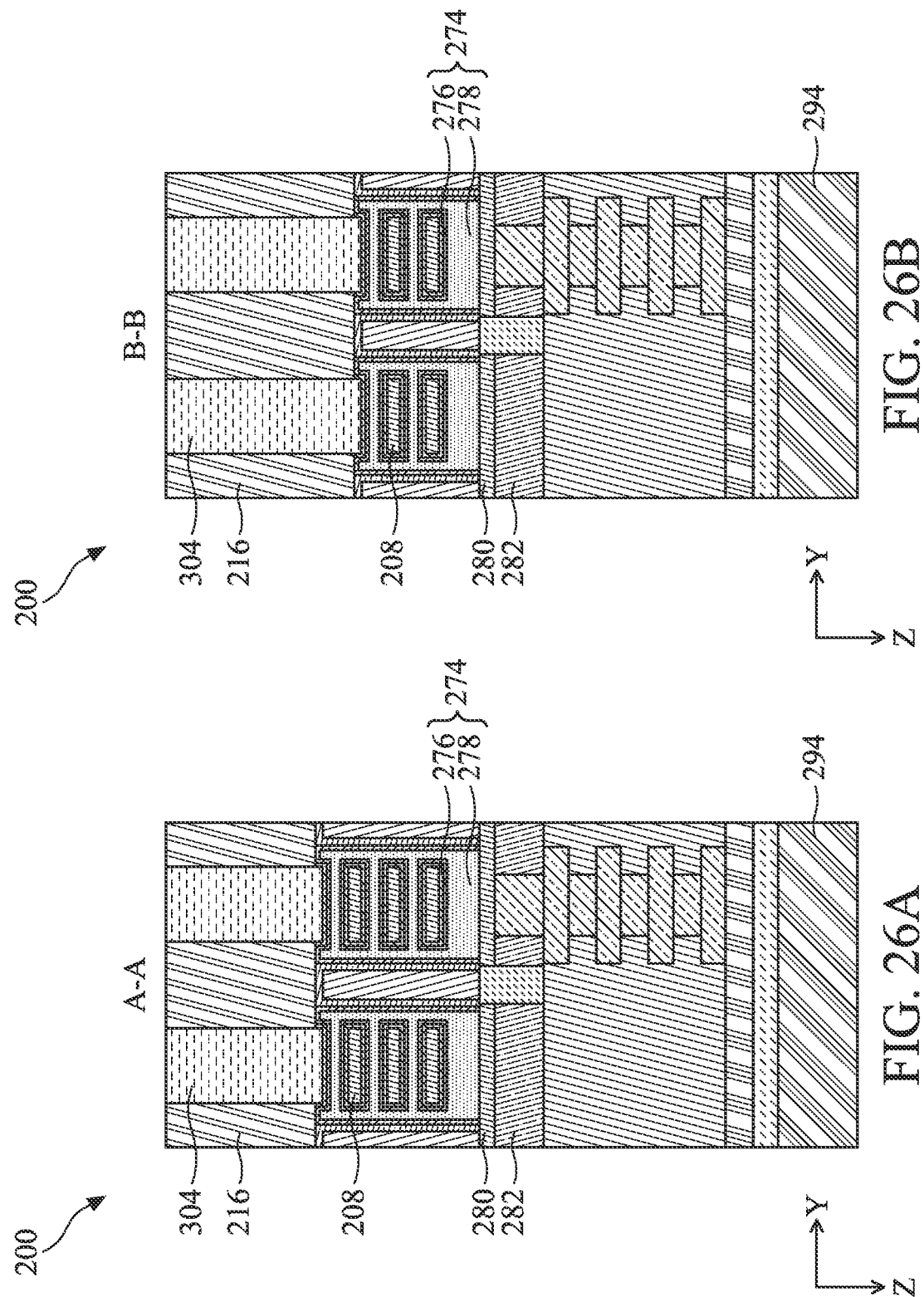
Figure 26D:
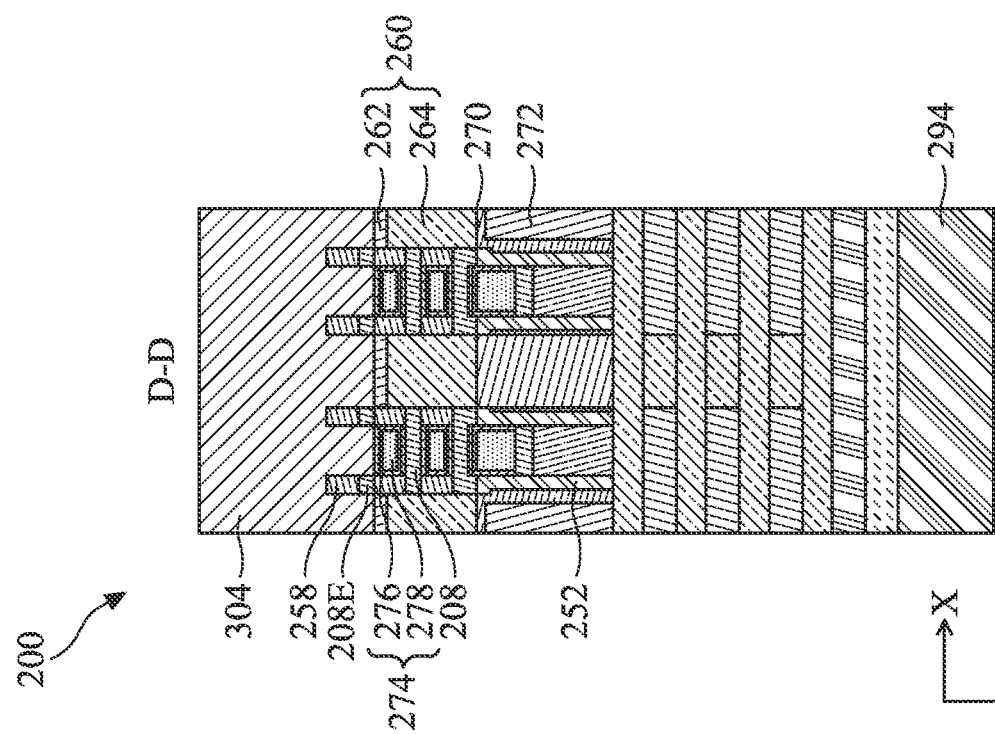
Figure 26C:
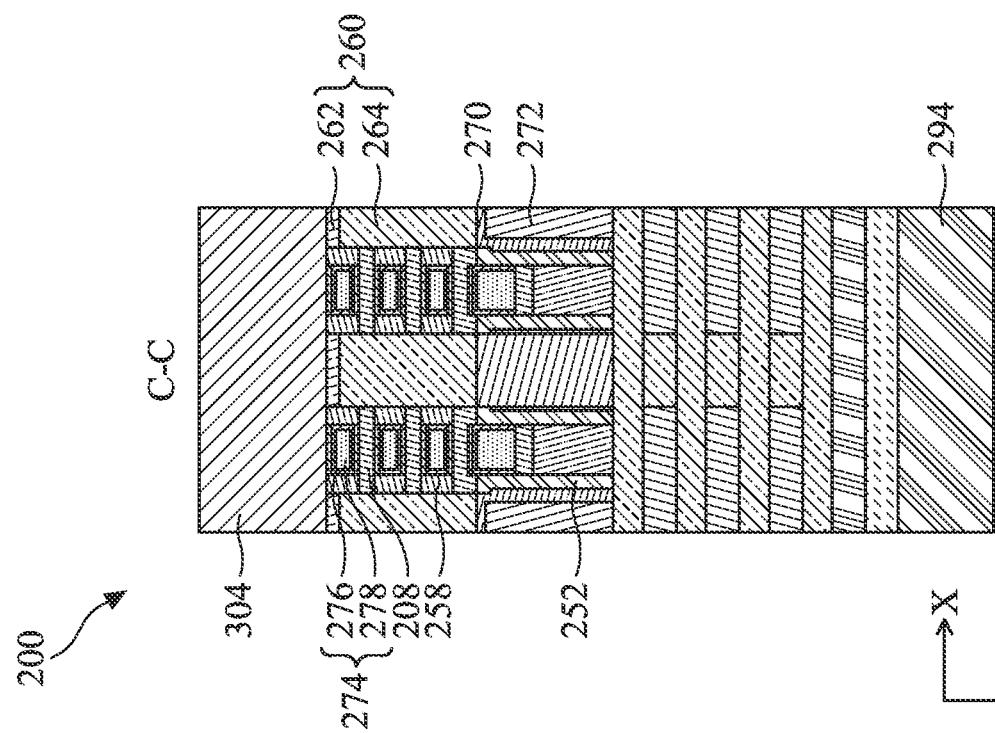
Figure 26F:
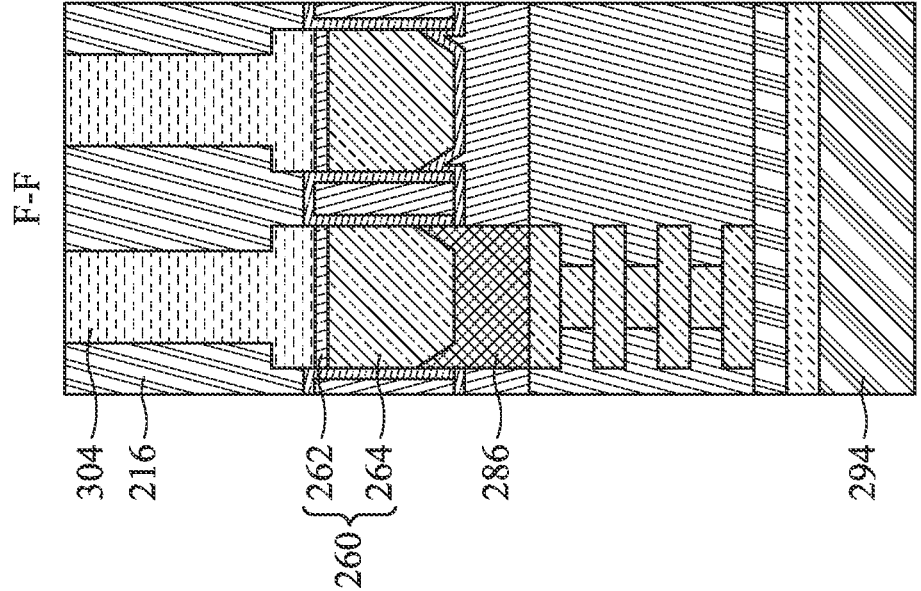
Figure 26E:
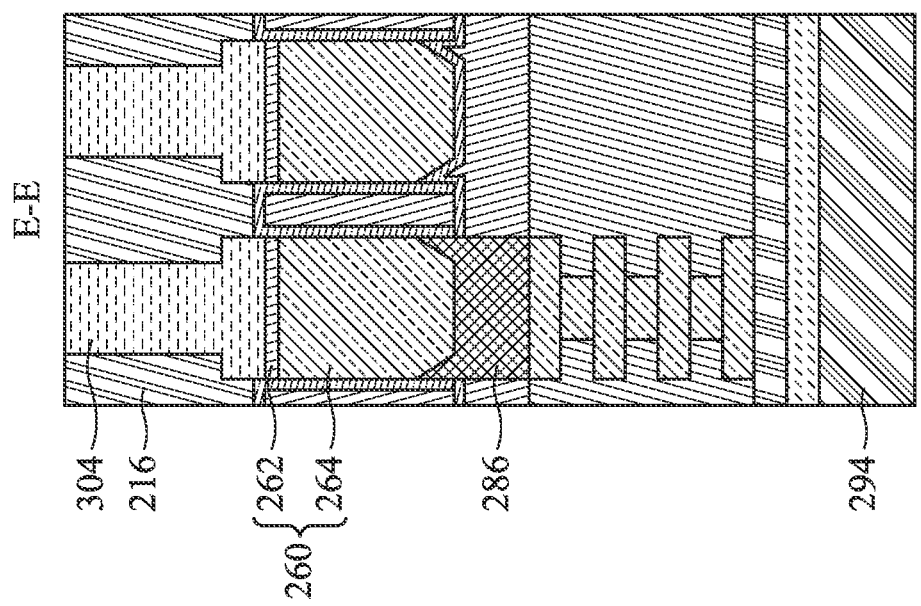

Referring to FIGS. 26A-26F, the method 100 includes a block 144 (FIG. 1B) where a backside dielectric layer 304 is deposited over the backside of the workpiece 200 and fills the trenches 300. The backside dielectric layer 304 substantially reduces well isolation leakage and substrate leakage between source and drain features. In some embodiments, the depositing material of the backside dielectric layer 304 includes SiN, SiOCN, SiOC, SiCN, combinations thereof, or other suitable material(s). The backside dielectric layer 304 may be deposited by CVD, PVD, PE-CVD, F-CVD, coating process, or other suitable deposition techniques. After the depositing of the backside dielectric layer 304, the bottommost inner spacer 258 and the end portions 208E protrude into the backside dielectric layer 304, as shown in FIG. 26D. Operations at the block 144 also includes performing a planarization process, such as a CMP process, to remove excessive dielectric materials from the backside of the workpiece 200 and expose the isolation feature 216.

Referring to FIGS. 27A-27D, the method 100 includes a block 146 (FIG. 1B) where a carrier 308 is attached to the backside of the workpiece 200. The carrier 308 may be a silicon wafer in some embodiments. Operations at the block 146 may use any suitable attaching processes, such as direct bonding, hybrid bonding, using adhesive, or other bonding methods. In the illustrated embodiment, a bonding oxide layer 306 is formed on the backside of the workpiece 200 and adjoins the carrier 308 to the backside of the workpiece 200. Operations at the block 146 may further include alignment, annealing, and/or other processes. The attaching of the carrier 308 allows the workpiece 200 to be flipped back. This makes the workpiece 200 accessible again from the frontside of the workpiece 200 for further processing. Operations at the block 146 also includes performing a frontside thinning process, such as a CMP process, to remove the frontside carrier 294 and the adhesive layer 298 from the frontside of the workpiece 200 and expose the frontside bonding oxide layer 296.

Referring to FIGS. 28A-28F, the method 100 includes a block 148 (FIG. 1B) where further fabrication processes are performed to the workpiece 200. For example, it may perform other BEOL processes to form more interconnect layers, such as frontside power rails, on the frontside of the workpiece 200. In an embodiment, frontside power rails may be formed using a damascene process, a dual-damascene process, a metal patterning process, or other suitable processes. The frontside power rails may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Operations at the block 148 may also include forming passivation layers on the frontside of the workpiece 200, performing other BEOL processes, and removing the backside carrier 308.

Still referring to FIGS. 28A-28D, upon conclusion of the method 100, multiple MBC transistors are formed in the region I and the region II, respectively. Each MBC transistor includes a gate structure 274 engaging one or more channel members 208. Adjacent MBC transistors are electrically separated by the dielectric fins 218 and the gate cut features 284 landing on the dielectric fins 218. Particularly, the MBC transistors in the region I have more stacked channel members 208 than the MBC transistors in the region II, providing stronger current driving capability. This advantageously meets requirements of different current driving capabilities in different regions of one IC chip. Further, the backside dielectric layer 304 replaces the original semiconductor substrate and joins the isolation feature 216 in defining a large dielectric layer under the gate structures and the source/drain features. This implementation effectively reduces well isolation leakage and substrate leakage. The backside dielectric layer 304 has a larger thickness in the region II than in the region I due to space spared by the less channel members 208 in the region II. As a comparison, the source/drain features 260 has a smaller thickness in the region II than in the region I. Further, the bottommost inner spacer features 258 in the regions I and II may be level, yet the ones in the region II protrude downwardly into the backside dielectric layer 304 and may have rounded edges due to the extra selective etching process received in the region II. In the region II, the end portions 208E of the partially removed bottommost channel member 208 also protrude downwardly into the backside dielectric layer 304.

In one exemplary aspect, the present disclosure is directed to a method. The method includes forming a stack of a first type and a second type epitaxial layers on a frontside of a semiconductor substrate, the first type and second type epitaxial layers having different material compositions, the first type and second type epitaxial layers being alternatingly disposed in a vertical direction, patterning the stack to form a fin-shaped structure; depositing a dielectric layer on sidewalls of the fin-shaped structure, recessing the dielectric layer to expose a top portion of the fin-shaped structure, a top surface of the recessed dielectric layer being above a bottom surface of the stack, forming a gate structure over the top portion of the fin-shaped structure, etching the semiconductor substrate from a backside of the semiconductor substrate, thereby forming a trench between the dielectric layer, the trench exposing the bottom surface of the stack, and etching at least a bottommost first type epitaxial layer and a bottommost second type epitaxial layer through the trench. In some embodiments, the bottommost first type epitaxial layer is under the bottommost second type epitaxial layer, and the top surface of the recessed dielectric layer is above a top surface of the bottommost first type epitaxial layer. In some embodiments, the top surface of the recessed dielectric layer is below a top surface of the bottommost second type epitaxial layer. In some embodiments, the gate structure is a metal gate structure, and the etching of at least the bottommost first type epitaxial layer and the bottommost second type epitaxial layer is after the forming of the gate structure. In some embodiments, the method also includes prior to the forming of the gate structure, removing the first type epitaxial layers from the top portion of the fin-shaped structure, and after the forming of the gate structure, the gate structure wraps around the second type epitaxial layers in the top portion of the fin-shaped structure. In some embodiments, after the forming of the gate structure, the bottommost second type epitaxial layer has a top surface interfacing with the gate structure and a bottom surface interfacing with the bottommost first type epitaxial layer. In some embodiments, the etching of at least the bottommost first type epitaxial layer and the bottommost second type epitaxial layer includes fully removing the bottommost first type epitaxial layer and partially removing the bottommost second type epitaxial layer from the trench. In some embodiments, the etching of at least the bottommost first type epitaxial layer and the bottommost second type epitaxial layer includes etching multiple second type epitaxial layers. In some embodiments, the method also includes depositing a dielectric material in the trench, and a portion of the bottommost second type epitaxial layer protrudes into the dielectric material.

In another exemplary aspect, the present disclosure is directed to a method of manufacturing a multi-gate device. The method includes forming a first plurality of channel members over a first region of a substrate, the first plurality of channel members being vertically stacked, forming a second plurality of channel members over a second region of a substrate, the second plurality of channel members being vertically stacked, forming an isolation feature in the first and second regions, a top surface of the isolation feature being higher in the second region than in the first region, such that a portion of the second plurality of channel members is below the top surface of the isolation feature in the second region, forming a first gate structure engaging the first plurality of channel members, thereby forming a first transistor in the first region, forming a second gate structure engaging the second plurality of channel members, thereby forming a second transistor in the second region, and removing the portion of the second plurality of channel members from the second region, such that a number of the first plurality of channel members in the first transistor is larger than a number of the second plurality of channel members in the second transistor. In some embodiments, the forming of the isolation feature includes depositing a dielectric material over sidewalls of the first and second pluralities of channel members; recessing the dielectric material in the first and second regions, thereby exposing a top portion of the first and second pluralities of channel members; and further recessing the dielectric material in the first region, such that the first plurality of channel members are fully above the dielectric material. In some embodiments, the method also includes etching the substrate in the first and second regions, thereby forming trenches in the first and second regions, and the removing of the portion of the second plurality of channel members exposes the second gate structure in the trenches in the second region. In some embodiments, the etching of the substrate exposes the first gate structure in the trenches in the first region. In some embodiments, the method also includes forming first source/drain features abutting the first plurality of channel members; and forming second source/drain features abutting the second plurality of channel members, wherein a thickness of the second source/drain features is smaller than a thickness of the first source/drain features. In some embodiments, the method also includes forming first inner spacer features interposing the first source/drain features and the first gate structure; forming second inner spacer features interposing the second source/drain features and the second gate structure; and recessing the second source/drain features, such that a bottommost second inner spacer feature is spaced apart from the second source/drain features. In some embodiments, the first gate structure wraps around each of the first plurality of channel members in the first region and the second gate structure wraps around each of a top portion of the second plurality of channel members in the second region.

In another exemplary aspect, the present disclosure is directed to a semiconductor device. The semiconductor device includes a first gate structure engaging a first plurality of channel members, a second gate structure engaging a second plurality of channel members, a first backside dielectric feature disposed directly under the first gate structure, and a second backside dielectric feature disposed directly under the second gate structure. A number of the first plurality of channel members is larger than a number of the second plurality of channel members. In some embodiments, a height of the first gate structure is larger than a height of the second gate structure. In some embodiments, a thickness of the first backside dielectric feature is smaller than a thickness of the second backside dielectric feature. In some embodiments, the semiconductor device also includes first inner spacer features abutting the first gate structure and second inner spacer features abutting the second gate structure. A bottom portion of the second inner spacer features extends into the second backside dielectric feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a stack of a first type and a second type epitaxial layers on a frontside of a semiconductor substrate, the first type and second type epitaxial layers having different material compositions, the first type and second type epitaxial layers being alternatingly disposed in a vertical direction;
   patterning the stack to form a fin-shaped structure;
   depositing a dielectric layer on sidewalls of the fin-shaped structure;
   recessing the dielectric layer to expose a top portion of the fin-shaped structure, wherein a top surface of the recessed dielectric layer is above a bottom surface of the stack;
   forming a gate structure over the top portion of the fin-shaped structure;
   etching the semiconductor substrate from a backside of the semiconductor substrate, thereby forming a trench between the dielectric layer, the trench exposing the bottom surface of the stack; and
   etching at least a bottommost first type epitaxial layer and a bottommost second type epitaxial layer through the trench.

2. The method of claim 1, wherein the bottommost first type epitaxial layer is under the bottommost second type epitaxial layer, and wherein the top surface of the recessed dielectric layer is above a top surface of the bottommost first type epitaxial layer.

3. The method of claim 2, wherein the top surface of the recessed dielectric layer is below a top surface of the bottommost second type epitaxial layer.

4. The method of claim 1, wherein the gate structure is a metal gate structure, and wherein the etching of at least the bottommost first type epitaxial layer and the bottommost second type epitaxial layer is after the forming of the gate structure.

5. The method of claim 1, further comprising:
   prior to the forming of the gate structure, removing the first type epitaxial layers from the top portion of the fin-shaped structure,
   wherein after the forming of the gate structure, the gate structure wraps around the second type epitaxial layers in the top portion of the fin-shaped structure.

6. The method of claim 1, wherein after the forming of the gate structure, the bottommost second type epitaxial layer has a top surface interfacing with the gate structure and a bottom surface interfacing with the bottommost first type epitaxial layer.

7. The method of claim 1, wherein the etching of at least the bottommost first type epitaxial layer and the bottommost second type epitaxial layer includes fully removing the bottommost first type epitaxial layer and partially removing the bottommost second type epitaxial layer from the trench.

8. The method of claim 1, wherein the etching of at least the bottommost first type epitaxial layer and the bottommost second type epitaxial layer includes etching multiple second type epitaxial layers.

9. The method of claim 1, further comprising:
   depositing a dielectric material in the trench, wherein a portion of the bottommost second type epitaxial layer protrudes into the dielectric material.

10. A method, comprising:
    forming a first plurality of channel members over a first region of a substrate, the first plurality of channel members being vertically stacked;
    forming a second plurality of channel members over a second region of a substrate, the second plurality of channel members being vertically stacked;
    forming an isolation feature in the first and second regions, wherein a top surface of the isolation feature is higher in the second region than in the first region, such that a portion of the second plurality of channel members is below the top surface of the isolation feature in the second region;
    forming a first gate structure engaging the first plurality of channel members, thereby forming a first transistor in the first region;
    forming a second gate structure engaging the second plurality of channel members, thereby forming a second transistor in the second region; and
    removing the portion of the second plurality of channel members from the second region, such that a number of the first plurality of channel members in the first transistor is larger than a number of the second plurality of channel members in the second transistor.

11. The method of claim 10, wherein the forming of the isolation feature includes:
    depositing a dielectric material over sidewalls of the first and second pluralities of channel members;
    recessing the dielectric material in the first and second regions, thereby exposing a top portion of the first and second pluralities of channel members; and
    further recessing the dielectric material in the first region, such that the first plurality of channel members are fully above the dielectric material.

12. The method of claim 10, further comprising:
    etching the substrate in the first and second regions, thereby forming trenches in the first and second regions, wherein the removing of the portion of the second plurality of channel members exposes the second gate structure in the trenches in the second region.

13. The method of claim 12, wherein the etching of the substrate exposes the first gate structure in the trenches in the first region.

14. The method of claim 10, further comprising:
    forming first source/drain features abutting the first plurality of channel members; and
    forming second source/drain features abutting the second plurality of channel members, wherein a thickness of the second source/drain features is smaller than a thickness of the first source/drain features.

15. The method of claim 14, further comprising:
    forming first inner spacer features interposing the first source/drain features and the first gate structure;
    forming second inner spacer features interposing the second source/drain features and the second gate structure; and
    recessing the second source/drain features, such that a bottommost second inner spacer feature is spaced apart from the second source/drain features.

16. The method of claim 10, wherein the first gate structure wraps around each of the first plurality of channel members in the first region and the second gate structure wraps around each of a top portion of the second plurality of channel members in the second region.

17. A semiconductor device, comprising:
- a first gate structure engaging a first plurality of channel members;
- a second gate structure engaging a second plurality of channel members;
- a first backside dielectric feature disposed directly under the first gate structure; and
- a second backside dielectric feature disposed directly under the second gate structure,
- wherein a number of the first plurality of channel members is larger than a number of the second plurality of channel members.

18. The semiconductor device of claim 17, wherein a height of the first gate structure is larger than a height of the second gate structure.

19. The semiconductor device of claim 17, wherein a thickness of the first backside dielectric feature is smaller than a thickness of the second backside dielectric feature.

20. The semiconductor device of claim 17, further comprising:
- first inner spacer features abutting the first gate structure; and
- second inner spacer features abutting the second gate structure, wherein a bottom portion of the second inner spacer features extends into the second backside dielectric feature.

* * * * *